United States Patent
Matsushita et al.

(10) Patent No.: US 10,008,301 B2
(45) Date of Patent: Jun. 26, 2018

(54) ORGANIC SEMICONDUCTOR COMPOSITION, ORGANIC THIN-FILM TRANSISTOR, ELECTRONIC PAPER, AND DISPLAY DEVICE

(71) Applicant: FUJIFILM Corporation, Tokyo (JP)

(72) Inventors: Yasuaki Matsushita, Kanagawa (JP); Tokihiko Matsumura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 344 days.

(21) Appl. No.: 14/943,568

(22) Filed: Nov. 17, 2015

(65) Prior Publication Data

US 2016/0071624 A1 Mar. 10, 2016

Related U.S. Application Data

(63) Continuation of application No. PCT/JP2014/063612, filed on May 22, 2014.

(30) Foreign Application Priority Data

May 23, 2013 (JP) .................. 2013-108913
Jul. 31, 2013 (JP) .................. 2013-158766

(51) Int. Cl.
*H01B 1/12* (2006.01)
*H01L 51/10* (2006.01)
(Continued)

(52) U.S. Cl.
CPC .............. *H01B 1/12* (2013.01); *C08F 12/22* (2013.01); *C08F 20/30* (2013.01); *C08F 120/22* (2013.01);
(Continued)

(58) Field of Classification Search
CPC ......... H01B 1/12; H01B 51/105; C08F 12/22; C08F 220/22; C08F 120/22; C08F 120/30;
(Continued)

(56) References Cited

U.S. PATENT DOCUMENTS

2012/0256137 A1* 10/2012 James ................. H01L 51/0003 252/500
2012/0305899 A1 12/2012 Taki et al.

FOREIGN PATENT DOCUMENTS

JP H05-331355 A 12/1993
JP 2005-005582 A 1/2005

OTHER PUBLICATIONS

An Office Action issued by SIPO on Mar. 8, 2017, which corresponds to Chinese patent application No. 2014800296672 and is related to U.S. Appl. No. 14/943,568, with English language translation.

(Continued)

*Primary Examiner* — Peter F Godenschwager
*Assistant Examiner* — Andrew J. Oyer
(74) *Attorney, Agent, or Firm* — Studebaker & Brackett PC

(57) ABSTRACT

The present invention provides an organic semiconductor composition, which improves the insulation reliability of an organic thin-film transistor without greatly reducing the mobility of the organic thin-film transistor, an organic thin-film transistor which is formed by using the organic semiconductor composition, and electronic paper and a display device which use the organic thin-film transistor. The organic semiconductor composition of the present invention contains an organic semiconductor material and an F-containing migration inhibitor selected from the group consisting of a compound represented by any of Formulae (1) to (8), a polymer compound (X) containing a repeating unit (Continued)

represented by Formula (A), and a polymer compound (Y) containing a repeating unit represented by Formula (B) and a repeating unit represented by Formula (C).

7 Claims, 1 Drawing Sheet

(51) Int. Cl.
    *C08F 12/22*     (2006.01)
    *C08F 220/22*     (2006.01)
    *H01L 51/05*     (2006.01)
    *C08F 120/30*     (2006.01)
    *C08F 20/30*     (2006.01)
    *C08F 212/14*     (2006.01)
    *C08F 220/30*     (2006.01)
    *H01L 51/00*     (2006.01)
    *C08F 120/22*     (2006.01)

(52) U.S. Cl.
    CPC .......... *C08F 120/30* (2013.01); *C08F 212/14* (2013.01); *C08F 220/22* (2013.01); *H01L 51/0566* (2013.01); *H01L 51/105* (2013.01); *C08F 2220/303* (2013.01); *H01L 51/004* (2013.01); *H01L 51/0545* (2013.01)

(58) Field of Classification Search
    CPC .. C08F 20/30; C08F 212/14; C08F 2220/303; H01L 51/0566; H01L 51/004; H01L 51/0545
    See application file for complete search history.

(56) References Cited

OTHER PUBLICATIONS

The extended European search report issued by the European Patent Office on May 3, 2016, which corresponds to European Patent Application No. 14801371.7-1552 and is related to U.S. Appl. No. 14/943,568.

Yook, J. Y. et al.; "Amno functionalization of carbon nanotube surfaces with NH3 plasma treatment"; Applied Surface Science; Sep. 15, 2010; pp. 6941-6944; vol. 256, No. 23; Elsevier, Amsterdam, Netherlands.

Translation of the International Preliminary Report on Patentability issued in PCT/JP2014/063612 dated Dec. 3, 2015.

International Search Report issued in PCT/JP2014/063612, dated Jul. 1, 2014.

* cited by examiner

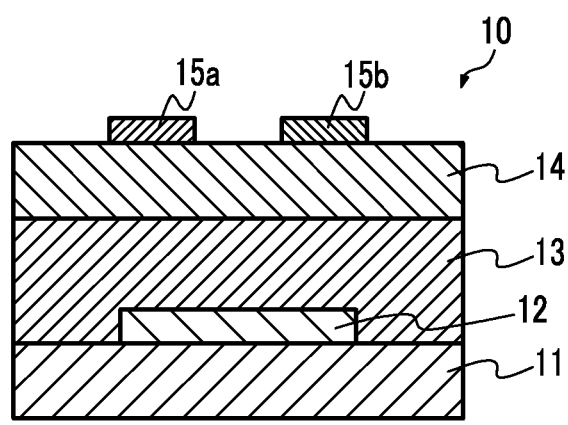

ORGANIC SEMICONDUCTOR COMPOSITION, ORGANIC THIN-FILM TRANSISTOR, ELECTRONIC PAPER, AND DISPLAY DEVICE

CROSS-REFERENCE TO RELATED APPLICATIONS

This application is a Continuation of PCT International Application No. PCT/JP2014/063612 filed on May 22, 2014, which claims priority under 35 U.S.C. § 119(a) to Japanese Patent Application No. 2013-108913 filed on May 23, 2013 and Japanese Patent Application No. 2013-158766 filed on Jul. 31, 2013. Each of the above application(s) is hereby expressly incorporated by reference, in its entirety, into the present application.

BACKGROUND OF THE INVENTION

1. Field of the Invention

The present invention relates to an organic semiconductor composition, an organic thin-film transistor, electronic paper, and a display device.

2. Description of the Related Art

In apparatuses using a logical circuit such as a thin-film transistor (TFT), RF tag (RFID), or memory used in a liquid crystal display or an organic EL display, an organic semiconductor device having an organic semiconductor film (organic semiconductor layer) composed of an organic semiconductor material is used, because the use of the organic semiconductor device makes it possible to lighten the weight of the apparatus, reduce the cost, and make the apparatus flexible.

In recent years, as expectations for the organic thin-film transistor have increased, the improvement of mobility (particularly, field effect mobility), stability, and the like have been required for the organic thin-film transistor.

Under these circumstances, JP2005-5582A discloses an organic thin-film transistor in which an organic semiconductor layer is formed of a composition containing an antioxidant so as to reduce the oxidation-induced deterioration of the organic semiconductor layer.

SUMMARY OF THE INVENTION

Regarding the manufacturing of the organic semiconductor device, a transition from a manufacturing method implemented by photolithography to a manufacturing method implemented by so-called printed electronics is considered. The printed electronics is a set of methods in which an organic semiconductor film, wiring, and the like are prepared by means of a printing technique such as gravure offset printing or by an ink jet by using a conductive ink, a semiconductor ink, an insulating ink, or the like. When the wiring of the organic semiconductor device is prepared by printed electronics, the use of a metal material such as silver, which exhibits high conductivity and is less influenced by oxidation, is considered. However, the metal material represented by silver has a problem in that ion migration (also referred to as electrochemical migration, hereinafter, simply referred to as "migration") easily occurs. Particularly, when the metal material represented by silver is used for the wiring in an organic thin-film transistor, the migration developing between wirings (a source electrode and a drain electrode) needs to be inhibited.

As a result of preparing an organic thin-film transistor by using the composition disclosed in JP2005-5582A, the inventors of the present invention found that the mobility of the organic thin-film transistor was greatly reduced. Furthermore, as a result of performing a service life test, the inventors found that the insulation reliability between source/drain electrodes did not satisfy the currently required level.

The present invention has been made under the aforementioned current circumstances, and an object thereof is to provide an organic semiconductor composition, which improves the insulation reliability of an organic thin-film transistor without greatly reducing the mobility of the organic thin-film transistor, an organic thin-film transistor which is prepared by using the organic semiconductor composition, and electronic paper and a display device which uses the organic thin-film transistor.

In order to achieve the aforementioned object, the inventors of the present invention conducted an intensive examination. As a result, they obtained knowledge that, by mixing a fluorine atom-containing compound having a specific structure with an organic semiconductor material, an organic semiconductor composition is obtained which improves the insulation reliability of an organic thin-film transistor without greatly reducing the mobility of the organic thin-film transistor. Based on the knowledge, the inventors accomplished the present invention. That is, the inventors of the present invention found that the aforementioned object can be achieved by the following constitution.

(1) An organic semiconductor composition containing an organic semiconductor material and a migration inhibitor selected from the group consisting of a compound represented by any of Formulae (1) to (8) which will be described later, a polymer compound (X) containing a repeating unit represented by Formula (A) which will be described later, and a polymer compound (Y) containing a repeating unit represented by Formula (B) which will be described later and a repeating unit represented by Formula (C) which will be described later.

The Formulae (Y-1) to (Y-8) are as follows.

$$P-(CR_1=Y)_n-Q \qquad \text{Formula (Y-1)}$$

(In Formula (Y-1), each of P and Q independently represents OH, $NR_2R_3$, or $CHR_4R_5$; each of $R_2$ and $R_3$ independently represents a hydrogen atom or a group which can be substituted with a nitrogen atom; each of $R_4$ and $R_5$ independently represents a hydrogen atom or a substituent; Y represents $CR_6$ or a nitrogen atom; each of $R_1$ and $R_6$ independently represents a hydrogen atom or a substituent; at least two out of the groups represented by $R_1$, $R_2$, $R_3$, $R_4$, $R_5$, and $R_6$ may form a ring by being bonded to each other; n represents an integer of 0 to 5; when n is 0, P and Q do not represent $CHR_4R_5$ at the same time and do not represent OH at the same time; and when n represents a number of equal to or greater than 2, a plurality of atomic groups represented by ($CR_1=Y$) may be the same as or different from each other.)

$$R_7-C(=O)-H \qquad \text{Formula (Y-2)}$$

(In Formula (Y-2), $R_7$ represents an alkyl group, an alkenyl group, an alkynyl group, an aryl group, a heterocyclic group, or a group obtained by combining these groups, and the group represented by $R_7$ may contain a hydroxy group or a group represented by —COO—.)

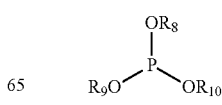

Formula (Y-3)

(In Formula (Y-3), each of $R_8$, $R_9$, and $R_{10}$ independently represents an alkyl group, an alkenyl group, an alkynyl group, an aryl group, a heterocyclic group, or a group obtained by combining these groups.)

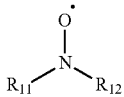

Formula (Y-4)

(In Formula (Y-4), each of $R_{11}$ and $R_{12}$ independently represents an alkyl group, an alkenyl group, an alkynyl group, an aryl group, a heterocyclic group, or a group obtained by combining these groups, and $R_{11}$ and $R_{12}$ may form a ring by being bonded to each other.)

Formula (Y-5)

(In Formula (Y-5), Z represents an alkyl group, an alkenyl group, an alkynyl group, an aryl group, a heterocyclic group, or a group obtained by combining these groups, and the group represented by Z may contain a substituent.)

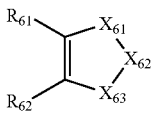

Formula (Y-6)

(In Formula (Y-6), each of $X_{61}$, $X_{62}$, and $X_{63}$ independently represents —NH—, —N=, =N—, —$CR_x$=, =$CR_x$—, or —S—; $R_x$ represents a hydrogen atom, —$NH_2$, or a linear or branched alkyl group having 1 to 15 carbon atoms; in the alkyl group, one carbon atom or two or more carbon atoms which are not adjacent to each other may be substituted with —O—, —S—, —$NR_0$—, —CO—, —CO—O—, —O—CO—, —O—CO—O—, —$CR_0$=$CR_{00}$—, or —C≡C—; in the alkyl group, one or more hydrogen atoms may be substituted with a fluorine atom, a chlorine atom, a bromine atom, an iodine atom, or —CN; each of $R_0$ and $R_{00}$ independently represents a hydrogen atom or a carbyl or hydrocarbyl group which may have a substituent and one or more heteroatoms; and at least one of $X_{61}$, $X_{62}$, and $X_{63}$ is not —$CR_x$= or =$CR_x$—.

Each of $R_{61}$ and $R_{62}$ independently represents a fluorine atom, a chlorine atom, -Sp-P, a linear or branched alkyl group having 1 to 15 carbon atoms, or an aryl group, a heteroaryl group, an aryloxy group, a heteroaryloxy group, an arylcarbonyl group, a heteroarylcarbonyl group, an arylcarbonyloxy group, a heteroarylcarbonyloxy group, an aryloxycarbonyl group, or a heteroaryloxycarbonyl group which has 2 to 30 carbon atoms and may have a substituent; in the alkyl group, one carbon atom or two or more carbon atoms which are not adjacent to each other may be substituted with —O—, —S—, —$NR_0$—, —CO—, —CO—O—, —O—CO—, —O—CO—O—, —$CR_0$=$CR_{00}$—, or —C≡C—; in the alkyl group, one or more hydrogen atoms may be substituted with a fluorine atom, a chlorine atom, a bromine atom, an iodine atom, or —CN; each of $R_0$ and $R_{00}$ independently represents a hydrogen atom or a carbyl or hydrocarbyl group which may have a substituent and one or more heteroatoms; Sp represents a single bond or a divalent organic group; P represents a polymerizable group or a cross-linking group; $R_{61}$ and $R_{62}$ may form an aromatic ring or an aromatic heterocyclic ring having 5 to 7 ring atoms by being bonded to each other; and the aromatic ring and the aromatic heterocyclic ring may have 1 to 6 substituents.)

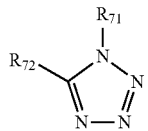

Formula (Y-7)

(In Formula (Y-7), each of $R_{71}$ and $R_{72}$ independently represents an alkyl group, an alkenyl group, an alkynyl group, an aryl group, a heterocyclic group, or a group obtained by combining these groups.)

Z1—S—S—Z2        Formula (Y-8)

(In Formula (Y-8), each of Z1 and Z2 independently represents an alkyl group, an alkenyl group, an alkynyl group, an aryl group, a heterocyclic group, or a group obtained by combining these groups, and at least one of Z1 and Z2 may contain a substituent.)

(2) The organic semiconductor composition described in (1), in which a compound represented by Formula (6) which will be described later is a compound represented by Formula (22) which will be described later.

(3) The organic semiconductor composition described in (1) or (2), in which a compound represented by Formula (8) which will be described later is a compound represented by Formula (23) which will be described later.

(4) The organic semiconductor composition described in any one of (1) to (3), in which a compound represented by Formula (1) which will be described later is a compound represented by Formula (24) which will be described later.

(5) The organic semiconductor composition described in any one of (1) to (3), in which the compound represented by Formula (1) which will be described later is at least one kind of compound selected from the group consisting of compounds represented by Formulae (31) to (46) which will be described later.

(6) The organic semiconductor composition described in any one of (1) to (5), in which a compound represented by Formula (5) which will be described later is at least one kind of compound selected from the group consisting of compounds represented by Formulae (51) to (54) which will be described later.

(7) The organic semiconductor composition described in any one of (1) to (6), in which the migration inhibitor is the polymer compound (Y) containing the repeating unit represented by Formula (B) and the repeating unit represented by Formula (C).

(8) The organic semiconductor composition described in (7), in which in the repeating unit represented by Formula (B), B represents a monovalent group, which is formed as a result of removing one hydrogen atom (here, a hydrogen atom of a hydroxyl group is excluded) from a compound represented by Formula (Y-1) which will be described later or a compound represented by Formula (Y-6) which will be described later, or a group represented by Formula (25) which will be described later.

(9) The organic semiconductor composition described in (1), in which the migration inhibitor is at least one kind of compound selected from the group consisting of a compound represented by Formula (X1) which will be described later, a compound represented by Formula (33) which will be described later, a compound represented by Formula (2) which will be described later, a compound represented by Formula (3) which will be described later, a compound represented by Formula (4A) which will be described later, a compound represented by Formula (Y) which will be described later, a compound represented by Formula (22) which will be described later, a compound represented by Formula (7A) which will be described later, and a compound represented by Formula (23) which will be described later.

(10) The organic semiconductor composition described in (1), in which the migration inhibitor is the polymer compound (X) containing the repeating unit represented by Formula (A) which will be described later.

(11) The organic semiconductor composition described in (10), in which in the repeating unit represented by Formula (A) which will be described later, A represents a monovalent group which is formed as a result of removing one hydrogen atom (here, a hydrogen atom of a hydroxyl group is excluded) from the compound represented by Formula (X1) which will be described later.

(12) The organic semiconductor composition described in any one of (1) to (11), in which the molecular weight of the organic semiconductor material is equal to or less than 2,000.

(13) An organic thin-film transistor prepared by using the organic semiconductor composition described in any one of (1) to (12).

(14) Electronic paper using the organic thin-film transistor described in (13).

(15) A display device using the organic thin-film transistor described in (13).

As will be described below, according to the present invention, it is possible to provide an organic semiconductor composition, which improves the insulation reliability of an organic thin-film transistor without greatly reducing the mobility of the organic thin-film transistor, an organic thin-film transistor which is prepared by using the organic semiconductor composition, and electronic paper and a display device which use the organic thin-film transistor.

BRIEF DESCRIPTION OF THE DRAWINGS

FIG. 1 is a schematic cross-sectional view showing an embodiment of the organic thin-film transistor of the present invention.

DESCRIPTION OF THE PREFERRED EMBODIMENTS

Hereinafter, preferred embodiments of the organic semiconductor composition (composition for an organic semiconductor) of the present invention will be described.

The organic semiconductor composition (hereinafter, simply referred to as a "composition") of the present invention contains an organic semiconductor material and a fluorine atom-containing compound having a specific structure (hereinafter, simply referred to as an "F-containing migration inhibitor").

As described above, the composition of the present invention contains the F-containing migration inhibitor which will be described later. It is considered that, for this reason, the composition of the present invention becomes an organic semiconductor composition which improves the insulation reliability of an organic thin-film transistor without greatly reducing the mobility of the organic thin-film transistor.

Hereinafter, by using FIG. 1, the mechanism of the present invention will be specifically described. In FIG. 1, a case of a top contact-type organic thin-film transistor is specifically described.

In FIG. 1, an organic thin-film transistor 10 includes a substrate 11, a gate electrode 12, a gate insulating film 13, an organic semiconductor layer 14, a source electrode 15a, and a drain electrode 15b.

When voltage is applied to the organic thin-film transistor 10, due to the action of an electric field, the metal in either or both of the source electrode 15a and the drain electrode 15b is ionized. As a result, migration of metal ions occurs between the source electrode 15a and the drain electrode 15b, and therefore the insulating properties between the source electrode 15a/drain electrode 15b deteriorate. Particularly, it is considered that the ion migration markedly occurs in the vicinity of a surface of the organic semiconductor layer 14, which is positioned between the source electrode 15a and the drain electrode 15b, exposed to the outside.

In an organic thin-film transistor (organic TFT) prepared by using the composition of the present invention, the F-containing migration inhibitor has low surface energy. Accordingly, the F-containing migration inhibitor moves to the vicinity of the surface of the organic semiconductor layer and is localized in the vicinity of the exposed surface (surface which does not come into contact with the gate insulating film) of the organic semiconductor layer. Therefore, the F-containing migration inhibitor can inhibit the migration without impairing the mobility. More specifically, in the organic TFT, a large amount of F-containing migration inhibitor is localized in the vicinity of the surface of the organic semiconductor layer that is exposed to the outside. Consequently, the diffusion of the metal ions educed from the electrode can be efficiently inhibited, and the resistance to the migration that occurs when an organic TFT having microelectrodes is prepared is improved. Furthermore, by causing the F-containing migration inhibitor to be localized in the vicinity of the surface of the organic semiconductor layer, it is possible to reduce the amount of the F-containing migration inhibitor reducing the mobility inside the organic semiconductor layer. As a result, it is possible to accomplish excellent performance without impairing the mobility.

The aforementioned mechanism is also supported by Comparative examples 1 to 3 which will be described later. That is, in Comparative examples 1 and 2, in which IRGANOX 1076 as a compound not containing a fluorine atom is contained in the organic semiconductor composition, the compound is not localized as described above and remains scattered inside the organic semiconductor layer. Consequently, the movement of carriers is hindered, and the result of the evaluation of mobility is poor. Furthermore, in Comparative example 3, in which Megafac F-781 as a compound containing a fluorine atom is contained in the organic semiconductor composition, the compound is localized as described above, and the result of the evaluation of mobility is excellent. However, because Comparative example 3 does not exhibit a migration inhibition ability, the result of the evaluation of insulation reliability is poor. From these facts, the present invention is assumed to have the aforementioned mechanism.

Hereinafter, each of the components contained in the composition of the present invention will be specifically described.

In the present specification, an alkyl group may contain a linking group such as —CO—, —NH—, —O—, —S—, or a group obtained by combining these.

<Organic Semiconductor Material>

As the organic semiconductor material contained in the composition of the present invention, it is possible to use a known material used as an organic semiconductor layer in an organic thin-film transistor. Specifically, examples of such a material include pentacenes such as 6,13-bis(triisopropylsilylethynyl)pentacene (TIPS pentacene), tetramethyl pentacene, and perfluoropentacene, anthradithiophenes such as TES-ADT and diF-TES-ADT, benzothienobenzothiophenes such as DPh-BTBT and Cn-BTBT, dinaphthothiophenes such as Cn-DNTT, dioxaanthanthrenes such as perixanthenoxanthene, rubrenes, fullerenes such as C60 and PCBM, phthalocyanines such as copper phthalocyanine and fluorinated copper phthalocyanine, polythiophenes such as P3RT, PQT, and P3HT, polythienothiophenes such as poly [2,5-bis(3-dodecylthiophen-2-yl)thieno[3,2-b]thiophene] (PBTTT), and the like.

The molecular weight of the organic semiconductor material is not particularly limited. However, in view of the mobility of the organic thin-film transistor, the molecular weight of the organic semiconductor material is preferably equal to or less than 2,000, and more preferably equal to or less than 1,200.

When the organic semiconductor material is a polymer, the molecular weight means a weight average molecular weight.

When the organic semiconductor material is a polymer, the weight average molecular weight thereof is a value that is measured by a gel permeation chromatography (GPC) method and expressed in terms of polystyrene. In the GPC method, the weight average molecular weight is measured by dissolving the organic semiconductor material in tetrahydrofuran and by using high-speed GPC apparatus (HLC-8220GPC) manufactured by TOSOH CORPORATION, TSKgel SuperHZ4000 (manufactured by TOSOH CORPORATION, 4.6 mm I. D.×15 cm) as a column, and tetrahydrofuran (THF) as an eluant.

<F-Containing Migration Inhibitor>

The F-containing migration inhibitor (F-containing antimigration agent) contained in the composition of the present invention is a compound selected from the group consisting of a compound represented by any of the following Formulae (1) to (8), a polymer compound (X) containing a repeating unit represented by the following Formula (A), and a polymer compound (Y) containing a repeating unit represented by the following Formula (B) and a repeating unit represented by the following Formula (C). The F-containing migration inhibitor is a compound which contains fluorine atoms and inhibits the migration of metal ions.

The content of fluorine atoms (fluorine content) in the F-containing migration inhibitor is not particularly limited and can be appropriately adjusted according to the type of the organic semiconductor material used or the like. However, in view of lowering the surface energy and causing more of the F-containing migration inhibitor to be localized in the vicinity of the exposed surface of the organic semiconductor layer such that the mobility of the organic semiconductor is not impaired, the fluorine content is preferably equal to or greater than 2% by mass and less than 65% by mass, more preferably 5% by mass to 60% by mass, and even more preferably 10% by mass to 50% by mass. Herein, the fluorine content is a value expressed by a ratio (content) of mass of fluorine atoms to the total molecular weight of the migration inhibitor. That is, the fluorine content is a value expressed by {(number of fluorine atoms in compound)×(atomic weight of fluorine)/(total molecular weight of compound)}×100 (%). For example, provided that the migration inhibitor has a total molecular weight of 100 and contains 3 fluorine atoms, the mass ratio (%) of the fluorine atoms to the total molecular weight is 57% by mass which is calculated by {(19×3)/100}×100.

Hereinafter, the F-containing migration inhibitor will be specifically described.

(Compound represented by Formula (1))

First, a compound represented by Formula (1) will be described.

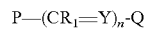   Formula (1)

In Formula (1), each of P and Q independently represents OH, $NR_2R_3$, or $CHR_4R_5$. Y represents $CR_6$ or a nitrogen atom. n represents an integer of 0 to 5. Here, when n is 0, P and Q do not represent $CHR_4R_5$ at the same time and do not represent OH at the same time. When n is a number of equal to or greater than 2, a plurality of atomic groups represented by ($CR_1$=Y) may be the same as or different from each other.

Each of $R_2$ and $R_3$ independently represents a hydrogen atom or a group which can be substituted with a nitrogen atom.

The group which can be substituted with a nitrogen atom is not particularly limited as long as it can be substituted with a nitrogen atom. Examples of such a group include an alkyl group (including a cycloalkyl group), an alkenyl group (including a cycloalkenyl group and a bicycloalkenyl group), an alkynyl group, an aryl group, a heterocyclic group, alkyl and aryl sulfinyl groups, alkyl and aryl sulfonyl groups, an acyl group, an alkoxycarbonyl group, an aryloxycarbonyl group, a carbamoyl group, a phosphino group, a phosphinyl group, a group obtained by combining these, and the like.

More specifically, preferred examples of such a group include an alkyl group [the alkyl group represents a substituted or unsubstituted linear, branched, or cyclic alkyl group; these also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group formed as a result of removing one hydrogen atom from bicycloalkane having 5 to 30 carbon atoms, for example, bicyclo[1.2.2] pentan-2-yl or bicyclo[2.2.2]octan-3-yl), a tricyclo structure having a large number of cyclic structures, and the like; an alkyl group (for example, an alkyl group in an alkylthio group) in a substituent which will be described below also represents the alkyl group having the concept described above], an alkenyl group [a substituted or unsubstituted linear, branched, or cyclic alkenyl group; these include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group formed as a result of removing one hydrogen atom of cycloalkene having 3 to 30 carbon atoms, for example, 2-cyclopenten-1-yl or 2-cyclohexen-1-yl), and a bicycloalkenyl group (a substituted or unsubstituted bicycloalkenyl group, preferably, a substituted or unsubstituted bicycloalkenyl group having 5 to 30 carbon atoms, that is, a monovalent group formed as a result of removing one hydrogen atom of bicycloalkene having one double bond, for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, ethynyl, propargyl, or a trimethylsilylethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group which is formed as a result of removing one hydrogen atom from a 5-membered or 6-membered substituted or unsubstituted aromatic or non-aromatic heterocyclic compound, more preferably, a 5-membered or 6-membered aromatic heterocyclic group having 3 to 30 carbon atoms, for example, 2-furanyl, 2-thienyl, 2-pyrimidinyl, or 2-benzothiazolinyl), alkyl and aryl sulfinyl groups (preferably a substituted or unsubstituted alkyl sulfinyl group having 1 to 30 carbon atoms and a substituted or unsubstituted aryl sulfinyl group having 6 to 30 carbon atoms, for example, methyl sulfinyl, ethyl sulfinyl, phenyl sulfinyl, and p-methylphenyl sulfinyl), alkyl and aryl sulfonyl groups (preferably a substituted or unsubstituted alkyl sulfonyl group having 1 to 30 carbon atoms and a substituted or unsubstituted aryl sulfonyl group having 6 to 30 carbon atoms, for example, methyl sulfonyl, ethyl sulfonyl, phenyl sulfonyl, and p-methylphenyl sulfonyl), an acyl group (preferably a formyl group, a substituted or unsubstituted alkyl carbonyl group having 2 to 30 carbon atoms, a substituted or unsubstituted aryl carbonyl group having 7 to 30 carbon atoms, or a substituted or unsubstituted heterocyclic carbonyl group having 4 to 30 carbon atoms that is bonded to a carbonyl group through carbon atoms, for example, acetyl, pivaloyl, 2-chloroacetyl, stearoyl, benzoyl, p-n-octyloxyphenyl carbonyl, 2-pyridyl carbonyl, or 2-furyl carbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methyl carbamoyl, N,N-dimethyl carbamoyl, N,N-di-n-octyl carbamoyl, or N-(methylsulfonyl)carbamoyl), a phosphino group (preferably a substituted or unsubstituted phosphino group having 2 to 30 carbon atoms, for example, dimethylphosphino, diphenylphosphino, or methylphenoxyphosphino), and a phosphinyl group (preferably a substituted or unsubstituted phosphinyl group having 2 to 30 carbon atoms, for example, phosphinyl, dioctyloxyphosphinyl, or diethoxyphosphinyl).

Among the aforementioned functional groups, those having a hydrogen atom may be further substituted after the hydrogen atom is removed.

The alkyl group represented by $R_2$ and $R_3$ represents a substituted or unsubstituted linear, branched, or cyclic alkyl group. The alkyl group preferably has 1 to 50 carbon atoms, more preferably has 1 to 30 carbon atoms, and particularly preferably has 1 to 20 carbon atoms.

Preferred examples of the alkyl group include methyl, ethyl, n-propyl, isopropyl, cyclopropyl, butyl, isobutyl, t-butyl, sec-butyl, pentyl, isopentyl, neopentyl, t-pentyl, hexyl, cyclohexyl, heptyl, cyclopentyl, octyl, 2-ethylhexyl, nonyl, decyl, dodecyl, tetradecyl, hexadecyl, octadecyl, eicosyl, docosyl, triacontyl, and the like. Among these, methyl, ethyl, n-propyl, isopropyl, butyl, isobutyl, t-butyl, sec-butyl, pentyl, isopentyl, neopentyl, hexyl, cyclohexyl, octyl, 2-ethylhexyl, dodecyl, hexadecyl, and octadecyl are more preferable, and methyl, ethyl, n-propyl, isopropyl, butyl, t-butyl, pentyl, isopentyl, hexyl, cyclohexyl, octyl, 2-ethylhexyl, dodecyl, hexadecyl, and octadecyl are particularly preferable.

The alkyl group may contain a linking group such as —CO—, —NH—, —O—, —S—, or a group obtained by combining these. When the alkyl group contains such a linking group, the position of the linking group is not particularly limited, and the linking group may be positioned at the terminal of the alkyl group. For example, the alkyl group may be in the form of —S—$R_x$ ($R_x$: alkyl group).

The alkyl group represented by $R_2$ and $R_3$ may further have a substituent.

Examples of the substituent include the halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, aryloxycarbonyloxy, an amino group (including an anilino group), an acylamino group, an aminocarbonylamino group, an alkoxycarbonylamino group, an aryloxycarbonylamino group, a sulfamoylamino group, alkyl and aryl sulfonylamino groups, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxycarbonyl group, an alkoxycarbonyl group, a carbamoyl group, aryl and heterocyclic azo groups, an imide group, a phosphino group, a phosphinyl group, a phosphinyloxy group, a phosphinylamino group, a silyl group, and a combination of these.

More specifically, the substituent represents a halogen atom (for example, a chlorine atom, a bromine atom, or an iodine atom), an alkyl group [the alkyl group represents a substituted or unsubstituted linear, branched, or cyclic alkyl group; these also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group formed as a result of removing one hydrogen atom from bicycloalkane having 5 to 30 carbon atoms, for example, bicyclo[1.2.2]heptan-2-yl or bicyclo[2.2.2]octan-3-yl), a tricyclo structure having a large number of cyclic structures, and the like; an alkyl group (for example, an alkyl group in an alkylthio group) in a substituent which will be described below also represents the alkyl group having the concept described above], an alkenyl group [the alkenyl group represents a substituted or unsubstituted linear, branched, or cyclic alkenyl group; these include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group formed as a result of removing one hydrogen atom of cycloalkene having 3 to 30 carbon atoms, for example, 2-cyclopenten-1-yl or 2-cyclohexen-1-yl), and a bicycloalkenyl group (a substituted or unsubstituted bicycloalkenyl group, preferably, a substituted or unsubstituted bicycloalkenyl group having 5 to 30 carbon atoms, that is, a monovalent group formed as a result of removing one hydrogen atom of bicycloalkene having one double bond, for example, bicyclo[2.2.1]hept-2-en-1-yl or bicyclo[2.2.2]oct-2-en-4-yl)], an alkynyl group (preferably a substituted or unsubstituted alkynyl group having 2 to 30 carbon atoms, for example, ethynyl, propargyl, or a trimethylsilyl ethynyl group), an aryl group (preferably a substituted or unsubstituted aryl group having 6 to 30 carbon atoms, for example, phenyl, p-tolyl, naphthyl, m-chlorophenyl, or o-hexadecanoylaminophenyl), a heterocyclic group (preferably a monovalent group which is formed as a result of removing one hydrogen atom from a 5-membered or 6-membered substituted or unsubstituted aromatic or non-aromatic heterocyclic compound, more preferably, a 5-membered or 6-membered aromatic heterocyclic group having 3 to 30 carbon atoms, for example, 2-furanyl, 2-thienyl, 2-pyrimidinyl, or 2-benzothiazolinyl), a cyano group, a hydroxyl group, a nitro group, a carboxyl group, an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy), an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy), a silyloxy group (preferably a silyloxy group having 3 to 20 carbon atoms, for example, trimethylsilyloxy or t-butyldimethylsilyloxy), a heterocyclic oxy group (preferably a substituted or unsubstituted heterocyclic oxy group having 2 to 30 carbon atoms, for example, 1-phenyltetrazol-5-oxy or 2-tetrahydropyranyloxy), an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy), a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy), an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octylcarbonyloxy), an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxycarbonyloxy), an amino group (preferably an amino group, a substituted or unsubstituted alkylamino group having 1 to 30 carbon atoms, or a substituted or unsubstituted anilino group having 6 to 30 carbon atoms, for example, amino, methylamino, dimethylamino, anilino, N-methyl-anilino, or diphenylamino), an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, 3,4,5-tri-n-octyloxyphenylcarbonylamino), an amino carbonyl amino group (preferably substituted or unsubstituted aminocarbonylamino having 1 to 30 carbon atoms, for example, carbamoylamino, N,N-dimethylaminocarbonylamino, N,N-diethylaminocarbonylamino, or morpholinocarbonylamino), an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino), an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino), a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino), alkyl and aryl sulfonylamino groups (preferably substituted or unsubstituted alkylsulfonylamino having 1 to 30 carbon atoms and substituted or unsubstituted arylsulfonylamino having 6 to 30 carbon atoms, for example, methylsulfonylamino, butylsulfonylamino, phenylsulfonylamino, 2,3,5-trichlorophenylsulfonylamino, or p-methylphenylsulfonylamino), a mercapto group, an alkylthio group (preferably a substituted or unsubstituted alkylthio group having 1 to 30 carbon atoms, for example, methylthio, ethylthio, or n-hexadecylthio), an arylthio group (preferably substituted or unsubstituted aryltho having 6 to 30 carbon atoms, for example, phenylthio, p-chlorophenylthio, or m-methoxyphenylthio), a heterocyclic thio group (preferably a substituted or unsubstituted heterocyclic thio group having 2 to 30 carbon atoms, for example, 2-benzothiazolylthio or 1-phenyltetrazol-5-ylthio), a sulfamoyl group (preferably a substituted or unsubstituted sulfamoyl group having 0 to 30 carbon atoms, for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl), a sulfo group, alkyl and aryl sulfinyl groups (preferably a substituted or unsubstituted alkylsulfinyl group having 1 to 30 carbon atoms and a substituted or unsubstituted arylsulfinyl group having 6 to 30 carbon atoms, for example, methylsulfinyl, ethylsulfonyl, phenylsulfinyl, or p-methylphenylsulfinyl), alkyl and aryl sulfonyl groups (preferably a substituted or unsubstituted alkylsulfonyl group having 1 to 30 carbon atoms and a substituted or unsubstituted arylsulfonyl group having 6 to 30 carbon atoms, for example, methylsulfonyl, ethylsulfonyl, phenylsulfonyl, and p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms that is bonded to a carbonyl group through carbon atoms, for example, acetyl, pivaloyl, 2-chloroacetyl, stearoyl, benzoyl, p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxy-carbonyl, t-butoxycarbonyl, or n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-oetylcarbamoyl, or N-(methylsulfonyl)carbamoyl), aryl and heterocyclic azo groups (preferably a substituted or unsubstituted arylazo group having 6 to 30 carbon atoms and a substituted or unsubstituted heterocyclic azo group having 3 to 30 carbon atoms, for example, phenylazo, p-chlorophenylazo, and 5-ethylthio-1,3,4-thiadiazol-2-ylazo), an imide group (preferably N-succinimide or N-phthalimide), a phosphino group (preferably a substituted or unsubstituted phosphino group having 2 to 30 carbon atoms, for example, dimethylphosphino, diphenylphosphino, or methylphenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), or a silyl group (preferably a substituted or unsubstituted silyl group having 3 to 30 carbon atoms, for example, trimethylsilyl, t-butyldimethylsilyl, or phenyldimethylsilyl).

Among the aforementioned functional groups, those having a hydrogen atom may be further substituted with the aforementioned groups after the hydrogen atom is removed. Examples of such functional groups include an alkylcarbonylaminosulfonyl group, an arylcarbonylaminosulfonyl group, an alkylsulfonylaminocarbonyl group, an arylsulfonylaminocarbonyl group, and the like. Examples of these functional groups include methylsulfonylaminocarbonyl, p-methylphenylsulfonylaminocarbonyl, acetylaminosulfonyl, a benzoylaminosulfonyl group, and the like.

The alkenyl group represented by $R_2$ and $R_3$ represents a substituted or unsubstituted linear, branched, or cyclic alkenyl group. Such an alkenyl group preferably has 2 to 50 carbon atoms, more preferably has 2 to 30 carbon atoms, and particularly preferably has 2 to 20 carbon atoms. Preferred examples of the alkenyl group include vinyl, allyl, prenyl, geranyl, oleyl, 2-cyclopenten-1-yl, 2-cyclohexen-1-yl, bicyclo[2.2.1]hept-2-en-1-yl, bicyclo[2.2.2]oct-2-en-4-yl, and the like. Among these, vinyl, allyl, prenyl, geranyl, oleyl, 2-cyclopenten-1-yl, and 2-cyclohexen-1-yl are more preferable.

The alkenyl group represented by $R_2$ and $R_3$ may further have a substituent.

Examples of the substituent include the substituents of the alkyl group represented by $R_2$ and $R_3$ described above.

Just like the aforementioned alkyl group, the alkenyl group may contain a linking group such as —CO—, —NH—, —O—, —S—, or a group obtained by combining these.

The alkynyl group represented by $R_2$ and $R_3$ represents a substituted or unsubstituted linear, branched, or cyclic alkynyl group. The alkynyl group preferably has 2 to 50 carbon atoms, more preferably has 2 to 30 carbon atoms, and particularly preferably has 2 to 20 carbon atoms. Preferred examples of the alkynyl group include ethynyl, propargyl, and the like.

The alkynyl group represented by $R_2$ and $R_3$ may further have a substituent.

Examples of the substituent include the substituents of the alkyl group represented by $R_2$ and $R_3$ described above.

Just like the aforementioned alkyl group, the alkynyl group may contain a linking group such as —CO—, —NH—, —O—, —S—, or a group obtained by combining these.

The aryl group represented by $R_2$ and $R_3$ represents a substituted or unsubstituted aryl group. The aryl group preferably has 6 to 50 carbon atoms, more preferably has 6 to 30 carbon atoms, and particularly preferably has 6 to 20 carbon atoms. Preferred examples of the aryl group include phenyl, 2-methylphenyl, 3-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 3-chlorophenyl, 4-chlorophenyl, 2-methoxyphenyl, 3-methoxyphenyl, 4-methoxyphenyl, 2-benzylphenyl, 4-benzylphenyl, 2-methylcarbonylphenyl, 4-methylcarbonylphenyl, and the like.

Among these, phenyl, 2-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 3-methoxyphenyl, 4-methoxyphenyl, 2-benzylphenyl, 4-benzylphenyl, and the like are more preferable, and phenyl, 2-methylphenyl, 4-methylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 4-methoxyphenyl, 2-benzylphenyl, 4-benzylphenyl, and the like are particularly preferable.

The aryl group represented by $R_2$ and $R_3$ may further have a substituent. Examples of the substituent include the substituents of the alkyl group represented by $R_2$ and $R_3$ described above.

Each of $R_4$ and $R_5$ independently represents a hydrogen atom or a substituent.

Examples of the substituent represented by $R_4$ and $R_5$ include the substituents of the alkyl group represented by $R_2$ and $R_3$ described above. The substituent is preferably an alkyl group, an alkenyl group, an alkynyl group, an aryl group, or a group obtained by combining these. Preferred examples of each of these substituents include the groups exemplified as $R_2$ and $R_3$ described above.

The group represented by $R_4$ and $R_5$ may further have a substituent. Examples of the substituent include the substituents of the alkyl group represented by $R_2$ and $R_3$ described above.

Each of $R_1$ and $R_6$ independently represents a hydrogen atom or a substituent.

Examples of the substituent represented by $R_1$ and $R_6$ include the substituents of the alkyl group represented by $R_2$ and $R_3$ described above. The substituent is preferably an alkyl group, an alkenyl group, an alkynyl group, an aryl group, or a group obtained by combining these. Preferred examples of each of these substituents include the groups exemplified as $R_2$ and $R_3$ described above.

The group represented by $R_1$ and $R_6$ may further have a substituent. Examples of the substituent include the substituents of the alkyl group represented by $R_2$ and $R_3$ described above.

The compound represented by Formula (1) may be linear or cyclic. When the compound is cyclic, at least two out of the groups represented by $R_1$, $R_2$, $R_3$, $R_4$, $R_5$, or $R_6$ may form a ring by being bonded to each other.

When the two groups are bonded to each other, they may be bonded to each other through any of a single bond, a double bond, or a triple bond.

At least one of the groups represented by $R_1$ to $R_6$ contains a fluorine atom. The fluorine atom may be substituted with any carbon atom of the compound represented by Formula (1). Herein, it is preferable that in at least one of the groups represented by $R_1$ to $R_6$, a portion of hydrogen atoms or the entirety of hydrogen atoms (preferably a portion of hydrogen atoms or the entirety of hydrogen atoms bonded to carbon atoms) are substituted with a fluorine atom. Particularly, it is preferable that the fluorine atom is contained in at least one of the groups represented by $R_1$ to $R_6$, as a fluoroalkyl group (hereinafter, referred to as an $R_f$ group) or a group substituted with the $R_f$ group. That is, it is preferable that at least one of the groups represented by $R_1$ to $R_6$ contains a fluoroalkyl group (preferably, a perfluoroalkyl group). Herein, it is preferable that the fluorine content of the compound represented by Formula (1) satisfies the range described above.

The fluoroalkyl group is an alkyl group in which a portion of hydrogen atoms or the entirety of hydrogen atoms are substituted with a fluorine atom. The perfluoroalkyl group is an alkyl group in which the entirety of hydrogen atoms are substituted with a fluorine atom.

The $R_f$ group is preferably a linear or branched perfluoroalkyl group having 1 to 14 carbon atoms (preferably having 1 to 10 carbon atoms and more preferably having 1 to 7 carbon atoms) or a substituent having 2 to 20 carbon atoms that is substituted with a linear or branched perfluoroalkyl group having 1 to 14 carbon atoms.

Examples of the linear or branched perfluoroalkyl group having 1 to 14 carbon atoms include $CF_3-$, $C_2F_5-$, $C_3F_7-$, $C_4F_9-$, $C_5F_{11}-$, $(CF_3)_2-CF-(CF_2)_2-$, $C_6F_{13}-$, $C_7F_{15}-$, $(CF_3)_2-CF-(CF_2)_4-$, $C_8F_{17}-$, $C_9F_{19}-$, $C_{10}F_{21}-$, $C_{12}F_{25}-$, and $C_{14}F_{29}-$.

Examples of the substituent having 2 to 20 carbon atoms that is substituted with a perfluoroalkyl group having 1 to 14 carbon atoms include $(CF_3)_2CF(CF_2)_4(CH_2)_2-$, $C_9F_{19}CH_2-$, $C_8F_{17}CH_2CH(OH)CH_2-$, $C_8F_{17}CH_2CH(OH)CH_2OC=OCH_2-$, $(CF_3)_2CF(CF_2)_4(CH_2)_2OC=OCH_2-$, $C_8F_{17}CH_2CH(OH)CH_2OC=O(CH_2)_2-$, $(CF_3)_2CF(CF_2)_4(CH_2)_2OC=O(CH_2)_2-$, $(CF_3)_2CFOC_2F_4-$, $CF_3CF_2CF_2O[CF(CF_3)CF_2O]_4-CF(CF_3)-$, and the like, but the present invention is not limited to these.

It is preferable that at least one of the groups represented by $R_1$ to $R_6$ contains 1 to 4 $R_f$ groups in a single molecule.

Herein, two or more kinds of the compound represented by Formula (1) may be used.

The compound represented by Formula (1) is preferably a compound represented by the following Formula (24). The compound represented by Formula (24) preferably contains a fluorine atom, and the fluorine content in the compound represented by Formula (24) preferably satisfies the range described above.

Conceptually, the compound represented by Formula (24) corresponds to a compound subordinate to the compound represented by Formula (36) which will be described later. Specifically, $R_{241}$ described below corresponds to $CHR_{361}R_{362}$ in Formula (36), and $R_{242}$ to $R_{244}$ and $Rf_1(X_1)(F)C-L_1-Y_1-L_2-Z_1-L_3-$ corresponds to $V_{36}$ in Formula (36).

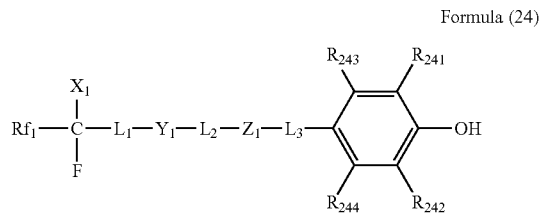

Formula (24)

In Formula (24) each of $R_{241}$ and $R_{242}$ independently represents an alkyl group having 1 to 12 carbon atoms. Because the migration inhibition ability is further improved, the alkyl group is preferably an alkyl group having 1 to 8 carbon atoms, more preferably an alkyl group having 1 to 6 carbon atoms, and particularly preferably an alkyl group having 1 to 5 carbon atoms. Preferred examples of the alkyl group specifically include methyl, ethyl, n-propyl, isopropyl, t-butyl, isobutyl, 2,2-dimethylpropyl, hexyl, cyclohexyl, and the like.

In Formula (24), each of $R_{243}$ and $R_{244}$ independently represents a hydrogen atom or a substituent. Specific examples and preferred embodiments of the substituent are the same as those of the substituents of the alkyl group represented by $R_2$ and $R_3$ described above.

In Formula (24), $R_{f1}$ represents a fluoroalkyl group having 22 or less carbon atoms that may have an ethereal oxygen atom, in which at least one hydrogen atom is substituted with a fluorine atom. Alternatively, $R_{f1}$ represents a fluorine atom.

The hydrogen atom in the perfluoroalkyl group may be substituted with a halogen atom other than a fluorine atom. As the halogen atom other than a fluorine atom, a chlorine atom is preferable. Furthermore, the ethereal oxygen atom (—O—) may be present between a carbon-carbon bond of the fluoroalkyl group or may be present at the terminal of the fluoroalkyl group. Examples of the structure of the fluoroalkyl group include a linear structure, a branched structure, a cyclic structure, and a structure that partially has a ring. Among these, a linear structure is preferable.

$R_{f1}$ is preferably a perfluoroalkyl group or a polyfluoroalkyl group containing one hydrogen atom, and particularly preferably a perfluoroalkyl group (here, the perfluoroalkyl group includes a perfluoroalkyl group having an ethereal oxygen atom).

$R_{f1}$ is preferably a perfluoroalkyl group having 4 to 6 carbon atoms or a perfluoroalkyl group having 4 to 9 carbon atoms that has an ethereal oxygen atom.

Specific examples of $R_{f1}$ includes $-CF_3$, $-CF_2CF_3$, $-CF_2CHF_2$, $-(CF_2)_2CF_3$, $-(CF_2)_3CF_3$, $-(CF_2)_4CF_3$, $-(CF_2)_5CF_3$, $-(CF_2)_6CF_3$, $-(CF_2)_7CF_3$, $-(CF_2)_8CF_3$, $-(CF_2)_9CF_3$, $-(CF_2)_{11}CF_3$, $-(CF_2)_{15}CF_3$, $-CF(CF_3)O(CF_2)_5CF_3$, $-CF_2O(CF_2CF_2O)_pCF_3$ (p represents an integer of 1 to 8), $-CF(CF_3)O(CF_2CF(CF_3)O)_qC_6F_{13}$ (q represents an integer of 1 to 4), and $-CF(CF_3)O(CF_2CF(CF_3)O)_rC_3F_7$ (r represents an integer of 1 to 5).

$R_{f1}$ is particularly preferably $-(CF_2)CF_3$ or $-(CF_2)_5CF_3$.

In Formula (24), $X_1$ represents a hydrogen atom, a fluorine atom, or a trifluoromethyl group. Among these, a fluorine atom and a trifluoromethyl group are preferable.

In Formula (24), $L_1$ represents a single bond or an alkylene group having 1 to 6 carbon atoms. Among these, an alkylene group having 1 to 2 carbon atoms is preferable.

In Formula (24), $L_2$ represents a single bond or an alkylene group having 1 to 6 carbon atoms that may be substituted with a hydroxyl group or a fluorine atom. Among these, an alkylene group having 1 to 2 carbon atoms is preferable.

In Formula (24), $L_3$ represents a single bond or an alkylene group having 1 to 6 carbon atoms. Among these, an alkylene group having 1 to 2 carbon atoms is preferable.

In Formula (24), each of $Y_1$ and $Z_1$ represents a single bond, $-CO_2-$, $-CO-$, $-OC(=O)O-$, $-SO_3-$, $-CONR_{245}-$, $-NHCOO-$, $-O-$, $-S-$, $-SO_2NR_{245}-$, or $-NR_{245}-$. Among these, $-CO_2-$, $-O-$, $-S-$, $-SO_2NR_{245}-$, and $-CONR_{245}-$ are preferable. $R_{245}$ represents a hydrogen atom or an alkyl group having 1 to 5 carbon atoms.

Here, when both of $Y_1$ and $Z_1$ represent a group other than a single bond, $L_2$ represents an alkylene group having 1 to 6 carbon atoms that may be substituted with a fluorine atom.

As another preferred embodiment of the compound represented by Formula (1), a compound selected from the group consisting of compounds represented by the following Formulae (31) to (46) is exemplified. Herein, the compounds represented by Formulae (31) to (46) preferably contain a fluorine atom, and the fluorine content of the compounds preferably satisfies the range described above.

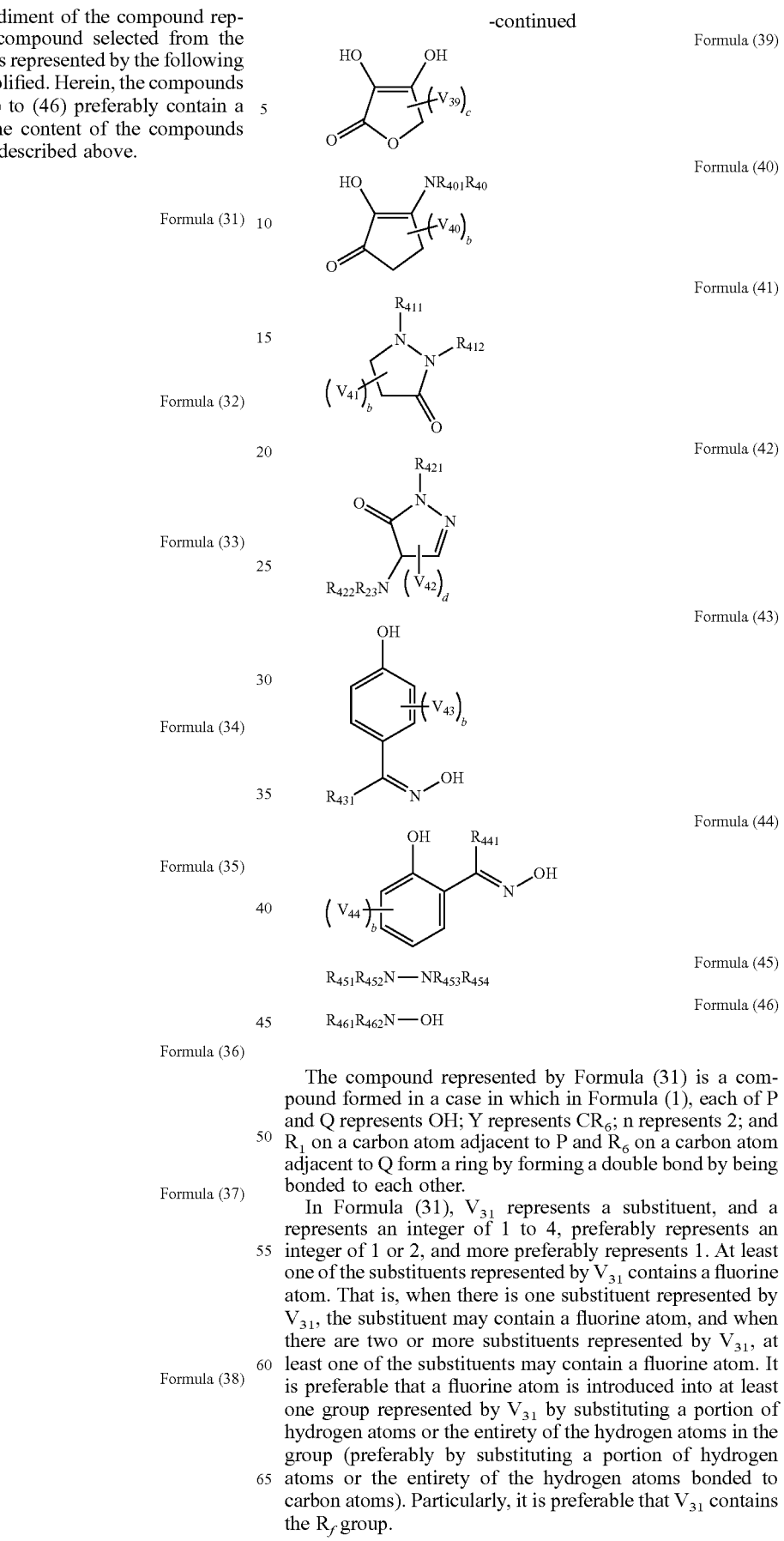

The compound represented by Formula (31) is a compound formed in a case in which in Formula (1), each of P and Q represents OH; Y represents $CR_6$; n represents 2; and $R_1$ on a carbon atom adjacent to P and $R_6$ on a carbon atom adjacent to Q form a ring by forming a double bond by being bonded to each other.

In Formula (31), $V_{31}$ represents a substituent, and a represents an integer of 1 to 4, preferably represents an integer of 1 or 2, and more preferably represents 1. At least one of the substituents represented by $V_{31}$ contains a fluorine atom. That is, when there is one substituent represented by $V_{31}$, the substituent may contain a fluorine atom, and when there are two or more substituents represented by $V_{31}$, at least one of the substituents may contain a fluorine atom. It is preferable that a fluorine atom is introduced into at least one group represented by $V_{31}$ by substituting a portion of hydrogen atoms or the entirety of the hydrogen atoms in the group (preferably by substituting a portion of hydrogen atoms or the entirety of the hydrogen atoms bonded to carbon atoms). Particularly, it is preferable that $V_{31}$ contains the $R_f$ group.

Examples of the substituent represented by $V_{31}$ include the substituents of the alkyl group represented by $R_2$ and $R_3$ in Formula (1) described above. When there is a plurality of groups represented by $V_{31}$ in Formula (31), the groups may be the same as or different from each other or may form a ring by being bonded to each other.

Specific examples of the compound represented by Formula (31) will be shown below, but the present invention is not limited thereto. Herein, the percentage listed together with the structural formula of the compound signifies the mass ratio of fluorine atoms (fluorine content).

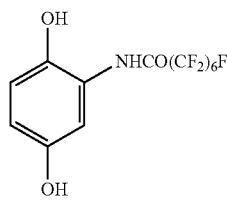

31-1

52.4%

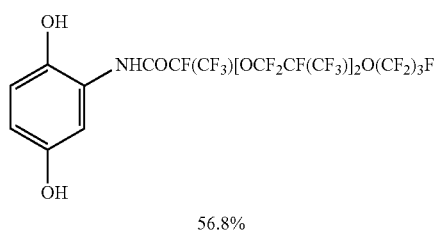

31-2

56.8%

The compound represented by Formula (32) is an example of a compound formed in a case in which in Formula (1), each of P and Q represents OH; Y represents $CR_6$; n represents 1; and $R_1$ on a carbon atom adjacent to P and $R_6$ on a carbon atom adjacent to Q form a ring by being bonded to each other.

In Formula (32), $V_{32}$ represents a substituent, and a represents an integer of 1 to 4, preferably represents an integer of 1 or 2, and even more preferably represents 1. At least one of the substituents represented by $V_{32}$ contains a fluorine atom. That is, when there is one substituent represented by $V_{32}$, the substituent may contain a fluorine atom, and when there are two or more substituents represented by $V_{32}$, at least one of the substituents may contain a fluorine atom. It is preferable that a fluorine atom is introduced into at least one group represented by $V_{32}$ by substituting a portion of hydrogen atoms or the entirety of the hydrogen atoms in the group (preferably by substituting a portion of hydrogen atoms or the entirety of the hydrogen atoms bonded to carbon atoms). Particularly, it is preferable that $V_{32}$ contains the $R_f$ group.

Examples of the substituent represented by $V_{32}$ include the substituents of the alkyl group represented by $R_2$ and $R_3$ in Formula (1) described above. When there is a plurality of groups represented by $V_{32}$ in Formula (32), the groups may be the same as or different from each other or may form a ring by being bonded to each other.

Specific examples of the compound represented by Formula (32) will be shown below, but the present invention is not limited thereto. Herein, the percentage listed together with the structural formula of the compound signifies the mass ratio of fluorine atoms (fluorine content).

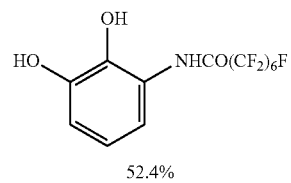

32-1

52.4%

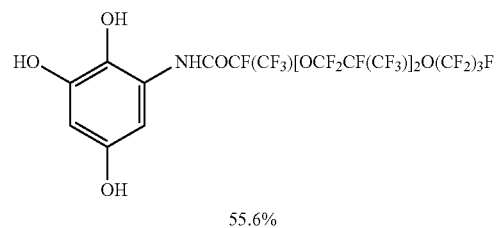

32-2

55.6%

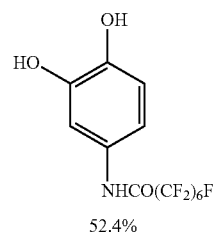

32-3

52.4%

The compound represented by Formula (33) is an example of a compound formed in a case in which in Formula (1), P represents OH; Q represents $NR_2R_3$; Y represents $CR_6$; n represents 2; and $R_1$ on a carbon atom adjacent to P and $R_6$ on a carbon atom adjacent to Q form a ring by forming a double bond by being bonded to each other.

In Formula (33), $V_{33}$ represents a substituent, and b represents an integer of 0 to 4, preferably represents an integer of 1 or 2, and even more preferably represents 1. Examples of the substituent represented by $V_{33}$ include the substituents of the alkyl group represented by $R_2$ and $R_3$ in Formula (1) described above. When there is a plurality of groups represented by $V_{33}$ in Formula (33), the groups may be the same as or different from each other or may form a ring by being bonded to each other.

Each of $R_{331}$ and $R_{332}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $V_{33}$, $R_{331}$, and $R_{332}$ contains a fluorine atom. Particularly, it is preferable that in at least one of the groups represented by $V_{33}$, $R_{331}$, and $R_{332}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{33}$, $R_{331}$, and $R_{332}$ contains the $R_f$ group.

When there is a plurality of groups represented by $V_{33}$, at least one of the plurality of groups represented by $V_{33}$, $R_{331}$, and $R_{332}$ contains a fluorine atom.

Specific examples of the compound represented by Formula (33) will be shown below, but the present invention is not limited thereto. Herein, the percentage listed together with the structural formula of the compound signifies the mass ratio of fluorine atoms (fluorine content).

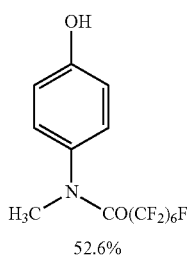

33-1

52.6%

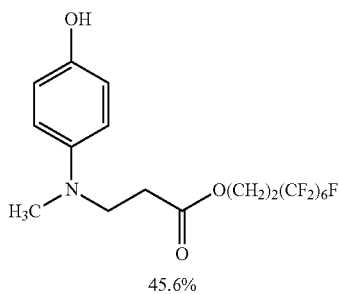

45.6%

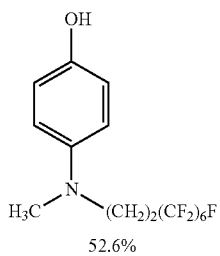

33-3

52.6%

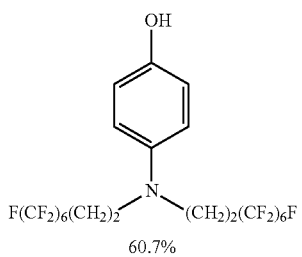

60.7%

The compound represented by Formula (34) is an example of a compound formed in a case in which in Formula (1), P represents OH; Q represents $NR_2R_3$; Y represents $CR_6$; n represents 1; and $R_1$ on a carbon atom adjacent to P and $R_6$ on a carbon atom adjacent to Q form a ring by being bonded to each other.

In Formula (34), $V_{34}$ represents a substituent, and b represents an integer of 0 to 4, preferably represents an integer of 0 to 2, and even more preferably represents 1. Examples of the substituent represented by $V_{34}$ include the substituents of the alkyl group represented by $R_2$ and $R_3$ in Formula (1) described above. When there is a plurality of groups represented by $V_{34}$ in Formula (34), the groups may be the same as or different from each other or may form a ring by being bonded to each other.

Each of $R_{341}$ and $R_{342}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $V_{34}$, $R_{341}$, and $R_{342}$ contains a fluorine atom. Particularly, it is preferable that in at least one of the groups represented by $V_{34}$, $R_{341}$, and $R_{342}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{34}$, $R_{341}$, and $R_{342}$ contains the $R_f$ group.

When there is a plurality of groups represented by $V_{34}$, at least one of the plurality of groups represented by $V_{34}$, $R_{341}$, and $R_{342}$ contains a fluorine atom.

Specific examples of the compound represented by Formula (34) will be shown below, but the present invention is not limited thereto. Herein, the percentage listed together with the structural formula of the compound signifies the mass ratio of fluorine atoms (fluorine content).

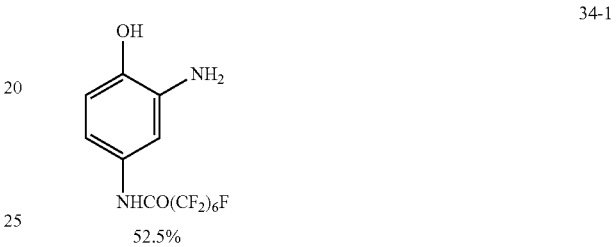

34-1

52.5%

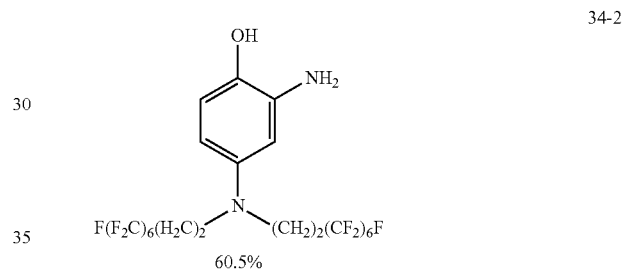

34-2

60.5%

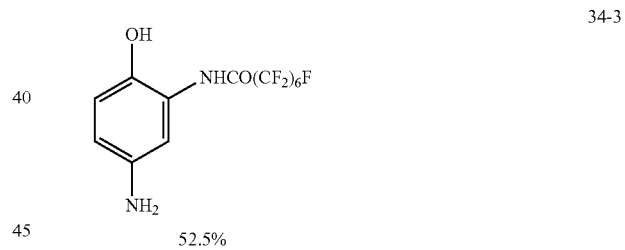

34-3

52.5%

The compound represented by Formula (35) is an example of a compound formed in a case in which in Formula (1), P represents OH; Q represents $CHR_4R_5$; Y represents $CR_6$; n represents 2; and $R_1$ on a carbon atom adjacent to P and $R_6$ on a carbon atom adjacent to Q form a ring by forming a double bond by being bonded to each other.

In Formula (35), $V_{35}$ represents a substituent, and b represents an integer of 0 to 4, preferably represents an integer of 1 or 2, and even more preferably represents 1. Examples of the substituent represented by $V_{35}$ include the substituents of the alkyl group represented by $R_2$ and $R_3$ in Formula (1) described above. When there is a plurality of groups represented by $V_{35}$ in Formula (35), the groups may be the same as or different from each other or may form a ring by being bonded to each other.

Each of $R_{351}$ and $R_{352}$ independently represents a hydrogen atom or a substituent. Examples of the substituent represented by $R_{351}$ and $R_{352}$ include the substituents of the alkyl group represented by $R_2$ and $R_3$ described above. The substituent is preferably an alkyl group, an alkenyl group, an alkynyl group, or an aryl group. Preferred examples of each of these substituents include the groups exemplified as $R_2$ and $R_3$ described above.

When $R_{351}$ and $R_{352}$ represent substituents, these groups may further have a substituent. Examples of the substituent include the substituents of the alkyl group represented by $R_2$ and $R_3$ in Formula (1) described above.

At least one of $V_{35}$, $R_{351}$, and $R_{352}$ contains a fluorine atom. Particularly, it is preferable that in at least one of the groups represented by $V_{35}$, $R_{351}$, and $R_{352}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{35}$, $R_{351}$, and $R_{352}$ contains the $R_f$ group.

When there is a plurality of groups represented by $V_{35}$, at least one of the plurality of groups represented by $V_{35}$, $R_{351}$, and $R_{352}$ contains a fluorine atom.

Specific examples of the compound represented by Formula (35) will be shown below, but the present invention is not limited thereto. Herein, the percentage listed together with the structural formula of the compound signifies the mass ratio of fluorine atoms (fluorine content).

35-1

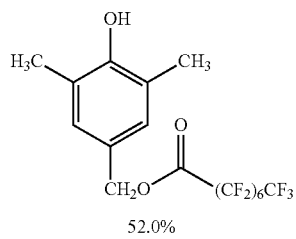

52.0%

35-2

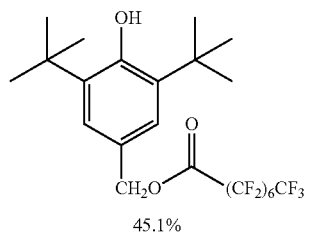

45.1%

35-3

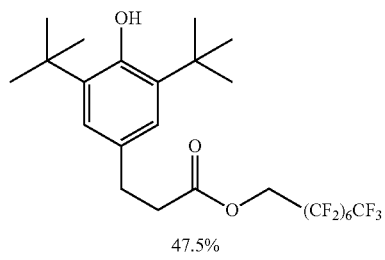

47.5%

-continued 35-4

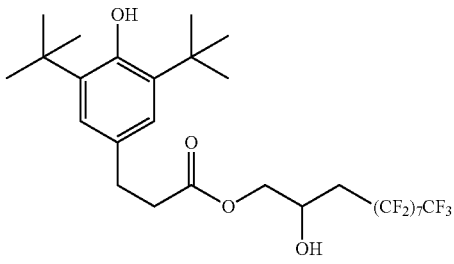

42.8%

35-5

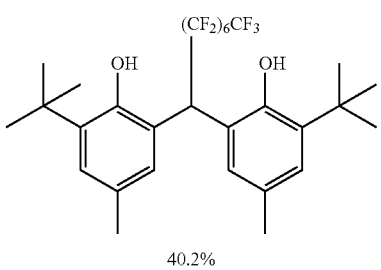

40.2%

35-6

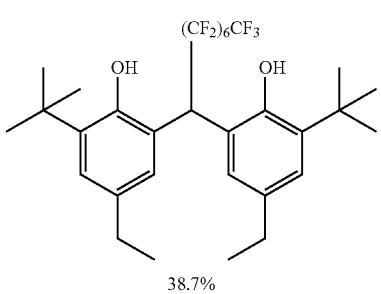

38.7%

The compound represented by Formula (36) is an example of a compound formed in a case in which in Formula (1), P represents OH; Q represents $CHR_4R_5$; Y represents $CR_6$; n represents 1; and $R_1$ on a carbon atom adjacent to P and $R_6$ on a carbon atom adjacent to Q form a ring by being bonded to each other.

In Formula (36), $V_{36}$ represents a substituent, and b represents an integer of 0 to 4, preferably represents an integer of 1 or 2, and even more preferably represents 1. Examples of the substituent represented by $V_{36}$ include the substituents of the alkyl group represented by $R_2$ and $R_3$ in Formula (1) described above. When there is a plurality of groups represented by $V_{36}$ in Formula (36), the groups may be the same as or different from each other or may form a ring by being bonded to each other.

Each of $R_{361}$ and $R_{362}$ independently represents a hydrogen atom or a substituent.

Examples of the substituent represented by $R_{361}$ and $R_{362}$ include the substituents of the alkyl group represented by $R_2$ and $R_3$ described above. The substituent is preferably an alkyl group, an alkenyl group, an alkynyl group, or an aryl group. Preferred examples of each of these substituents include the groups exemplified as $R_2$ and $R_3$ described above.

When $R_{361}$ and $R_{362}$ represent substituents, these groups may further have a substituent. Examples of the substituent include the substituents of the alkyl group represented by $R_2$ and $R_3$ in Formula (1) described above.

At least one of $V_{36}$, $R_{361}$, and $R_{362}$ contains a fluorine atom. Particularly, it is preferable that in at least one of the groups represented by $V_{36}$, $R_{361}$, and $R_{362}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{36}$, $R_{361}$, and $R_{362}$ contains the $R_f$ group.

When there is a plurality of groups represented by $V_{36}$, at least one of the plurality of groups represented by $V_{36}$, $R_{361}$, and $R_{362}$ contains a fluorine atom.

Specific examples of the compound represented by Formula (36) will be shown below, but the present invention is not limited thereto. Herein, the percentage listed together with the structural formula of the compound signifies the mass ratio of fluorine atoms (fluorine content).

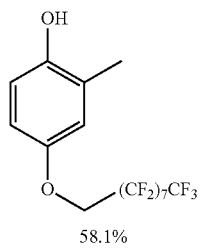

36-1

58.1%

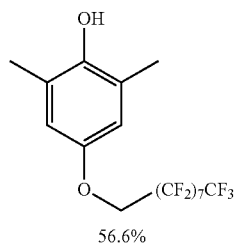

36-2

56.6%

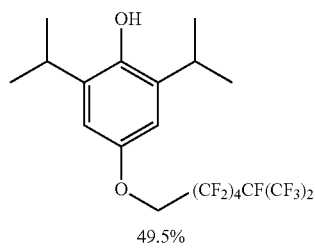

36-3

49.5%

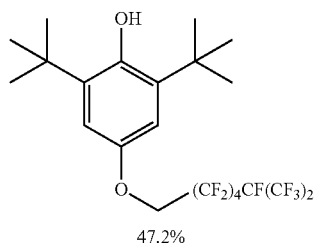

36-4

47.2%

The compound represented by Formula (37) is an example of a compound formed in a case in which in Formula (1), each of P and Q represents $NR_2R_3$; Y represents $CR_6$; n represents 2; and $R_1$ on a carbon atom adjacent to P and $R_6$ on a carbon atom adjacent to Q form a ring by forming a double bond by being bonded to each other.

In Formula (37), $V_{37}$ represents a substituent, and b represents an integer of 0 to 4, preferably represents an integer of 1 or 2, and even more preferably represents 1.

Examples of the substituent represented by $V_{37}$ include the substituents of the alkyl group represented by $R_2$ and $R_3$ in Formula (1) described above. When there is a plurality of groups represented by $V_{37}$ in Formula (37), the groups may be the same as or different from each other or may form a ring by being bonded to each other.

Each of $R_{371}$, $R_{372}$, $R_{373}$, and $R_{374}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $V_{37}$, $R_{371}$, $R_{372}$, $R_{373}$, and $R_{374}$ contains a fluorine atom. Particularly, it is preferable that in at least one of the groups represented by $V_{37}$, $R_{371}$, $R_{372}$, $R_{373}$, and $R_{374}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{37}$, $R_{371}$, $R_{372}$, $R_{373}$, and $R_{374}$ contains the $R_f$ group.

When there is a plurality of groups represented by $V_{37}$, at least one of the plurality of groups represented by $V_{37}$, $R_{371}$, $R_{372}$, $R_{373}$, and $R_{374}$ contains a fluorine atom.

Specific examples of the compound represented by Formula (37) will be shown below, but the present invention is not limited thereto. Herein, the percentage listed together with the structural formula of the compound signifies the mass ratio of fluorine atoms (fluorine content).

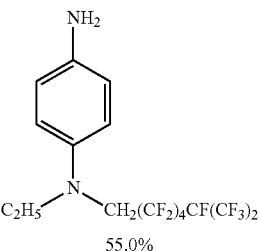

37-1

55.0%

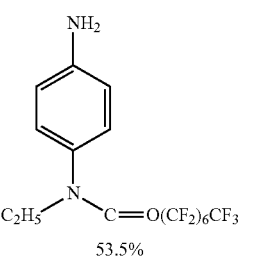

37-2

53.5%

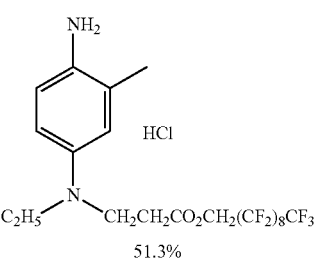

37-3

51.3%

The compound represented by Formula (38) is an example of a compound formed in a case in which in Formula (1), each of P and Q represents $NR_2R_3$; Y represents $CR_6$; n represents 1; and $R_1$ on a carbon atom adjacent to P and $R_6$ on a carbon atom adjacent to Q form a ring by being bonded to each other.

In Formula (38), $V_{38}$ represents a substituent, and b represents an integer of 0 to 4, preferably represents an integer of 1 or 2, and even more preferably represents 1. Examples of the substituent represented by $V_{38}$ include the substituents of the alkyl group represented by $R_2$ and $R_3$ in Formula (1) described above. When there is a plurality of groups represented by $V_{38}$ in Formula (38), the groups may be the same as or different from each other or may form a ring by being bonded to each other.

Each of $R_{381}$, $R_{382}$, $R_{383}$, and $R_{384}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $V_{38}$, $R_{381}$, $R_{382}$, $R_{383}$, and $R_{384}$ contains a fluorine atom. Particularly, it is preferable that in at least one of the groups represented by $V_{38}$, $R_{381}$, $R_{382}$, $R_{383}$, and $R_{384}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{38}$, $R_{381}$, $R_{382}$, $R_{383}$, and $R_{384}$ contains the $R_f$ group.

When there is a plurality of groups represented by $V_{38}$, at least one of the plurality of groups represented by $V_{38}$, $R_{381}$, $R_{382}$, $R_{383}$, and $R_{384}$ contains a fluorine atom.

Specific examples of the compound represented by Formula (38) will be shown below, but the present invention is not limited thereto. Herein, the percentage listed together with the structural formula of the compound signifies the mass ratio of fluorine atoms (fluorine content).

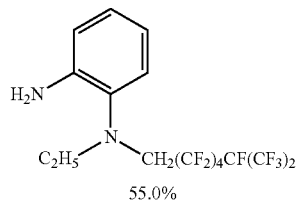

38-1

55.0%

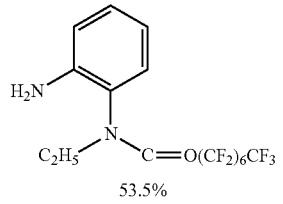

38-2

53.5%

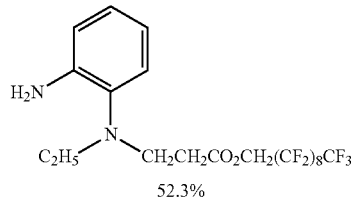

38-3

52.3%

The compound represented by Formula (39) is an example of a compound formed in a case in which in Formula (1), each of P and Q represents OH; Y represents $CR_6$; n represents 1; and $R_1$ on a carbon atom adjacent to P and $R_6$ on a carbon atom adjacent to Q form a ring by being bonded to each other.

In Formula (39), $V_{39}$ represents a substituent, and c represents an integer of 1 or 2 and preferably represents 1. At least one of the substituents represented by $V_{39}$ contains a fluorine atom. That is, when there is one substituent represented by $V_{39}$, the substituent may contain a fluorine atom, and when there are two or more substituents represented by $V_{39}$, at least one of the substituents may contain a fluorine atom. It is preferable that a fluorine atom is introduced into at least one of the groups represented by $V_{39}$ by substituting a portion of hydrogen atoms or the entirety of the hydrogen atoms in the group (preferably by substituting a portion of hydrogen atoms or the entirety of hydrogen atoms bonded to carbon atoms). Particularly, it is preferable that $V_{39}$ contains the $R_f$ group.

Examples of the substituent represented by $V_{39}$ include the substituents of the alkyl group represented by $R_2$ and $R_3$ in Formula (1) described above. When there is a plurality of groups represented by $V_{39}$ in Formula (39), the groups may be the same as or different from each other or may form a ring by being bonded to each other.

Specific examples of the compound represented by Formula (39) will be shown below, but the present invention is not limited thereto. Herein, the percentage listed together with the structural formula of the compound signifies the mass ratio of fluorine atoms (fluorine content).

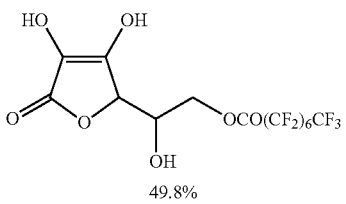

39-1

49.8%

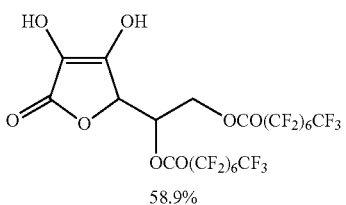

39-2

58.9%

The compound represented by Formula (40) is an example of a compound formed in a case in which in Formula (1), P represents OH; Q represents $NR_2R_3$; Y represents $CR_6$; n represents 1; and $R_1$ on a carbon atom adjacent to P and $R_6$ on a carbon atom adjacent to Q form a ring by being bonded to each other.

In Formula (40), $V_{40}$ represents a substituent, and b represents an integer of 0 to 4, preferably represents an integer of 1 or 2, and even more preferably represents 1. Examples of the substituent represented by $V_{40}$ include the substituents of the alkyl group represented by $R_2$ and $R_3$ in Formula (1) described above. When there is a plurality of groups represented by $V_{40}$ in Formula (40), the groups may be the same as or different from each other or may form a ring by being bonded to each other.

Each of $R_{401}$ and $R_{402}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $V_{40}$, $R_{401}$, and $R_{402}$ contains a fluorine atom. Particularly, it is preferable that in at least one of the groups represented by $V_{40}$, $R_{401}$, and $R_{402}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{40}$, $R_{401}$, and $R_{402}$ contains the $R_f$ group.

When there is a plurality of groups represented by $V_{40}$, at least one of the plurality of groups represented by $V_{40}$, $R_{401}$, and $R_{402}$ contains a fluorine atom.

Specific examples of the compound represented by Formula (40) will be shown below, but the present invention is not limited thereto. Herein, the percentage listed together with the structural formula of the compound signifies the mass ratio of fluorine atoms (fluorine content).

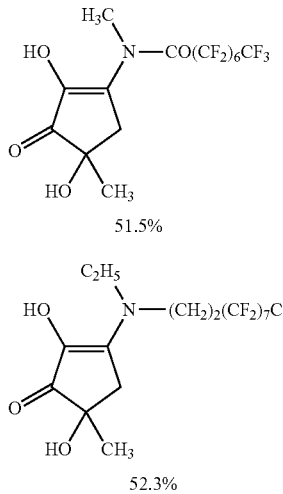

The compound represented by Formula (41) is an example of a compound formed in a case in which in Formula (1), each of P and Q represents $NR_2R_3$; n represents 0; and $R_2$ and $R_3$ form a ring by being bonded to each other.

In Formula (41), $V_{41}$ represents a substituent, and b represents an integer of 0 to 4. Examples of the substituent represented by $V_{41}$ include the substituents of the alkyl group represented by $R_2$ and $R_3$ in Formula (1) described above. When there is a plurality of groups represented by $V_{41}$ in Formula (41), the groups may be the same as or different from each other or may form a ring by being bonded to each other.

Each of $R_{411}$ and $R_{412}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $V_{41}$, $R_{411}$, and $R_{412}$ contains a fluorine atom. Particularly, it is preferable that in at least one of the groups represented by $V_{41}$, $R_{411}$, and $R_{412}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{41}$, $R_{411}$, and $R_{412}$ contains the $R_f$ group.

When there is a plurality of groups represented by $V_{41}$, at least one of the plurality of groups represented by $V_{41}$, $R_{411}$, and $R_{412}$ contains a fluorine atom.

Specific examples of the compound represented by Formula (41) will be shown below, but the present invention is not limited thereto. Herein, the percentage listed together with the structural formula of the compound signifies the mass ratio of fluorine atoms (fluorine content).

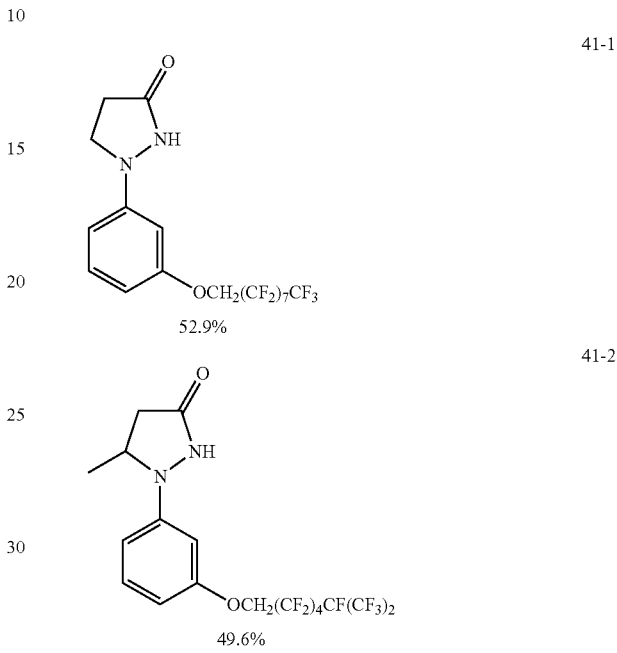

The compound represented by Formula (42) is an example of a compound formed in a case in which in Formula (1), each of P and Q represents $NR_2R_3$; n represents 0; and $R_2$ and $R_3$ form a ring by being bonded to each other.

In Formula (42), $V_{42}$ represents a substituent, and d represents 0 or 1. Examples of the substituent represented by $V_{42}$ include the substituents of the alkyl group represented by $R_2$ and $R_3$ in Formula (1) described above. When there is a plurality of groups represented by $V_{42}$ in Formula (42), the groups may be the same as or different from each other or may form a ring by being bonded to each other.

Each of $R_{421}$, $R_{422}$, and $R_{423}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $V_{42}$, $R_{421}$, $R_{422}$, and $R_{423}$ contains a fluorine atom. Particularly, it is preferable that in at least one of the groups represented by $V_{42}$, $R_{421}$, $R_{422}$, and $R_{423}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{42}$, $R_{421}$, $R_{422}$, and $R_{423}$ contains the $R_f$ group.

When there is a plurality of groups represented by $V_{42}$, at least one of the plurality of groups represented by $V_{42}$, $R_{421}$, $R_{422}$, and $R_{423}$ contains a fluorine atom.

Specific examples of the compound represented by Formula (42) will be shown below, but the present invention is not limited thereto. Herein, the percentage listed together with the structural formula of the compound signifies the mass ratio of fluorine atoms (fluorine content).

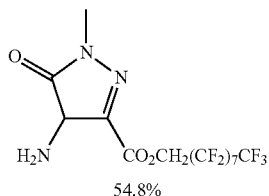

42-1

54.8%

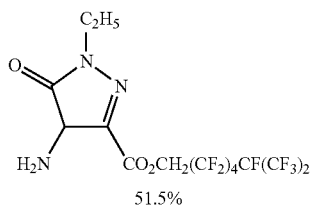

42-2

51.5%

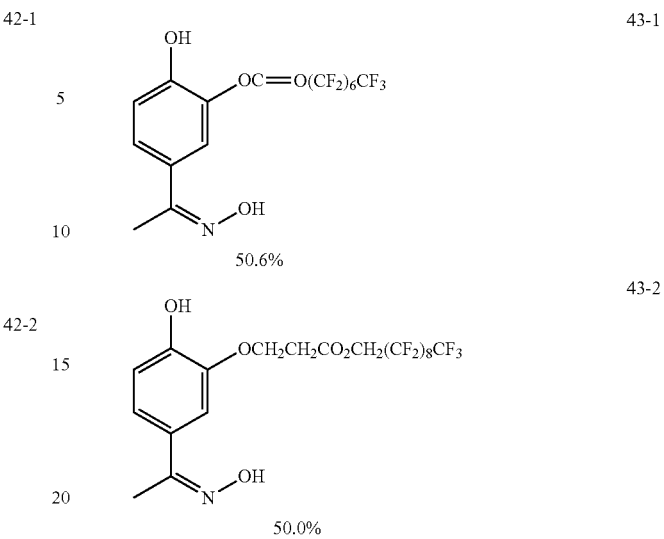

The compound represented by Formula (43) is an example of a compound formed in a case in which in Formula (1), each of P and Q represents OH; Y represents $CR_6$ or a nitrogen atom; n represents 3; and $R_1$ and $R_6$ form a ring by being bonded to each other.

In Formula (43), $V_{43}$ represents a substituent, and b represents an integer of 0 to 4, preferably represents an integer of 1 or 2, and more preferably represents 1. Examples of the substituent represented by $V_{43}$ include the substituents of the alkyl group represented by $R_2$ and $R_3$ in Formula (1) described above. When there is a plurality of groups represented by $V_{43}$ in Formula (43), the groups may be the same as or different from each other or may form a ring by being bonded to each other.

$R_{431}$ represents a hydrogen atom or a substituent. Examples of the substituent represented by $R_{431}$ include the substituents of the alkyl group represented by $R_2$ and $R_3$ described above. The substituent is preferably an alkyl group, an alkenyl group, an alkynyl group, or an aryl group. Preferred examples of each of these substituents include the groups exemplified as $R_2$ and $R_3$ described above.

When $R_{431}$ represents a substituent, the substituent may further have a substituent which includes, for example, the substituents of the alkyl group represented by $R_2$ and $R_3$ in Formula (1) described above.

At least one of $V_{43}$ and $R_{431}$ contains a fluorine atom. Particularly, it is preferable that in at least one of the groups represented by $V_{43}$ and $R_{431}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{43}$ and $R_{431}$ contains the $R_f$ group.

When there is a plurality of groups represented by $V_{43}$, at least one of the plurality of groups represented by $V_{43}$ and $R_{431}$ contains a fluorine atom.

Specific examples of the compound represented by Formula (43) will be shown below, but the present invention is not limited thereto. Herein, the percentage listed together with the structural formula of the compound signifies the mass ratio of fluorine atoms (fluorine content).

The compound represented by Formula (44) is an example of a compound formed in a case in which in Formula (1), each of P and Q represents OH; Y represents $CR_6$ or a nitrogen atom; n represents 2; and $R_1$ and $R_6$ form a ring by being bonded to each other.

In Formula (44), $V_{44}$ represents a substituent, and b represents an integer of 0 to 4, preferably represents an integer of 1 or 2, and more preferably represents 1. Examples of the substituent represented by $V_{44}$ include the substituents of the alkyl group represented by $R_2$ and $R_3$ in Formula (1) described above. When there is a plurality of groups represented by $V_{44}$ in Formula (44), the groups may be the same as or different from each other or may form a ring by being bonded to each other.

$R_{441}$ represents a hydrogen atom or a substituent. Examples of the substituent represented by $R_{441}$ include the substituents of the alkyl group represented by $R_2$ and $R_3$ described above. The substituent is preferably an alkyl group, an alkenyl group, an alkynyl group, or an aryl group. Preferred examples of each of these substituents include the groups exemplified as $R_2$ and $R_3$ described above.

When $R_{441}$ represents a substituent, the substituent may further have a substituent which includes, for example, the substituents of the alkyl group represented by $R_2$ and $R_3$ in Formula (1) described above.

At least one of $V_{44}$ and $R_{441}$ contains a fluorine atom. Particularly, it is preferable that in at least one of the groups represented by $V_{44}$ and $R_{441}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $V_{44}$ and $R_{441}$ contains the $R_f$ group.

When there is a plurality of groups represented by $V_{44}$, at least one of the plurality of groups represented by $V_{44}$ and $R_{441}$ contains a fluorine atom.

Specific examples of the compound represented by Formula (44) will be shown below, but the present invention is not limited thereto. Herein, the percentage listed together with the structural formula of the compound signifies the mass ratio of fluorine atoms (fluorine content).

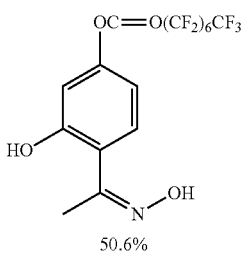

44-1

50.6%

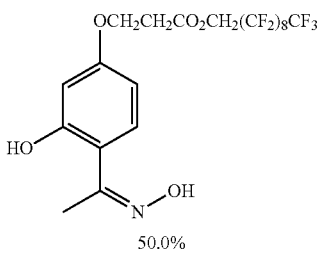

44-2

50.0%

The compound represented by Formula (45) is an example of a compound formed in a case in which in Formula (1), each of P and Q represents $NR_2R_3$, and n represents 0.

In Formula (45), each of $R_{451}$, $R_{452}$, $R_{453}$, and $R_{454}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $R_{451}$, $R_{452}$, $R_{453}$, and $R_{454}$ contains a fluorine atom. Particularly, it is preferable that in at least one of the groups represented by $R_{451}$, $R_{452}$, $R_{453}$, and $R_{454}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $R_{451}$, $R_{452}$, $R_{453}$, and $R_{454}$ contains the $R_f$ group.

Specific examples of the compound represented by Formula (45) will be shown below, but the present invention is not limited thereto. Herein, the percentage listed together with the structural formula of the compound signifies the mass ratio of fluorine atoms (fluorine content).

20-1

51.1%

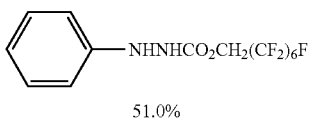

20-2

51.0%

The compound represented by Formula (46) is an example of a compound formed in a case in which in Formula (1), each P represents $NR_2R_3$; Q represents OH; and n represents 0.

In Formula (46), each of $R_{461}$ and $R_{462}$ independently represents a hydrogen atom or a group which can be substituted with a nitrogen atom. Examples of the group which can be substituted with a nitrogen atom preferably include the groups exemplified as $R_2$ and $R_3$ in Formula (1) described above.

At least one of $R_{461}$ and $R_{462}$ contains a fluorine atom. Particularly, it is preferable that in at least one of the groups represented by $R_{461}$ and $R_{462}$, a portion of hydrogen atoms or the entirety of hydrogen atoms (preferably a portion of hydrogen atoms or the entirety of hydrogen atoms bonded to carbon atoms) are substituted with a fluorine atom. It is more preferable that at least one of $R_{461}$ and $R_{462}$ contains the $R_f$ group.

Specific examples of the compound represented by Formula (46) will be shown below, but the present invention is not limited thereto. Herein, the percentage listed together with the structural formula of the compound signifies the mass ratio of fluorine atoms (fluorine content).

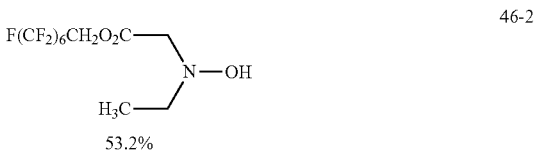

46-1

50.8%

46-2

53.2%

Examples of the most preferred embodiment of the compound represented by Formula (1) include a compound represented by the following Formula (X1). The compound represented by Formula (X1) preferably contains a fluorine atom, and the fluorine content in the compound preferably satisfies the range described above.

Conceptually, the compound represented by the following Formula (X1) corresponds to a compound subordinate to Formula (35) described above. That is, $CR_{351}R_{352}$ in Formula (35) corresponds to A-COO—$X_{11}$—$Y_{11}$ shown below.

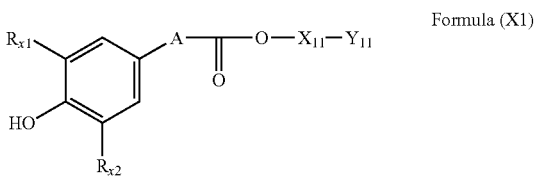

Formula (X1)

The definition, the specific examples, and the preferred embodiments of $R_{x1}$ and $R_{x2}$ are the same as those of $R_{241}$ and $R_{242}$.

A represents an alkylene group having 1 to 2 carbon atoms. A is preferably —$CH_2$— or —$CH_2CH_2$—, and more preferably —$CH_2CH_2$—.

$X_{11}$ represents an alkylene group having 1 to 3 carbon atoms that may have a hydroxyl group. $X_{11}$ is preferably —$CH_2$—, —$CH_2CH_2$—, —$CH_2CH(CH_3)$—, —$CH_2CH_2CH_2$—, —$CH_2CH(OH)CH_2$—, or —$CH_2CH(CH_2OH)$—, more preferably —$CH_2$—, —$CH_2CH_2$—, —$CH_2CH(OH)CH_2$—, or —$CH_2CH_2CH_2$—, and particularly preferably —$CH_2$— or —$CH_2CH_2$—.

$Y_{11}$ represents a linear perfluoroalkyl group having 4 to 12 carbon atoms. Preferred examples of the perfluoroalkyl group include $C_4F_9$—, $C_5F_{11}$—, $C_6F_{13}$—, $C_7F_{15}$—, $C_8F_{17}$—, $C_9F_{19}$—, $C_{10}F_{21}$—, and $C_{12}F_{25}$—. If the number of carbon atoms is within the range described above, the migration inhibition ability is further improved.

$R_{x1}$, $R_{x2}$, A, and $X_{11}$ may further have the substituent described above. Specific examples and preferred embodiments of the substituent are the same as those of the substituents of the alkyl group represented by $R_2$ and $R_3$ described above.

(Compound Represented by Formula (2))

Next, a compound represented by Formula (2) will be described.

$$R_7\text{—C}(=O)\text{—H} \qquad \text{Formula (2)}$$

In the present invention, the compound represented by Formula (2) also contains a compound (aldose or the like), which exhibits reducing properties due to the equilibrium established between an aldehyde group and a hemiacetal group, or a compound (fructose or the like) which can form an aldehyde group through the aldose-ketose isomerization that results from a Lobry de Bruyn-Van Ekenstein transformation reaction.

In Formula (2), $R_7$ represents an alkyl group, an alkenyl group, an alkynyl group, an aryl group, a heterocyclic group, or a group obtained by combining these groups.

When $R_7$ represents an alkyl group, an alkenyl group, an alkynyl group, or an aryl group, preferred examples of each of these groups include the groups exemplified as $R_2$ and $R_3$ described above. The alkyl group, the alkenyl group, and the alkynyl group may contain a linking group such as —CO—, —NH—, —O—, —S—, or a group obtained by combining these.

When $R_7$ represents a heterocyclic group, the heterocyclic group is preferably a monovalent group which is formed as a result of removing one hydrogen atom from a 5-membered or 6-membered substituted or unsubstituted aromatic or non-aromatic heterocyclic compound. The heterocyclic group is more preferably a 5-membered or 6-membered aromatic or non-aromatic heterocyclic group having 3 to 30 carbon atoms. Preferred examples of such a heterocyclic group include 2-furanyl, 2-thienyl, 2-pyrimidinyl, 2-benzothiazolyl, 2-benzoxazolyl, 2-imidazolyl, 4-imidazolyl, triazolyl, benzotriazolyl, thiadiazolyl, pyrrolidinyl, piperidinyl, imidazolidinyl, pyrazolidinyl, morpholinyl, tetrahydrofuranyl, tetrahydrothienyl, and the like.

$R_7$ is more preferably an alkyl group, an alkenyl group, an alkynyl group, or an aryl group, and particularly preferably an alkyl group or an aryl group.

The alkyl group, the alkenyl group, the alkynyl group, the aryl group, or the heterocyclic group represented by $R_7$ may further have a substituent. Examples of the substituent include the substituents of the alkyl group represented by $R_2$ and $R_3$ in Formula (1) described above.

In the group represented by $R_7$, a portion of hydrogen atoms or the entirety of hydrogen atoms (preferably a portion of hydrogen atoms or the entirety of hydrogen atoms bonded to carbon atoms) are substituted with a fluorine atom. Particularly, it is preferable that $R_7$ contains the $R_f$ group. Herein, it is preferable that the fluorine content in the compound represented by Formula (2) satisfies the range described above.

The group represented by $R_7$ may contain a hydroxyl group or a group represented by —COO—.

As one of the preferred embodiments of $R_7$, an aryl group containing a fluorine atom is exemplified.

Specific examples of the compound represented by Formula (2) will be shown below, but the present invention is not limited thereto. Herein, the percentage listed together with the structural formula of the compound signifies the mass ratio of fluorine atoms (fluorine content).

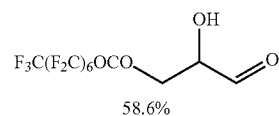

58.6%

2-1

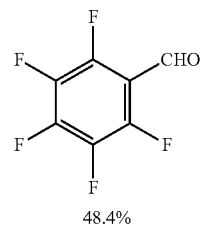

48.4%

2-2

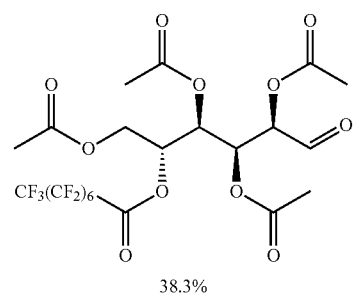

38.3%

2-3

(Compound Represented by Formula (3))

Next, a compound represented by Formula (3) will be described.

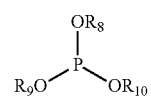

Formula (3)

In Formula (3), each of $R_8$, $R_9$, and $R_{10}$ independently represents an alkyl group, an alkenyl group, an alkynyl group, an aryl group, a heterocyclic group, or a group obtained by combining these groups.

Preferred examples of the alkyl group, the alkenyl group, the alkynyl group, the aryl group, and the heterocyclic group include the groups exemplified as $R_2$ and $R_3$ in Formula (1) described above. The alkyl group, the alkenyl group, and the alkynyl group may contain a linking group such as —CO—, —NH—, —O—, —S—, or a group obtained by combining these.

The groups represented by $R_8$, $R_9$, and $R_{10}$ may further have a substituent. Examples of the substituent include the substituents of the alkyl group represented by $R_2$ and $R_3$ in Formula (1) described above.

In at least one of the groups represented by $R_8$ to $R_{10}$, a portion of hydrogen atoms or the entirety of hydrogen atoms (preferably a portion of hydrogen atoms or the entirety of hydrogen atoms bonded to carbon atoms) are substituted with a fluorine atom. Particularly, it is preferable that at least one of the groups represented by $R_8$ to $R_{10}$ contains the $R_f$ group. As one of the preferred embodiments of $R_8$ to $R_{10}$, an aryl group substituted with the $R_f$ group is exemplified. The number of the $R_f$ group substituting the aryl group is not particularly limited. However, the number of the $R_f$ group is preferably 1 to 4, and more preferably 1 to 2.

It is preferable that the fluorine content in the compound represented by Formula (3) satisfies the range described above.

Specific examples of the compound represented by Formula (3) will be shown below, but the present invention is not limited thereto. Herein, the percentage listed together with the structural formula of the compound signifies the mass ratio of fluorine atoms (fluorine content).

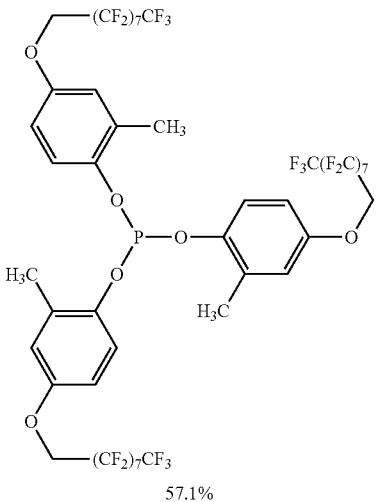

3-1

57.1%

(Compound Represented by Formula (4))

Next, a compound represented by Formula (4) will be described.

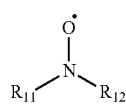

Formula (4)

In Formula (4), each of $R_{11}$ and $R_{12}$ independently represents an alkyl group, an alkenyl group, an alkynyl group, an aryl group, a heterocyclic group, or a group obtained by combining these groups. Preferred examples of the alkyl group, the alkenyl group, the alkynyl group, the aryl group, and the heterocyclic group include the groups exemplified as $R_2$ and $R_3$ in Formula (1) described above. The alkyl group, the alkenyl group, and the alkynyl group may contain a linking group such as —CO—, —NH—, —O—, —S—, or a group obtained by combining these.

The group represented by $R_{11}$ and $R_{12}$ may further have a substituent. Examples of the substituent include the substituents of the alkyl group represented by $R_2$ and $R_3$ in Formula (1) described above.

$R_{11}$ and $R_{12}$ may form a ring by being bonded to each other, and the formed ring may contain a substituent. Examples of the substituent include the substituents of the alkyl group represented by $R_2$ and $R_3$ in Formula (1) described above.

In at least one of the groups represented by $R_{11}$ and $R_{12}$, a portion of hydrogen atoms or the entirety of hydrogen atoms (preferably a portion of hydrogen atoms or the entirety of hydrogen atoms bonded to carbon atoms) are substituted with a fluorine atom. Particularly, it is preferable that at least one of the groups represented by $R_{11}$ and $R_{12}$ contains the $R_f$ group. Herein, it is preferable that the fluorine content in the compound represented by Formula (4) satisfies the range described above.

As one of the preferred embodiments of the compound represented by Formula (4), a compound represented by the following Formula (4A) is exemplified.

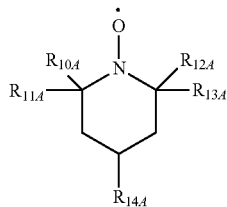

Formula (4A)

Each of $R_{10A}$ to $R_{13A}$ independently represents an alkyl group.

$R_{14A}$ represents a substituent containing a fluorine atom. Examples of the substituent include the substituents of the alkyl group represented by $R_2$ and $R_3$ in Formula (1) described above. The group represented by $R_{14A}$ may further have a substituent. Examples of the substituent include the substituents of the alkyl group represented by $R_2$ and $R_3$ in Formula (1) described above.

$R_{14A}$ contains a fluorine atom. Particularly, it is preferable that a portion of hydrogen atoms or the entirety of hydrogen atoms in $R_{14A}$ (preferably a portion of hydrogen atoms or the entirety of hydrogen atoms bonded to carbon atoms) are substituted with a fluorine atom. It is more preferable that $R_{14A}$ contain the $R_f$ group. $R_{14A}$ is more preferably the $R_f$ group which may contain —CO—, —NH—, —O—, —S—, or a group obtained by combining these. Herein, it is preferable that the fluorine content in the compound represented by Formula (4A) satisfies the range described above.

Specific examples of the compound represented by Formula (4) will be shown below, but the present invention is not limited thereto. Herein, the percentage listed together with the structural formula of the compound signifies the mass ratio of fluorine atoms (fluorine content).

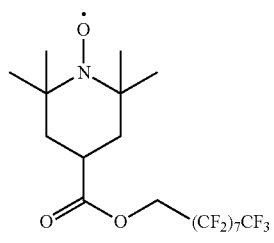

4-1

51.1%

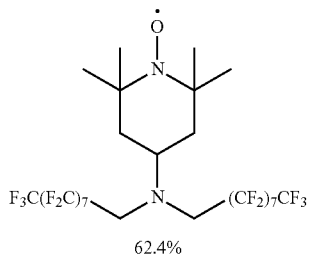

4-2

62.4%

(Compound Represented by Formula (5))

Next, a compound represented by Formula (5) will be described.

$$Z-SH \quad \text{Formula (5)}$$

In Formula (5), Z represents an alkyl group, an alkenyl group, an alkynyl group, an aryl group, a heterocyclic group, or a group obtained by combining these groups. Preferred examples of the alkyl group, the alkenyl group, the alkynyl group, the aryl group, and the heterocyclic group include the groups exemplified as $R_2$ and $R_3$ in Formula (1) described above.

The group represented by Z may further have a substituent. Examples of the substituent include the substituents of the alkyl group represented by $R_2$ and $R_3$ in Formula (1) described above.

In the group represented by Z, a portion of hydrogen atoms or the entirety of hydrogen atoms (preferably a portion of hydrogen atoms or the entirety of hydrogen atoms bonded to carbon atoms) are substituted with a fluorine atom. Particularly, it is preferable that Z contains the $R_f$ group. Herein, it is preferable that the fluorine content in the compound represented by Formula (5) satisfies the range described above.

The compound represented by Formula (5) is preferably a compound represented by any of Formulae (51) to (54).

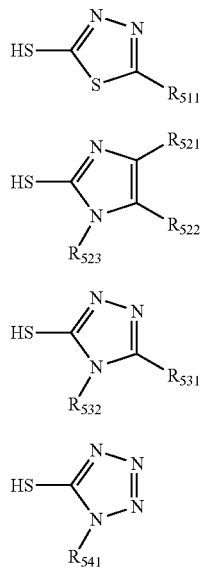

In Formula (51), $R_{511}$ represents a substituent containing a fluorine atom.

Examples of the substituent include the substituents of the alkyl group represented by $R_2$ and $R_3$ in Formula (1) described above. The group represented by $R_{511}$ may further have a substituent. Examples of the substituent include the substituents of the alkyl group represented by $R_2$ and $R_3$ in Formula (1) described above.

$R_{511}$ contains a fluorine atom. Particularly, it is preferable that a portion of hydrogen atoms or the entirety of hydrogen atoms in $R_{511}$ (preferably a portion of hydrogen atoms or the entirety of hydrogen atoms bonded to carbon atoms) are substituted with a fluorine atom. It is more preferable that $R_{511}$ contains the $R_f$ group. Herein, it is preferable that the fluorine content in the compound represented by Formula (51) satisfies the range described above.

Specific examples of the compound represented by Formula (51) will be shown below, but the present invention is not limited thereto. Herein, the percentage listed together with the structural formula of the compound signifies the mass ratio of fluorine atoms (fluorine content).

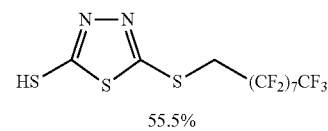

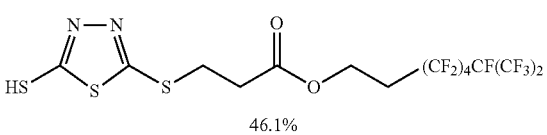

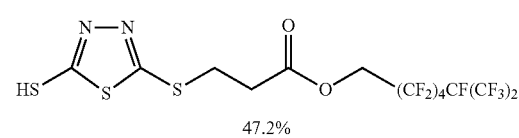

In Formula (52), each of $R_{521}$ and $R_{522}$ independently represents a hydrogen atom or a substituent. $R_{523}$ represents a hydrogen atom or a group which can be substituted with a nitrogen atom. Examples of the group which can be substituted with a nitrogen atom preferably include the groups exemplified as $R_2$ and $R_3$ in Formula (1) described above. Furthermore, examples of the substituent include the substituents of the alkyl group represented by $R_2$ and $R_3$ in Formula (1) described above. $R_{521}$, $R_{522}$, and $R_{523}$ may be the same as or different from each other, or may form a ring by being bonded to each other.

At least one of the groups represented by $R_{521}$, $R_{522}$, and $R_{523}$ contains a fluorine atom. Particularly, it is preferable that in at least one of the groups represented by $R_{521}$, $R_{522}$, and $R_{523}$, a portion of hydrogen atoms or the entirety of hydrogen atoms (preferably a portion of hydrogen atoms or the entirety of hydrogen atoms bonded to carbon atoms) are preferably substituted with a fluorine atom. Furthermore, it is preferable that at least one of the groups represented by $R_{521}$, $R_{522}$, and $R_{523}$ contains the $R_f$ group. Herein, it is preferable that the fluorine content in the compound represented by Formula (52) satisfies the range described above.

Specific examples of the compound represented by Formula (52) will be shown below, but the present invention is not limited thereto.

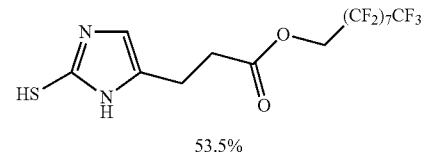

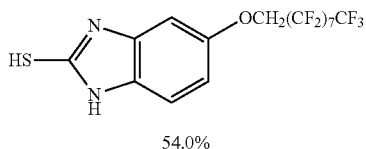

52-2

54.0%

In Formula (53), $R_{531}$ represents a hydrogen atom or a substituent. $R_{532}$ represents a hydrogen atom or a group which can be substituted with a nitrogen atom. Examples of the group which can be substituted with a nitrogen atom preferably include the groups exemplified as $R_2$ and $R_3$ in Formula (1) described above. Furthermore, examples of the substituent include the substituents of the alkyl group represented by $R_2$ and $R_3$ in Formula (1) described above. $R_{531}$ and $R_{532}$ may be the same as or different from each other, or may form a ring by being bonded to each other.

At least one of the groups represented by $R_{531}$ and $R_{532}$ contains a fluorine atom. Particularly, in at least one of the groups represented by $R_{531}$ and $R_{532}$, a portion of hydrogen atoms or the entirety of the hydrogen atoms (preferably a portion of hydrogen atom or the entirety of hydrogen atoms bonded to carbon atoms) are preferably substituted with a fluorine atom. It is preferable that at least one of the groups represented by $R_{531}$ and $R_{532}$ contains the $R_f$ group. Furthermore, it is preferable that the fluorine content in the compound represented by Formula (53) satisfies the range described above.

Specific examples of the compound represented by Formula (53) will be shown below, but the present invention is not limited thereto. Herein, the percentage listed together with the structural formula of the compound signifies the mass ratio of fluorine atoms (fluorine content).

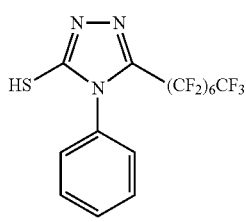

53-1

52.3%

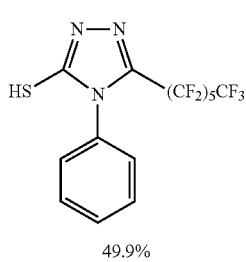

53-2

49.9%

In Formula (54), $R_{541}$ represents a fluorine atom-containing group which can be substituted with a nitrogen atom. Examples of the group which can be substituted with a nitrogen atom preferably include the groups exemplified as $R_2$ and $R_3$ in Formula (1) described above.

$R_{541}$ contains a fluorine atom. Particularly, it is preferable that a portion of hydrogen atoms or the entirety of hydrogen atoms in $R_{541}$ (preferably a portion of hydrogen atoms or the entirety of hydrogen atoms bonded to carbon atoms) are substituted with a fluorine atom. It is more preferable that $R_{541}$ contains the $R_f$ group. Herein, it is preferable that the fluorine content in the compound represented by Formula (54) satisfies the range described above.

Specific examples of the compound represented by Formula (54) will be shown below, but the present invention is not limited thereto. Herein, the percentage listed together with the structural formula of the compound signifies the mass ratio of fluorine atoms (fluorine content).

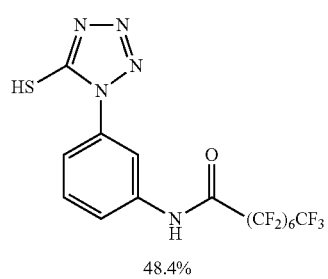

54-1

48.4%

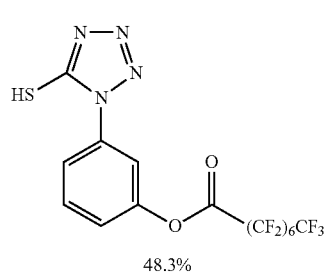

54-2

48.3%

As the most preferred embodiment of the compound represented by Formula (5), a compound represented by the following Formula (Y) is exemplified.

Formula (Y)

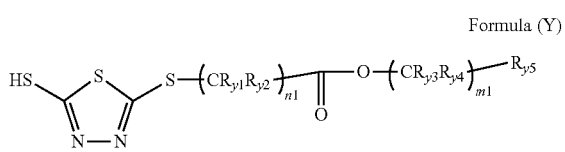

In Formula (Y), each of $R_{y1}$ and $R_{y2}$ independently represents a hydrogen atom or an alkyl group. n1 represents 1 or 2, and preferably represents 2. When n1 is 2, the structures of a plurality of units represented by $CR_{y1}R_{y2}$ may be the same as or different from each other.

When each of $R_{y1}$ and $R_{y2}$ represents an alkyl group, the alkyl group preferably has 1 to 30 carbon atoms, more preferably has 1 to 15 carbon atoms, and particularly preferably has 1 to 6 carbon atoms. Examples of such an alkyl group preferably include methyl, ethyl, n-propyl, isopropyl, t-butyl, n-octyl, eicosyl, chloromethyl, hydroxymethyl, aminoethyl, N,N-dimethylaminomethyl, 2-chloroethyl, 2-cyanoethyl, 2-hydroxyethyl, 2-(N,N-dimethylamino)ethyl, 2-ethylhexyl, and the like.

The structure represented by $(CR_{y1}R_{y2})_{n1}$ is preferably —$CH_2$—, —$CH_2CH_2$—, or —$CH_2CH(CH_3)$—, more preferably —$CH_2CH_2$— or —$CH_2CH(CH_3)$—, and particularly preferably —$CH_2CH_2$—.

Each of $R_{y3}$ and $R_{y4}$ independently represents a hydrogen atom or a substituent. Specific examples and preferred embodiments of the substituent are the same as those of the substituents of the alkyl group represented by $R_2$ and $R_3$ described above. m1 represents an integer of 1 to 6. When m1 is equal to or greater than 2, the structures of a plurality of units represented by $CR_{y3}R_{y4}$ may be the same as or different from each other. Furthermore, $R_{y3}$ and $R_{y4}$ may form a ring by being bonded to each other.

The structure represented by $(CR_{y3}R_{y4})_{m1}$ is preferably —CH$_2$—, —CH$_2$CH$_2$—, —CH$_2$CH(CH$_3$)—, —CH$_2$CH$_2$CH$_2$—, —CH$_2$CH(OH)CH$_2$—, or —CH$_2$CH(CH$_2$OH)—, more preferably —CH$_2$—, —CH$_2$CH$_2$—, —CH$_2$CH(OH)CH$_2$—, or —CH$_2$CH$_2$CH$_2$—, and particularly preferably —CH$_2$— or —CH$_2$CH$_2$—.

$R_{y5}$ represents a perfluorolalkyl group having 1 to 20 carbon atoms. The perfluoroalkyl group may be linear or branched.

Examples of the linear or branched perfluoroalkyl group having 1 to 14 carbon atoms include CF$_3$—, C$_2$F$_5$—, C$_3$F$_7$—, C$_4$F$_9$—, C$_5$F$_{11}$—, C$_6$F$_{13}$—, C$_7$F$_{15}$—, C$_8$F$_{17}$—, C$_9$F$_{19}$—, C$_{10}$F$_{21}$—, C$_{12}$F$_{25}$—, C$_{14}$F$_{29}$—, and the like.

A compound represented by Formula (6) will be described. Herein, it is preferable that the compound represented by Formula (6) contains fluorine atoms such that the aforementioned fluorine content is satisfied.

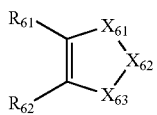

Formula (6)

In Formula (6), each of $X_{61}$, $X_{62}$, and $X_{63}$ independently represents —NH—, —N=, =N—, —CR$_x$=, =CR$_x$—, or —S—. $R_x$ represents a hydrogen atom, —NH$_2$, or a linear or branched alkyl group having 1 to 15 carbon atoms. In the alkyl group, one carbon atom or two or more carbon atoms which are not adjacent to each other may be substituted with —O—, —S—, —NR$_0$—, —CO—, —CO—O—, —O—CO—, —O—CO—O—, —CR$_0$=CR$_{00}$—, or —C≡C—. Furthermore, one or more hydrogen atoms in the alkyl group may be substituted with a fluorine atom, a chlorine atom, a bromine atom, an iodine atom, or —CN. Each of $R_0$ and $R_{00}$ independently represents a hydrogen atom or a carbyl or hydrocarbyl group which may have a substituent and one or more heteroatoms. Specific examples and preferred embodiments of the substituent are the same as those of the substituents of the alkyl group represented by $R_2$ and $R_3$ described above. The heteroatom is not particularly limited, and examples thereof include an oxygen atom, a nitrogen atom, a sulfur atom, a phosphorus atom, and the like. At least one of $X_{61}$, $X_{62}$, and $X_{63}$ is not —CR$_x$= or =CR$_x$—.

Each of $R_{61}$ and $R_{62}$ independently represents a fluorine atom, a chlorine atom, -Sp-P, a linear or branched alkyl group having 1 to 15 carbon atoms, or an aryl group, a heteroaryl group, an aryloxy group, a heteroaryloxy group, an arylcarbonyl group, a heteroarylcarbonyl group, an arylcarbonyloxy group, a heteroarylcarbonyloxy group, an aryloxycarbonyl group, or a heteroaryloxycarbonyl group which has 2 to 30 carbon atoms and may have a substituent (specific examples and preferred embodiments of the substituent are the same as those of the substituents of the alkyl group represented by $R_2$ and $R_3$ described above). In the alkyl group, one carbon atom or two or more carbon atoms which are not adjacent to each other may be substituted with —O—, —S—, —NR$_0$—, —CO—, —CO—O—, —O—CO—, —O—CO—O—, —CR$_0$=CR$_{00}$—, or —C≡C—. Furthermore, one or more hydrogen atoms in the alkyl group may be substituted with a fluorine atom, a chlorine atom, a bromine atom, an iodine atom, or —CN. Each of $R_0$ and $R_{00}$ independently represents a hydrogen atom or a carbyl or hydrocarbyl group which may have a substituent and one or more heteroatoms. Specific examples and preferred embodiments of the substituent are the same as those of the substituents of the alkyl group represented by $R_2$ and $R_3$ described above. Sp represents a single bond or a divalent organic group. Specific examples and preferred embodiments of the divalent organic group are the same as those of $L_A$ described above. P represents a polymerizable group or a cross-linking group. Specific examples of the polymerizable group and the cross-linking group include a methacryloyl group, an acryloyl group, an itaconic acid ester group, a crotonic acid ester group, an isocrotonic acid ester group, a maleic acid ester group, a styryl group, a vinyl group, an acrylamide group, a methacrylamide group, and the like. $R_{61}$ and $R_{62}$ may form an aromatic ring or an aromatic heterocyclic ring having 5 to 7 ring atoms by being bonded to each other. The aromatic ring or the aromatic heterocyclic ring may have 1 to 6 substituents. Specific examples and preferred embodiments of the substituents are the same as those of the substituents of the alkyl group represented by $R_2$ and $R_3$ described above.

The "carbyl group" refers to any monovalent or polyvalent organic group portion (for example, —C≡C—) not containing a non-carbon atom or refers to any monovalent or polyvalent organic group portion (for example, carbonyl) containing at least one carbon atom optionally bonded to at least one of the non-carbon atoms including N, O, S, P, Si, Se, As, Te, and Ge. The "hydrocarbyl group" refers to a carbyl group which additionally contains one or more H atoms and optionally contains any one or more heteroatoms including N, O, S, P, Si, Se, As, Te, and Ge.

In the groups represented by $R_{61}$, $R_{62}$, $X_{61}$, $X_{62}$, and $X_{63}$, a portion of hydrogen atoms or the entirety of hydrogen atoms (preferably a portion of hydrogen atoms or the entirety of hydrogen atoms bonded to carbon atoms) are substituted with a fluorine atom. Herein, it is preferable that the fluorine content in the compound represented by Formula (6) satisfies the range described above.

The compound represented by Formula (6) is preferably a compound represented by the following Formula (22). Herein, the compound represented by Formula (22) preferably contains a fluorine atom, and the fluorine content in the compound preferably satisfies the range described above.

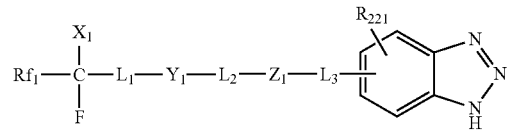

Formula (22)

The definition, the specific examples, and the preferred embodiment of each of $Rf_1$, $X_1$, $L_1$, $L_2$, $L_3$, $Y_1$, and $Z_1$ in Formula (22) are the same as those of each of $Rf_1$, $X_1$, $L_1$, $L_2$, $L_3$, $Y_1$, and $Z_1$ in Formula (24) described above.

$R_{221}$ represents a hydrogen atom, a linear or branched alkyl group having 1 to 8 carbon atoms, or $Rf_1$—CFX$_1$-L$_1$-Y$_1$-L$_2$-Z$_1$-L$_3$-.

Here, when both of $Y_1$ and $Z_1$ represent a group other than a single bond, $L_2$ represents an alkylene group having 1 to 6 carbon atoms that may be substituted with a fluorine atom.

Specific examples of the compound represented by Formula (22) will be shown below, but the present invention is not limited thereto.

1-1

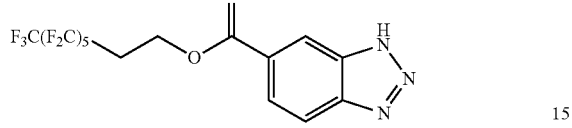
1-2

1-3

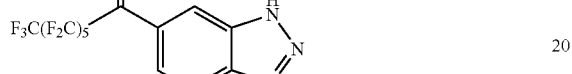
1-4

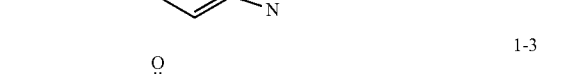
1-5

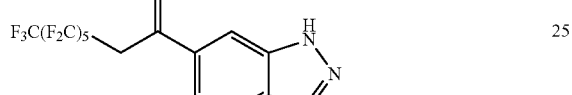
1-6

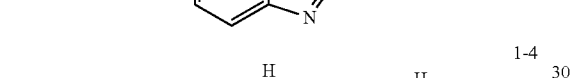
1-7

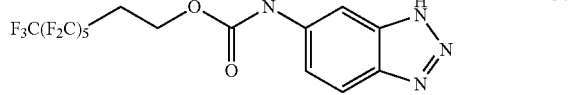
1-8

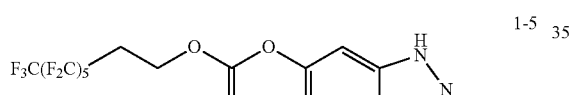
1-9

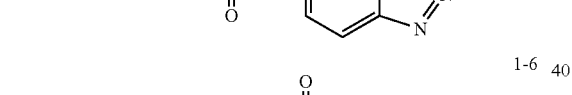
1-10

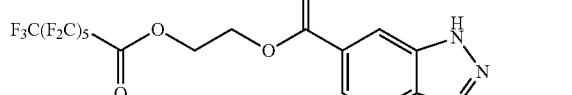
1-11

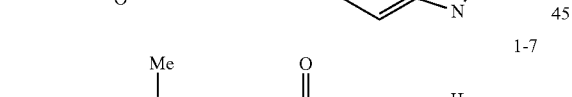
1-12

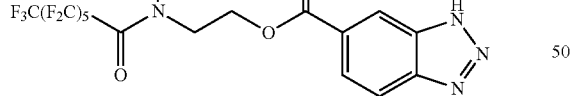
1-13

1-14

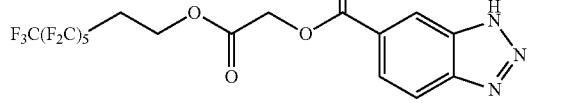
1-15

1-16

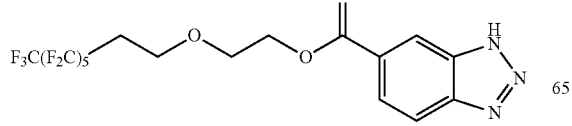
1-17

(Compound Represented by Formula (7))

Next, a compound represented by Formula (7) will be described.

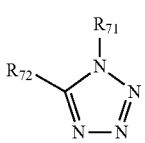

Formula (7)

In Formula (7), each of $R_{71}$ and $R_{72}$ independently represents a hydrogen atom, an alkyl group, an alkenyl group, an alkynyl group, an aryl group, a heterocyclic group, or a group obtained by combining these groups. Particularly, $R_{71}$ is preferably a hydrogen atom, and $R_{72}$ is preferably an alkyl group or an aryl group. Preferred examples of the alkyl group, the alkenyl group, the alkynyl group, the aryl group, and the heterocyclic group include the groups exemplified as $R_2$ and $R_3$ in Formula (1) described above. Herein, the alkyl group, the alkenyl group, or the alkynyl group may contain a linking group such as —CO—, —NH—, —O—, —S—, or a group obtained by combining these.

In at least one of the groups represented by $R_{71}$ and $R_{72}$, a portion of hydrogen atoms or the entirety of hydrogen atoms are substituted with a fluorine atom. Herein, it is preferable that the fluorine content in the compound represented by Formula (7) satisfies the range described above.

As a preferred embodiment of the compound represented by Formula (7), a compound represented by Formula (7A) is exemplified.

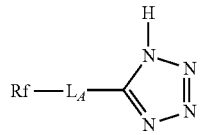

Formula (7A)

$L_A$ represents a single bond or a divalent organic group. Examples of the divalent organic group include a linear, branched, or cyclic divalent aliphatic hydrocarbon group (for example, an alkylene group such as a methylene group, an ethylene group, or a propylene group), a linear, branched, or cyclic divalent aromatic hydrocarbon group (for example, a phenylene group), —O—, —S—, —SO$_2$—, —NR$_{222}$—, —CO—, —NH—, —COO—, —CONR$_{222}$—, —O—CO—O—, —SO$_3$—, —NHCOO—, —SO$_2$NR$_{222}$—, —NH—CO—NH—, a group obtained by combining a plurality of these (for example, an alkyleneoxy group, an alkyleneoxycarbonyl group, or an alkylenecarbonyloxy group), and the like. $R_{222}$ represents a hydrogen atom or an alkyl group having 1 to 5 carbon atoms.

The $R_f$ group represents a fluoroalkyl group (preferably a perfluoroalkyl group), and the definition and preferred range of the $R_f$ group are as described above.

(Compound Represented by Formula (8))

Next, a compound represented by Formula (8) will be described. Herein, it is preferable that the compound represented by Formula (8) contains fluorine atoms such that the aforementioned fluorine content is satisfied.

Z1—S—S—Z2     Formula (8)

In Formula (8), each of Z1 and Z2 independently represents an alkyl group, an alkenyl group, an alkynyl group, an aryl group, a heterocyclic group, or a group obtained by combining these groups. Among these, an aryl group and a heterocyclic group are preferable. Preferred examples of the alkyl group, the alkenyl group, the alkynyl group, the aryl group, and the heterocyclic group include the groups exemplified as $R_2$ and $R_3$ in Formula (1) described above. Herein, the alkyl group, the alkenyl group, or the alkynyl group may contain a linking group such as —CO—, —NH—, —O—, —S—, or a group obtained by combining these.

Z1 and Z2 may contain a substituent. Specific examples and preferred embodiments of the substituent are the same as those of the substituents of the alkyl group represented by $R_2$ and $R_3$ described above.

In at least one of the groups represented by Z1 and Z2, a portion of hydrogen atoms or the entirety of hydrogen atoms are substituted with a fluorine atom. Herein, it is preferable that the fluorine content of the compound represented by Formula (8) satisfies the range described above.

The alkyl group, the alkenyl group, the alkynyl group, and the aryl group may contain a heteroatom (for example, an oxygen atom or a sulfur atom).

The compound represented by Formula (8) is preferably a compound represented by the following Formula (23). Herein, the compound represented by Formula (23) preferably contains fluorine atoms, and the fluorine content in the compound preferably satisfies the range described above.

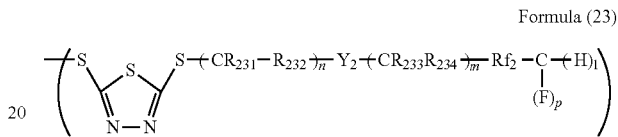

Formula (23)

In Formula (23), each of $R_{231}$ and $R_{232}$ independently represents a hydrogen atom or an alkyl group. When each of $R_{231}$ and $R_{232}$ represents an alkyl group, the alkyl group preferably has 1 to 30 carbon atoms, more preferably has 1 to 15 carbon atoms, and particularly preferably has 1 to 6 carbon atoms. Examples of such an alkyl group preferably include methyl, ethyl, n-propyl, isopropyl, t-butyl, n-octyl, eicosyl, chloromethyl, hydroxymethyl, aminoethyl, N,N-dimethylaminomethyl, 2-chloroethyl, 2-cyanoethyl, 2-hydroxyethyl, 2-(N,N-dimethylamino)ethyl, 2-ethylhexyl, and the like.

The structure represented by $(CR_{231}R_{232})_n$ is preferably —CH$_2$—, —CH$_2$CH$_2$—, or —CH$_2$CH(CH$_3$)—, more preferably —CH$_2$CH$_2$— or —CH$_2$CH(CH$_3$)—, and particularly preferably —CH$_2$CH$_2$—.

Each of $R_{233}$ and $R_{234}$ independently represents a hydrogen atom or a substituent. Examples of the substituent include the substituents of the alkyl group represented by $R_2$ and $R_3$ described above.

The structure represented by $(CR_{233}R_{234})_m$ is preferably —CH$_2$—, —CH$_2$CH$_2$—, —CH$_2$CH(CH$_3$)—, —CH$_2$CH$_2$CH$_2$—, —CH$_2$CH(OH)CH$_2$—, or —CH$_2$CH(CH$_2$OH)—, more preferably —CH$_2$—, —CH$_2$CH$_2$—, —CH$_2$CH(OH)CH$_2$—, or —CH$_2$CH$_2$CH$_2$—, and particularly preferably —CH$_2$— or —CH$_2$CH$_2$—.

$Y_2$ represents a single bond, —CO—, or —COO—.

When $Y_2$ represents a single bond or —CO—, n represents 0, and m represents an integer of 0 to 6. Particularly, m preferably represents 0 to 4 and more preferably represents 1 to 2.

When $Y_2$ represents —COO—, n represents 1 or 2 and preferably represents 2. m represents an integer of 1 to 6, preferably represents 1 to 4, and more preferably represents 1 to 2.

$Rf_2$ represents a linear or branched perfluoroalkylene group having 1 to 20 carbon atoms or a linear or branched perfluoroether group having 1 to 20 carbon atoms.

The perfluoroalkylene group has 1 to 20 carbon atoms, preferably has 2 to 15 carbon atoms, and even more preferably has 3 to 12 carbon atoms. Specific examples of the perfluoroalkylene group include —C$_4$F$_8$—, —C$_5$F$_{10}$—, —C$_6$F$_{12}$—, —C$_7$F$_{14}$—, —C$_8$F$_{16}$—, —C$_9$F$_{18}$—, —C$_{10}$F$_{20}$—, —C$_{12}$F$_{24}$—, and the like.

The perfluoroether group means a group formed as a result of inserting an ethereal oxygen atom (—O—) between carbon-carbon atoms at one or more sites in the aforementioned perfluoroalkylene group or inserting an ethereal oxygen atom into the binding terminal of the perfluoroalkylene group. The perfluoroether group has 1 to 20 carbon atoms, preferably has 2 to 15 carbon atoms, and more preferably has 3 to 12 carbon atoms. Specific examples of the perfluoroether group include a perfluoroether group represented by $-(C_gF_{2g}O)_h-$ (in the formula, each g independently represents an integer of 1 to 20; h represents an integer of equal to or greater than 1; and g and h satisfy a relationship of $g \times h \leq 20$).

p represents an integer of 2 to 3; l represents an integer of 0 to 1; and p and l satisfy a relationship of $p+l=3$. Particularly, p is preferably 3, and l is preferably 0.

Specific examples of the compound represented by Formula (23) will be shown below, but the present invention is not limited thereto.

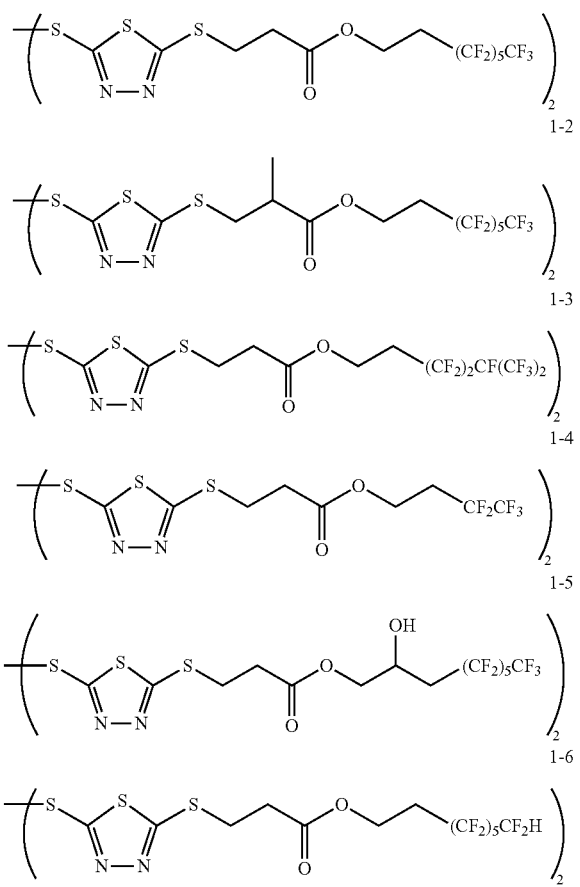

(Polymer Compound (X))

The polymer compound (X) is a polymer compound containing a repeating unit represented by the following Formula (A). The polymer compound (X) has a specific group (A in Formula (A)), which has a migration inhibition ability, on a side chain.

The polymer compound (X) may contain a repeating unit other than the repeating unit represented by Formula (A). The proportion of the repeating unit represented by Formula (A) in the polymer compound (X) is preferably equal to or greater than 5% by mass, more preferably equal to or greater than 10% by mass, even more preferably equal to or greater than 20% by mass, still more preferably equal to or greater than 30% by mass, and most preferably equal to or greater than 50% by mass.

A plurality of repeating units represented by Formula (A) that is contained in the polymer compound (X) may be the same as or different from each other.

Formula (A)

In Formula (A), $R_A$ represents a hydrogen atom or an alkyl group having 1 to 4 carbon atoms that may have a substituent. Among these, a hydrogen atom or a methyl group is preferable.

$L_A$ represents a single bond or a divalent organic group. Examples of the divalent organic group include a linear, branched, or cyclic divalent aliphatic hydrocarbon group (for example, an alkylene group such as a methylene group, an ethylene group, or a propylene group), a linear, branched, or cyclic divalent aromatic hydrocarbon group (for example, a phenylene group), $-O-$, $-S-$, $-SO_2-$, $-NR_{222}-$, $-CO-$, $-NH-$, $-COO-$, $-CONR_{222}-$, $-O-CO-O-$, $-SO_3-$, $-NHCOO-$, $-SO_2NR_{222}-$, $-NH-CO-NH-$, a group obtained by combining a plurality of these (for example, an alkyleneoxy group, an alkyleneoxycarbonyl group, or an alkylenecarbonyloxy group), and the like. $R_{222}$ represents a hydrogen atom or an alkyl group having 1 to 5 carbon atoms.

As a preferred embodiment of $L_A$, a divalent organic group represented by the following Formula (A-1) is exemplified.

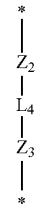

Formula (A-1)

In Formula (A-1), $Z_2$ represents a single bond, an ester group ($-COO-$), an amide group ($-CONR_{222}-$), or an ether group ($-O-$). The definition of $R_{222}$ is as described above.

In Formula (A-1), $L_4$ represents a single bond or a divalent organic group. The divalent organic group is preferably a linear, branched, or cyclic divalent aliphatic hydrocarbon group (for example, an alkylene group such as a methylene group, an ethylene group, or a propylene group), a linear, branched, or cyclic divalent aromatic hydrocarbon group (for example, a phenylene group), or a group obtained by combining these. The group which is obtained by combining the aforementioned groups may be a group in which the aforementioned groups are combined with each other through an ether group ($-O-$), an ester group ($-COO-$), an amide group (—CONR$_{222}$—), a urethane group (—NHCOO—), or a urea group (—NH—CO—NH—). The definition of R$_{222}$ is as described above.

The number of total carbon atoms in L$_4$ is preferably 1 to 15. Herein, the number of total carbon atoms means the number of total carbon atoms contained in L$_4$.

Specific examples of L$_4$ include a methylene group, an ethylene group, a propylene group, a butylene group, a phenylene group, a group formed as a result of substituting these groups with a methoxy group, a hydroxyl group, a chlorine atom, a bromine atom, a fluorine atom, or the like, a group obtained by combining these, and the like.

In Formula (A-1), Z$_3$ represents a single bond, —CO$_2$—, —CO—, —O—CO—O—, —SO$_3$—, —CONR$_{222}$—, —NHCOO—, —O—, —S—, —SO$_2$NR$_{222}$—, or —NR$_{222}$—. The definition of R$_{222}$ is as described above.

In Formula (A-1), * on the upper side (* adjacent to Z$_2$) represents a position where the divalent organic group is bonded to a carbon atom to which R$_A$ in Formula (A) is bonded.

In Formula (A-1), * on the lower side (* adjacent to Z$_3$) represents a position where the divalent organic group is bonded to A in Formula (A).

That is, when L$_A$ is a divalent organic group represented by Formula (A-1), Formula (A) is represented by the following Formula (A-2).

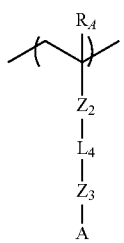

Formula (A-2)

In Formula (A-2), the definition and the preferred embodiment of R$_A$ are the same as those of R$_A$ in Formula (A) described above.

In Formula (A-2), the definition, the specific examples, and the preferred embodiment of each of Z$_2$, L$_4$, and Z$_3$ are the same as those of each of Z$_2$, L$_4$, and Z$_3$ in Formula (A-1) described above.

In Formula (A-2), the definition and the preferred embodiment of A are the same as those of A in Formula (A) which will be described later.

In Formula (A), A represents a monovalent group, which is formed as a result of removing one hydrogen atom (here, a hydrogen atom of a hydroxyl group is excluded) from the compounds represented by Formulae (1) to (8), or a monovalent group which is formed as a result of removing one fluorine atom from a compound that belongs to the compounds represented by Formulae (1) to (8) and has two or more fluorine atoms in a molecule. Herein, the "monovalent group which is formed as a result of removing one hydrogen atom (here, a hydrogen atom of a hydroxyl group is excluded) from compounds represented by Formulae (1) to (8)" means a monovalent group formed as a result of removing any one hydrogen atom, which is other than a hydrogen atom of a hydroxyl group, among hydrogen atoms contained in the compounds represented by Formulae (1) to (8). Furthermore, the "monovalent group which is formed as a result of removing one fluorine atom from a compound that belongs to the compounds represented by Formulae (1) to (8) and has two or more fluorine atoms in a molecule" means a monovalent group formed as a result of removing any one fluorine atom from fluorine atoms contained in a compound which belongs to the compounds represented by Formulae (1) to (8) and has two or more fluorine atoms in a molecule. The group represented by A has a migration inhibition ability.

In the compounds represented by Formulae (1) to (8) described above, the position where a hydrogen atom is removed is not particularly limited. However, in view of further improving the migration inhibition ability, for example, the position is preferably any of R$_1$ to R$_{12}$ in the compounds represented by Formulae (1) to (4), Z in the compound represented by Formula (5), R$_{61}$ or R$_{62}$ in the compound represented by Formula (6), R$_{71}$ or R$_{72}$ in the compound represented by Formula (7), and Z1 or Z2 in the compound represented by Formula (8). In other words, L$_A$ in Formula (A) is preferably bonded to any of R$_1$ to R$_{12}$ in the compounds represented by Formulae (1) to (4), Z in the compound represented by Formula (5), R$_{61}$ or R$_{62}$ in the compound represented by Formula (6), R$_{71}$ or R$_{72}$ in the compound represented by Formula (7), and Z1 or Z2 in the compound represented by Formula (8).

In a case in which a fluorine atom is removed from a compound which belongs to the compounds represented by Formulae (1) to (8) described above and has two or more fluorine atoms in a molecule, the position where the fluorine atom is removed is the same as the position where a hydrogen atom is removed.

Furthermore, A may be a monovalent group, which is formed as a result of removing one hydrogen atom (here, a hydrogen atom of a hydroxyl group is excluded) from compounds represented by Formulae (22) to (24), Formulae (31) to (46), Formulae (51) to (54), Formula (X1), and Formula (Y1) that are preferred embodiments of the compounds represented by Formulae (1) to (8) described above, or a monovalent group formed as a result of removing one fluorine atom from a compound which belongs to the aforementioned compounds and has two or more fluorine atoms in a molecule.

(Synthesis Method of Polymer Compound (X))

Hereinafter, the synthesis method of the polymer compound (X) of the present invention having a specific group (A in Formula (A)), which has an anti-migration site (migration inhibition site), on a side chain will be described.

The synthesis method of the polymer compound (X) is not particularly limited, and examples thereof include the following methods i) and ii).

i) A method of polymerizing a monomer which is represented by Formula (A-3) and has a specific group (A in Formula (A)) having an anti-migration site

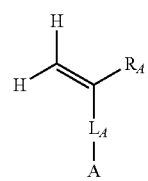

Formula (A-3)

ii) A method of introducing a specific group having an anti-migration site into a polymer compound having a reactive group by reacting the polymer compound with a compound having a group, which can react with the reactive group in the polymer compound, and a specific group having an anti-migration site Among these, from the viewpoint of synthesis suitability, the method i) is preferable.

As described above, the specific group having an anti-migration site may be introduced into the polymer compound by polymerizing a monomer, which contains the specific group having an anti-migration site in the form of a pendant, or may be introduced into the polymer compound by being added to or substituting a portion of the reactive group-containing polymer synthesized in advance.

The polymer compound (X) which can be preferably used in the present invention may contain a copolymerization component other than the unit represented by Formula (A). In the aforementioned synthesis method, the specific group can be introduced into the polymer compound by additionally copolymerizing other monomers. As long as the effects of the present invention are not impaired, any monomer can be used.

Specific examples of other usable monomers include unsubstituted (meth)acrylic acid esters such as methyl (meth)acrylate, butyl (meth)acrylate, hexyl (meth)acrylate, 2-ethylhexyl meth)acrylate, cyclohexyl (meth)acrylate, benzyl (meth)acrylate, and stearyl (meth)acrylate, halogen-substituted (meth)acrylic acid esters such as 2,2,2-trifluoroethyl (meth)acrylate, 3,3,3-trifluoropropyl (meth)acrylate, 2-(perfluorohexyl)ethyl acrylate, and 2-chloroethyl (meth)acrylate, (meth)acrylamides such as butyl (meth)acrylamide, isopropyl meth)acrylamide, octyl (meth)acrylamide, 2-ethylhexyl acrylamide, and dimethyl (meth)acrylamide, styrenes such as styrene and α-methylstyrene, vinyl compounds such as N-vinylcarbazole, vinyl acetate, N-vinylacetamide, and N-vinylcaprolactam, dimethylaminoethyl (meth)acrylate, diethylaminoethyl (meth)acrylate, 2-ethylthio-ethyl (meth)acrylate, (meth)acrylic acid, 2-hydroxyethyl (meth)acrylate, and the like. Furthermore, macromonomers obtained by using the aforementioned monomers can also be used.

The polymer compound having a reactive group that is used in the synthesis method ii) is synthesized by radically polymerizing a monomer having a reactive group for introducing the specific group having an anti-migration site into the polymer compound. Examples of the monomer having a reactive group for introducing the specific group having an anti-migration site include monomers having a carboxyl group, a hydroxyl group, an epoxy group, or an isocyanate group as the reactive group.

Examples of the monomer containing a carboxyl group include (meth)acrylic acid, itaconic acid, vinyl benzoate, Aronix M-5300, M-5400, and M-5600 manufactured by TOAGOSEI CO., LTD., acrylesters PA and HH manufactured by Mitsubishi Rayon Co., Ltd., light acrylate HOA-HH manufactured by KYOEISHA CHEMICAL Co., LTD., NK esters SA and A-SA manufactured by SHIN-NAKAMURA CHEMICAL CO., LTD., and the like.

As the monomer containing a hydroxyl group, it is possible to use 2-hydroxyethyl (meth)acrylate, 4-hydroxybutyl (meth)acrylate, 2-hydroxypropyl (meth)acrylate, 2-hydroxybutyl (meth)acrylate, 1-(meth)acryloyl-3-hydroxyadamantane, hydroxymethyl (meth)acrylamide, 2-(hydroxymethyl)-(meth)acrylate, methyl ester of 2-(hydroxymethyl)-(meth)acrylate, 3-chloro-2-hydroxypropyl (meth)acrylate, 3,5-dihydroxypentyl (meth)acrylate, 1-hydroxymethyl-4-(meth)acryloylmethyl-cyclohexane, 2-hydroxy-3-phenoxypropyl (meth)acrylate, 1-methyl-2-acryloyloxypropyl phthalate, 2-acryloyloxyethyl-2-hydroxyethyl phthalate, 1-methyl-2-acryloyloxyethyl-2-hydroxypropyl phthalate, 2-acryloyloxyethyl-2-hydroxy-3-chloropropyl phthalate, Aronix M-554, M-154, M-555, M-155, and M-158 manufactured by TOAGOSEI CO., LTD., Blemmer PE-200, PE-350, PP-500, PP-800, PP-1000, 70PEP-350B, and 55PET800 manufactured by NOF CORPORATION, and lactone-modified acrylate having the following structure.

$CH_2=CRCOOCH_2CH_2[OC(=O)C_5H_{10}]_nOH$ (R=H or Me, n=1 to 5)

As the monomer having an epoxy group, it is possible to use glycidyl(meth)acrylate, Cyclomer A and M manufactured by DAICEL CORPORATION, and the like.

As the monomer having an isocyanate group, it is possible to use Karenz AOI and MOI manufactured by SHOWA DENKO K.K.

In the synthesis method ii) described above, as the compound having a specific group having an anti-migration site that is reacted with the polymer compound having a reactive group, it is possible to use a compound having functional groups combined as below, although the compound varies with the type of the reactive group in the polymer compound.

That is, examples of the combination of (the reactive group of the polymer, the compound having a specific group having an anti-migration site) include combinations of (a carboxyl group, a carboxyl group), (a carboxyl group, an epoxy group), (a carboxyl group, an isocyanate group), (a carboxyl group, benzyl halide), (a hydroxyl group, a carboxyl group), (a hydroxyl group, an epoxy group), (a hydroxyl group, an isocyanate group), (a hydroxyl group, benzyl halide), (an isocyanate group, a hydroxyl group), (an isocyanate group, a carboxyl group), (an epoxy group, a carboxyl group), and the like.

Specifically, as the monomer having the aforementioned functional groups, it is possible to use acrylic acid, glycidyl acrylate, Cyclomer A (manufactured by DAICEL CORPORATION), Karenz AOI (manufactured by SHOWA DENKO K.K.), methacrylic acid, glycidyl methacrylate, Cyclomer M (manufactured by DAICEL CORPORATION), and Karenz MOI (manufactured by SHOWA DENKO K.K.).

Specific examples of the polymer compound (X) in the present invention will be shown below, but the present invention is not limited thereto.

(X-1)

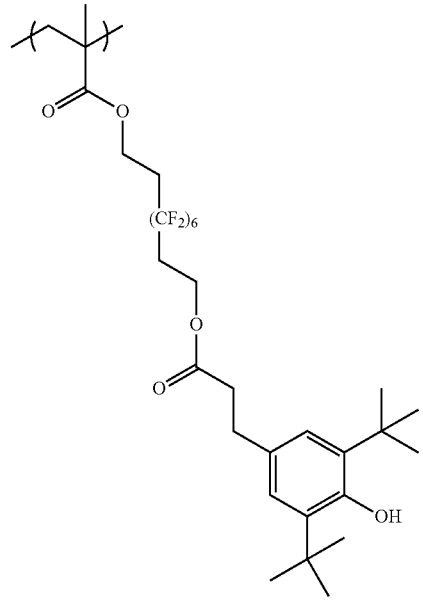

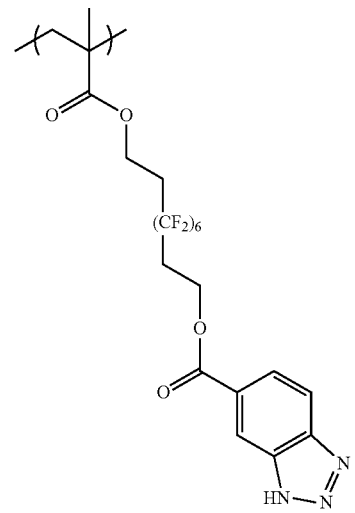

(X-2)

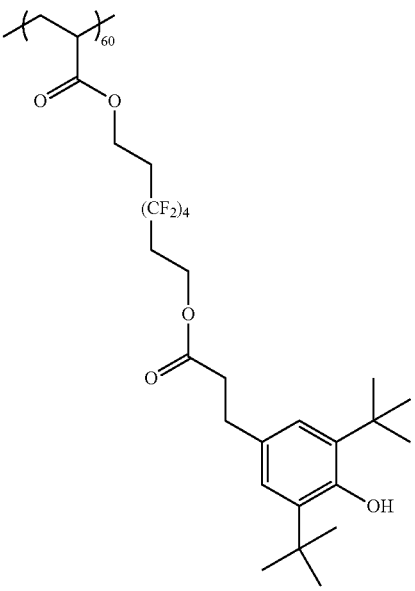

(X-5)

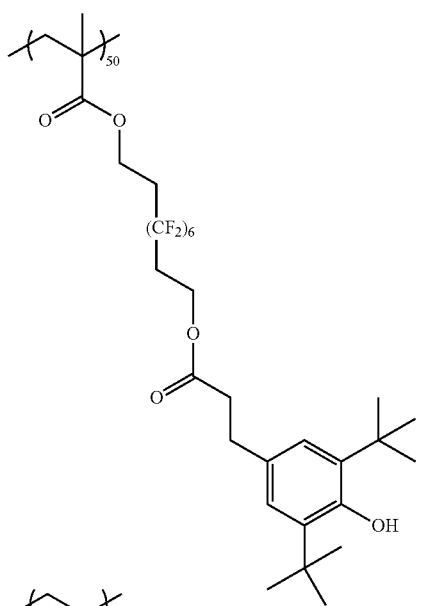

(X-3)

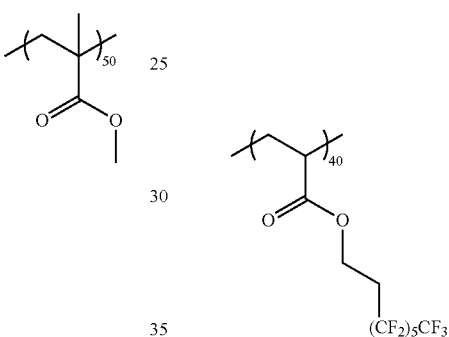

(X-4)

(Polymer Compound (Y))

The polymer compound (Y) is a polymer compound having a repeating unit represented by the following Formula (B) and a repeating unit represented by the following Formula (C). The polymer compound (Y) has a specific group (B in Formula (B)), which has a migration inhibition ability, on a side chain and contains a fluorine atom in the repeating unit represented by Formula (C).

The proportion of the repeating unit represented by Formula (B) in the polymer compound (Y) is preferably 5% by mass to 95% by mass, and more preferably 20% by mass to 80% by mass.

The proportion of the repeating unit represented by Formula (C) in the polymer compound (Y) is preferably 5% by mass to 95% by mass, and more preferably 20% by mass to 80% by mass.

A plurality of repeating units represented by Formulae (B) and (C) that is contained in the polymer compound (Y) may be the same as or different from each other.

Formula (B)

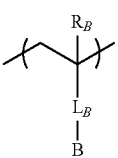

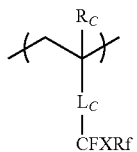
Formula (C)

The definition of $R_B$ and $L_B$ in Formula (B) is the same as that of $R_A$ and $L_A$ in Formula (A) described above, and the preferred embodiment thereof is also the same.

B in Formula (B) represents a monovalent group, which is formed as a result of removing one hydrogen atom (here, a hydrogen atom of a hydroxyl group is excluded) from compounds represented by Formulae (Y-1) to (Y-8) which will be described later, or a group represented by the following Formula (25). Herein, the "monovalent group, which is formed as a result of removing one hydrogen atom (here, a hydrogen atom of a hydroxyl group is excluded) from compounds represented by Formulae (Y-1) to (Y-8)" means a monovalent group formed as a result of removing any one hydrogen atom, which is other than a hydrogen atom of a hydroxyl group, among hydrogen atoms contained in the compounds represented by Formulae (Y-1) to (Y-8). The group represented by B has a migration inhibition ability.

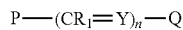 Formula (Y-1)

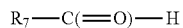 Formula (Y-2)

 Formula (Y-5)

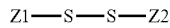 Formula (Y-8)

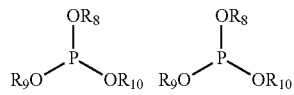 Formula (Y-3)

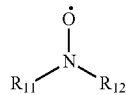 Formula (Y-4)

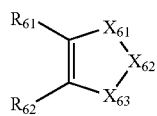 Formula (Y-6)

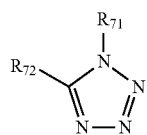 Formula (Y-7)

The definition of each of the groups in Formulae (Y-1) to (Y-8) is the same as the definition of each of the groups in Formulae (1) to (8) described above.

A difference between the compounds represented by Formulae (Y-1) to (Y-8) and the compounds represented by Formulae (1) to (8) is as follows. In the aforementioned groups in the compounds represented by Formulae (1) to (8), a portion of hydrogen atoms or the entirety of hydrogen atoms are substituted with a fluorine atom, but in the compounds represented by Formulae (Y-1) to (Y-8), hydrogen atoms are not substituted with fluorine atoms. Herein, the compounds represented by Formulae (Y-1) to (Y-8) may contain fluorine atoms.

Just like Formula (1) described above, the compounds represented by Formulae (31) to (46) are exemplified as preferred embodiments of Formula (Y-1). However, in this case, hydrogen atoms may not be substituted with fluorine atoms. More specifically, the compounds represented by Formulae (31) to (46) are as below.

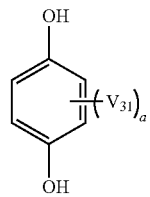 Formula (31)

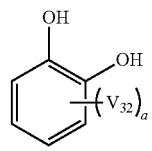 Formula (32)

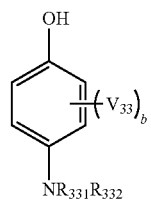 Formula (33)

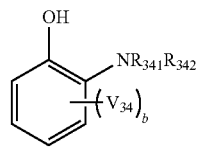 Formula (34)

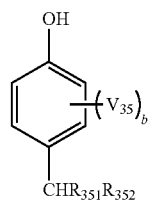 Formula (35)

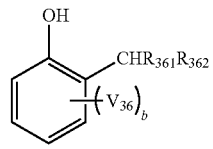 Formula (36)

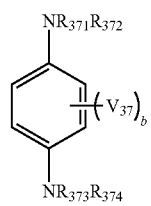 Formula (37)

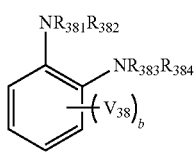

Formula (38)

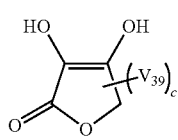

Formula (39)

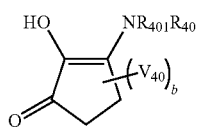

Formula (40)

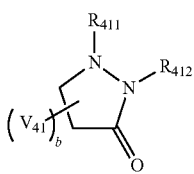

Formula (41)

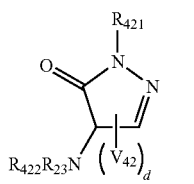

Formula (42)

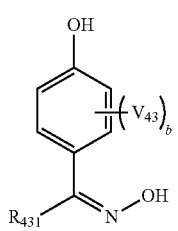

Formula (43)

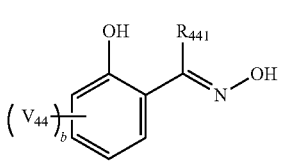

Formula (44)

$R_{451}R_{452}N-NR_{453}R_{454}$

Formula (45)

$R_{461}R_{462}N-OH$

Formula (46)

In Formula (31), $V_{31}$ represents a substituent, and a represents an integer of 1 to 4.

In Formula (32), $V_{32}$ represents a substituent, and a represents an integer of 1 to 4.

In Formula (33), $V_{33}$ represents a substituent; each of $R_{331}$ and $R_{332}$ independently represents a hydrogen atom or a group which can be substituted with a nitrogen atom; and b represents an integer of 0 to 4.

In Formula (34), $V_{34}$ represents a substituent; each of $R_{341}$ and $R_{342}$ independently represents a hydrogen atom or a group which can be substituted with a nitrogen atom; and b represents an integer of 0 to 4.

In Formula (35), $V_{35}$ represents a substituent; each of $R_{351}$ and $R_{352}$ independently represents a hydrogen atom or substituent; and b represents an integer of 0 to 4.

In Formula (36), $V_{36}$ represents a substituent; each of $R_{361}$ and $R_{362}$ independently represents a hydrogen atom or a substituent; and b represents an integer of 0 to 4.

In Formula (37), $V_{37}$ represents a substituent; each of $R_{371}$, $R_{372}$, $R_{373}$, and $R_{374}$ independently represents a hydrogen atom or a group which can be substituted with a nitrogen atom; and b represents an integer of 0 to 4.

In Formula (38), $V_{38}$ represents a substituent; each of $R_{381}$, $R_{382}$, $R_{383}$, and $R_{384}$ independently represents a hydrogen atom or a group which can be substituted with a nitrogen atom; and b represents an integer of 0 to 4.

In Formula (39), $V_{39}$ represents a substituent; and c represents an integer of 1 or 2.

In Formula (40), $V_{40}$ represents a substituent; each of $R_{401}$ and $R_{402}$ independently represents a hydrogen atom or a group which can be substituted with a nitrogen atom; and b represents an integer of 0 to 4.

In Formula (41), $V_{41}$ represents a substituent; each of $R_{411}$ and $R_{412}$ independently represents a hydrogen atom or a group which can be substituted with a nitrogen atom; and b represents an integer of 0 to 4.

In Formula (42), $V_{42}$ represents a substituent; each of $R_{421}$, $R_{422}$, and $R_{423}$ independently represents a hydrogen atom or a group which can be substituted with a nitrogen atom; and d represents 0 or 1.

In Formula (43), $V_{43}$ represents a substituent; $R_{431}$ represents a hydrogen atom or a substituent; and b represents an integer of 0 to 4.

In Formula (44), $V_{44}$ represents a substituent; $R_{441}$ represents a hydrogen atom or a substituent; and b represents an integer of 0 to 4.

In Formula (45), each of $R_{451}$, $R_{452}$, $R_{453}$, and $R_{454}$ represents a hydrogen atom or a group which can be substituted with a nitrogen atom.

In Formula (46), each of $R_{461}$ and $R_{462}$ independently represents a hydrogen atom or a group which can be substituted with a nitrogen atom.

In the compounds represented by Formula (Y-1) to (Y-8) described above, the position where a hydrogen atom is removed is not particularly limited. However, in view of further improving the migration inhibition ability, for example, the position is preferably any of $R_1$ to $R_{12}$ in the compounds represented by Formulae (Y-1) to (Y-4), Z in the compound represented by Formula (Y-5), $R_{61}$ or $R_{62}$ in the compound represented by Formula (Y-6), $R_{71}$ or $R_{72}$ in the compound represented by Formula (Y-7), and Z1 or Z2 in the compound represented by Formula (Y-8). In other words, $L_B$ in Formula (B) is preferably bonded to any of $R_1$ to $R_{12}$ in the compounds represented by Formulae (Y-1) to (Y-4), Z in the compound represented by Formula (Y-5), $R_{61}$ or $R_{62}$ in the compound represented by Formula (Y-6), $R_{71}$ or $R_{72}$ in the compound represented by Formula (Y-7), and Z1 or Z2 in the compound represented by Formula (Y-8).

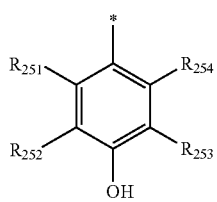

Formula (25)

In Formula (25), each of $R_{251}$, $R_{252}$, $R_{253}$, and $R_{254}$ independently represents a hydrogen atom or a substituent.

Examples of the substituent include the substituents of the alkyl group represented by $R_2$ and $R_3$ described above. Among the substituents, an alkyl group, an alkoxy group, and a hydroxy group are preferable as the substituent because these exert a small influence on the mobility and further improve the mobility. Particularly, either or both of $R_{252}$ and $R_{253}$ preferably represent an alkyl group or an alkoxy group. As the alkyl group, a methyl group, an ethyl group, an isopropyl group, a t-butyl group, a t-amyl group, or the like is preferable. As the alkoxy group, a methoxy group, an ethoxy group, or the like is particularly preferable. Either or both of $R_{252}$ and $R_{253}$ more preferably represent an alkyl group having 2 to 5 carbon atoms, even more preferably represent an ethyl group, an i-propyl group, a t-butyl group, or a t-amyl group, and most preferably represent a t-butyl group.

Each of $R_{251}$ and $R_{254}$ preferably represents a hydrogen atom.

* represents a position where the compound is bonded to $L_B$ in Formula (B).

The definition of $R_C$ and $L_C$ in Formula (C) is the same as that of $R_A$ and $L_A$ in Formula (A) described above, and the preferred embodiment thereof is also the same.

As a preferred embodiment of $L_C$, a divalent organic group represented by —$Z_4$-$L_5$- is exemplified.

Each $Z_4$ independently represents a single bond, an ester group (—COO—), an amide group (—$CONR_{271}$—), or an ether group (—O—). Herein, $R_{271}$ preferably represents a hydrogen atom or an alkyl group having 1 to 5 carbon atoms.

$L_5$ represents a single bond or a divalent organic group having 1 to 6 carbon atoms that does not contain a fluorine atom. Examples of the divalent organic group include groups having 1 to 6 carbon atoms that do not contain a fluorine atom, among the groups described as $L_4$.

X represents a hydrogen atom, a fluorine atom, or a trifluoromethyl group.

Rf represents a fluoroalkyl group having 20 or less carbon atoms that may have an ethereal oxygen atom, in which at least one hydrogen atom is substituted with a fluorine atom. Alternatively, Rf represents a fluorine atom.

Specific examples of the polymer compound (Y) will be shown below, but the present invention is not limited thereto.

(Y-1)

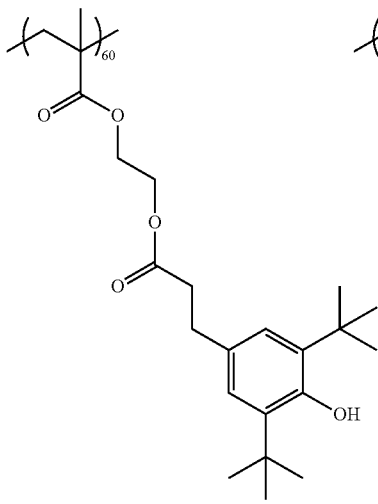

(Y-2)

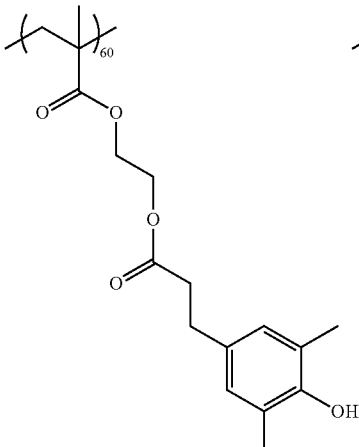

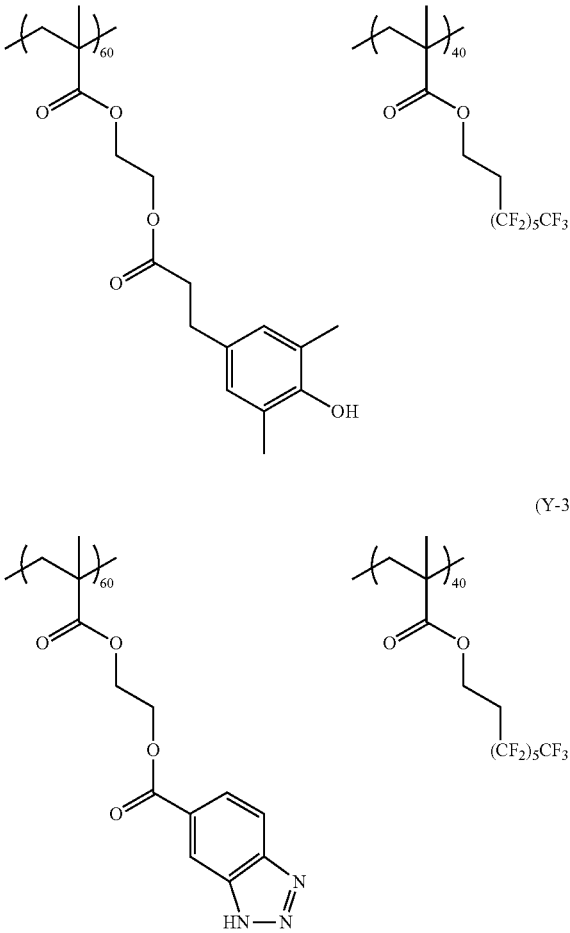

In the composition of the present invention, the content of the F-containing migration inhibitor is not particularly limited. However, the content of the F-containing migration inhibitor is preferably 0.1% by mass to 20% by mass, and more preferably 1% by mass to 10% by mass, with respect to the total mass of the organic semiconductor material.

From the viewpoint of homogeneity and crystallinity of the organic semiconductor layer to be formed, the composition of the present invention preferably contains a solvent.

The solvent is not particularly limited, and preferred examples thereof include aromatic compounds such as toluene, xylene, mesitylene, 1,2,3,4-tetrahydronaphthalene (tetralin), chlorobenzene, dichlorobenzene, and anisole, and the like.

As described above, the composition of the present invention exhibits excellent characteristics. Therefore, the composition of the present invention is preferable as a composition for forming an organic semiconductor layer of an organic thin-film transistor.

[Organic Thin-Film Transistor]

The organic thin-film transistor of the present invention is an organic thin-film transistor in which the composition of the present invention is used in an organic semiconductor layer. Particularly, the organic thin-film transistor of the present invention is preferably a top contact-type organic thin-film transistor. Hereinafter, an embodiment of the top contact type will be specifically described.

An embodiment of the organic thin-film transistor of the present invention will be described with reference to a drawing.

FIG. 1 is a schematic cross-sectional view showing an embodiment of the organic thin-film transistor of the present invention. As described above, an organic thin-film transistor 10 includes a substrate 11, a gate electrode 12, a gate insulating film 13, an organic semiconductor layer 14, a source electrode 15a, and a drain electrode 15b. Herein, the organic semiconductor layer 14 is formed by using the composition of the present invention described above. If necessary, a sealing layer that covers the entirety of the element may be formed. The organic thin-film transistor 10 is a top contact-type organic thin-film transistor.

A bottom gate top contact-type organic thin-film transistor can be prepared by, for example, forming a gate electrode on a substrate, forming a gate insulating layer on the gate electrode, forming an organic semiconductor layer on the gate insulating layer, and forming a source electrode and a drain electrode on the organic semiconductor layer. If necessary, a sealing layer can also be formed.

Hereinafter, the substrate, the gate electrode, the gate insulating film, the organic semiconductor layer, the source electrode, and the drain electrode and methods for forming these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoint of the applicability to various devices and from the viewpoint of the cost, a glass substrate or a plastic substrate is more preferable.

Examples of the material of the plastic substrate include a thermosetting resin (for example, an epoxy resin, a phenol resin, a polyimide resin, or a polyester resin such as PET or PEN) and a thermoplastic resin (for example, a phenoxy resin, polyethersulfone, polysulfone, or polyphenylene sulfone).

Examples of the material of the ceramic substrate include alumina, aluminum nitride, zirconia, silicon, silicon nitride, silicon carbide, and the like.

Examples of the material of the glass substrate include soda glass, potash glass, borosilicate glass, quartz glass, aluminosilicate glass, lead glass, and the like.

<Gate Electrode>

Examples of the material of the gate electrode include a metal such as gold (Au), silver, aluminum, copper, chromium, nickel, cobalt, titanium, platinum, magnesium, calcium, barium, or sodium; a conductive oxide such as $InO_2$, $SnO_2$, or ITO; a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, graphite; and the like. Among these, a metal is preferable, and silver or aluminum is more preferable.

The thickness of the gate electrode is not particularly limited but is preferably 20 nm to 200 nm.

The method for forming the gate electrode is not particularly limited. Examples of the method include a method of vacuum vapor-depositing or sputtering an electrode material onto a substrate, a method of coating a substrate with a composition for forming an electrode, a method of printing a composition for forming an electrode on a substrate, and the like. Furthermore, when the electrode is patterned, examples of the patterning method include a photolithography method; a printing method such as ink jet printing, screen printing, offset printing, or relief printing; a mask vapor deposition method; and the like.

<Gate Insulating Film>

Examples of the material of the gate insulating film include a polymer such as polymethyl methacrylate, polystyrene, polyvinyl phenol, polyimide, polycarbonate, polyester, polyvinyl alcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of compatibility with the organic semiconductor layer, a polymer is preferable.

When a polymer is used as the material of the gate insulating film, it is preferable to concurrently use a cross-linking agent (for example, melamine). If the crosslinking agent is concurrently used, the polymer is crosslinked, and therefore the durability of the gate insulating film to be formed is improved.

The film thickness of the gate insulating film is not particularly limited but is preferably 100 nm to 1,000 nm.

The method for forming the gate insulating film is not particularly limited. Examples of the method include a method of coating the substrate, on which the gate electrode has been formed, with a composition for forming a gate insulating film, a method of vapor-depositing or sputtering the material of the gate insulating film onto the substrate, and the like. The method of coating the substrate with the composition for forming a gate insulating film is not particularly limited, and a known method (a bar coating method, a spin coating method, a knife coating method, or a doctor blade method) can be used.

When the gate insulating film is formed by coating the substrate with the composition for forming a gate insulating film, for the purpose of removing the solvent, causing crosslinking, or the like, the composition may be heated (baked) after coating.

<Organic Semiconductor Layer>

The organic semiconductor layer is a layer formed by using the organic semiconductor composition of the present invention described above.

The thickness of the organic semiconductor layer is not particularly limited but is preferably 10 nm to 200 nm.

The method for forming the organic semiconductor layer is not particularly limited. Examples of the method include a method of coating the substrate, on which the gate electrode and the gate insulating film have been formed, with the organic semiconductor composition, and the like. Specific examples of the method of coating the substrate with the organic semiconductor composition are the same as the method of coating the substrate with the composition for forming a gate insulating film. When the organic semiconductor layer is formed by coating the substrate with the organic semiconductor composition, for the purpose of removing the solvent, causing crosslinking, or the like, the composition may be heated (baked) after coating.

<Source Electrode and Drain Electrode>

Specific examples of the material of the source electrode and the drain electrode are the same as the examples of the material of the gate electrode described above. Among the materials, a metal is preferable. Furthermore, copper, silver, or gold is preferable because these are excellent in conductivity, and silver is more preferable because the performance and cost are balanced well. Particularly, in the present invention, even when silver, which is a metal that easily causes migration, is used as an electrode material, migration is inhibited, and the insulation reliability can be secured. Accordingly, an organic semiconductor transistor having excellent performance can be prepared.

The method for forming the source electrode and the drain electrode is not particularly limited. Examples of the method include a method of vacuum vapor-depositing or sputtering an electrode material onto the substrate on which the organic semiconductor layer has been formed, a method of coating the substrate with a composition for forming an electrode, a method of printing the composition for forming an electrode on the substrate, and the like. Specific examples of the patterning method are the same as the examples of the patterning method of the gate electrode described above.

The channel length of the source electrode and the drain electrode is not particularly limited but is preferably 5 μm to 30 μm.

The channel width of the source electrode and the drain electrode is not particularly limited but is preferably 10 μm to 200 μm.

<Sealing Layer>

From the viewpoint of durability, the organic thin-film transistor of the present invention preferably includes a sealing layer as the outermost layer. For the sealing layer, a known sealant can be used.

The thickness of the sealing layer is not particularly limited but is preferably 0.2 μm to 10 μm.

The method for forming the sealing layer is not particularly limited. Examples of the method include a method of coating the substrate, on which the gate electrode, the gate insulating film, the organic semiconductor layer, the source electrode, and the drain electrode have been formed, with a composition for forming a sealing layer, and the like. Specific examples of the method of coating the substrate with the composition for forming a sealing layer are the same as the examples of the method of coating the substrate with the composition for forming a gate insulating film. When the organic semiconductor layer is formed by coating the substrate with the composition for forming a sealing layer, for the purpose of removing the solvent, causing crosslinking, or the like, the composition may be heated (baked) after coating.

EXAMPLES

Hereinafter, the present invention will be more specifically described based on examples, but the present invention is not limited thereto.

Synthesis Example 1

Synthesis of Migration Inhibitor b-1

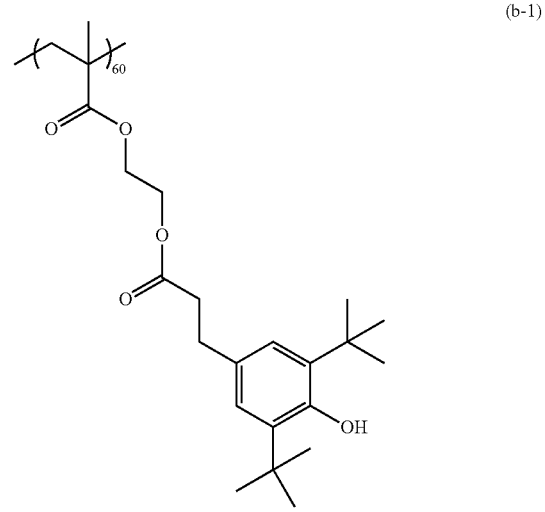

(b-1)

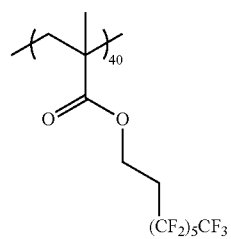

According to the following scheme, a compound M-1 was synthesized.

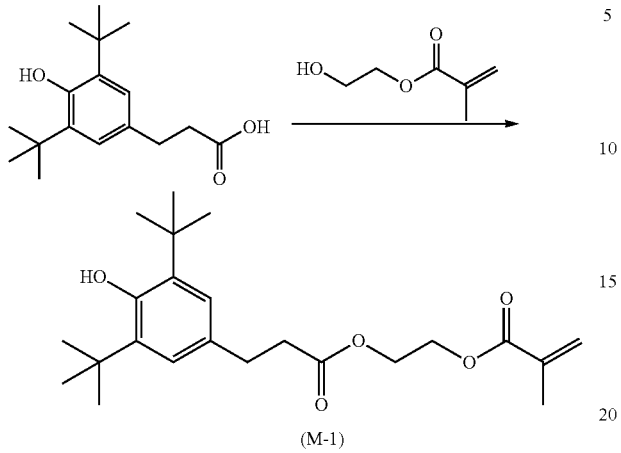

(M-1)

3-(3,5-di-tert-butyl-4-hydroxyphenyl)propionate (4.0 g, 14.4 mmol), dichloromethane (20 ml), 2-hydroxyethyl methacrylate (2.87 g, 14.4 mmol), tetrahydrofuran (10 ml), 1-ethyl-3-(3-dimethylaminopropyl)carbodiimide hydrochloride (2.75 g, 14.4 mmol), and 4-dimethylaminopyridine (0.10 g, 0.72 mmol) were put in this order into a reaction container.

After the reaction solution was stirred for 3 hours at room temperature, 1 N hydrochloric acid (50 ml) was put into the reaction container, and extraction was performed by using 100 ml of ethyl acetate. The organic phase was washed with saturated saline and dried over magnesium sulfate. The solid content was separated by filtration and concentrated under reduced pressure. The concentrate was purified by silica gel column chromatography (mobile phase: hexane/ethyl acetate=8/1), thereby obtaining 3.2 g of the compound M-1 (yield: 58%).

The compound M-1 (3.51 g), 3,3,4,4,5,5,6,6,7,7,8,8,8-tridecafluoro-octyl methacrylate (2.59 g), and 4-methyl-2-pentanone (manufactured by Wako Pure Chemical Industries, Ltd.) (5.1 g) were put into a 100 mL three-neck flask and heated to 80° C. in a nitrogen gas stream. To the resultant, a solution of azobisisobutyronitrile (manufactured by Wako Pure Chemical Industries, Ltd.) (49.3 mg) and 4-methyl-2-pentaone (manufactured by Wako Pure Chemical Industries, Ltd.) (1.0 g) was added, and the resultant was stirred for 16 hours. After the reaction ended, the resultant was cooled to room temperature and diluted with 4-methyl-2-pentanone (manufactured by Wako Pure Chemical Industries, Ltd.) (18.0 g). After reprecipitation was performed by using methanol, the precipitate was dried under reduced pressure, thereby obtaining 4.8 g of a migration inhibitor b-1 (Mw=35,000).

The molecular weight of the migration inhibitor b-1 means a weight average molecular weight which is measured by a gel permeation chromatography (GPC) method and expressed in terms of polystyrene. The weight average molecular weight was measured by the GPC method by dissolving the polymer in tetrahydrofuran and by using high-speed GPC (HLC-8220GPC) manufactured by TOSOH CORPORATION, TSKgel SuperHZ4000 (manufactured by TOSOH CORPORATION, 4.6 mm I. D.×15 cm) as a column, and tetrahydrofuran (THF) as an eluant.

Synthesis Example 2

Synthesis of Migration Inhibitor b-2

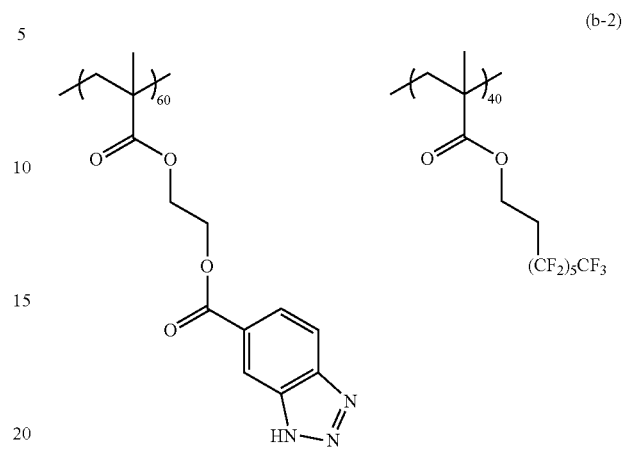

(b-2)

According to the following scheme, a compound M-2 was synthesized.

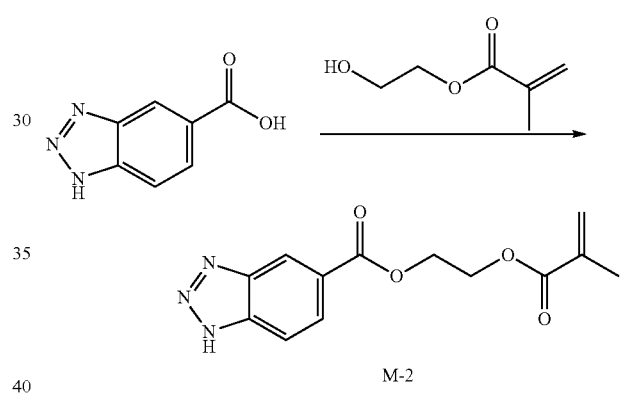

M-2

1H-benzotriazole-5-carboxylic acid (3.0 g, 18.4 mmol), tetrahydrofuran (54 ml), dimethylformamide (6 ml), 2-hydroxyethyl methacrylate (2.39 g, 18.4 mmol), 1-ethyl-3-(3-dimethylaminopropyl)carbodiimide hydrochloride (3.54 g, 18.4 mmol), and 4-dimethylaminopyridine (0.22 g, 0.184 mmol) were put in this order into a reaction container.

After the resultant was stirred for 24 hours at 70° C., water (50 ml) was added thereto, and extraction was performed by using ethyl acetate (100 ml). The organic phase was washed with saturated saline and dried over magnesium sulfate. The solid content was separated by filtration, and then the solution was concentrated under reduced pressure. The concentrate was purified by silica gel column chromatography (mobile phase: hexane/ethyl acetate=2/1), thereby obtaining 3.0 g of the compound M-2 (yield: 59%).

The compound M-2 (2.48 g) 3,3,4,4,5,5,6,6,7,7,8,8,8-tridecafluoro-octyl methacrylate (2.59 g), and 4-methyl-2-pentanone (manufactured by Wako Pure Chemical Industries, Ltd.) (4.1 g) were put into a 100 mL three-neck flask and heated to 80° C. in a nitrogen gas stream. To the resultant, a solution of azobisisobutyronitrile (manufactured by Wako Pure Chemical Industries, Ltd.) (49.3 mg) and 4-methyl-2-pentaone (manufactured by Wako Pure Chemical Industries, Ltd.) (1.0 g) was added, and the resultant was stirred for 16 hours. After the reaction ended, the resultant was cooled to room temperature and diluted with 4-methyl- 2-pentanone (manufactured by Wako Pure Chemical Industries, Ltd.) (18.0 g). After reprecipitation was performed by using methanol, the precipitate was dried under reduced pressure, thereby obtaining 4.3 g of a migration inhibitor b-2 (Mw=45,000).

The molecular weight of the migration inhibitor b-2 means a weight average molecular weight which is measured by a gel permeation chromatography (GPC) method and expressed in terms of polystyrene. The weight average molecular weight was measured by the GPC method by dissolving the polymer in tetrahydrofuran and by using high-speed GPC (HLC-8220GPC) manufactured by TOSOH CORPORATION, TSKgel SuperHZ4000 (manufactured by TOSOH CORPORATION, 4.6 mm I D.×15 cm) as a column, and tetrahydrofuran (THF) as an eluant.

Synthesis Example 3

Synthesis of Migration Inhibitor b-3 (Compound 33-5)

According to the following scheme, a migration inhibitor b-3 (compound 33-5) was synthesized.

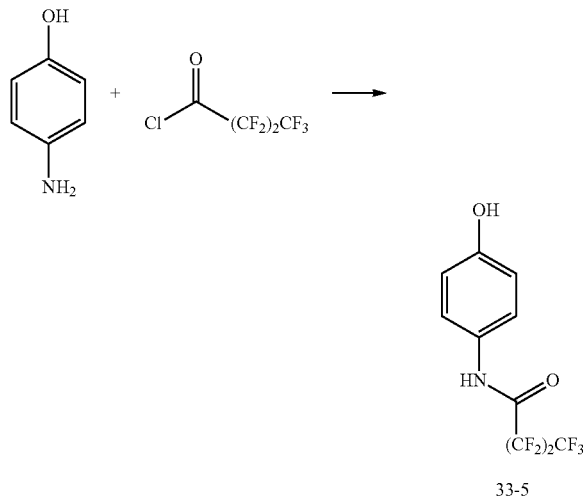

4-Aminophenol (manufactured by Wako Pure Chemical Industries, Ltd.) (1.96 g, 18.0 mmol), tetrahydrofuran (40 ml), and triethylamine (1.82 g, 18.0 mmol) were put into a reaction container and cooled in an ice bath. Thereafter, heptafluorobutyryl chloride (4.18 g, 18.0 mmol) was added dropwise to the reaction solution from a dropping funnel for 0.5 hours. Thereafter, the reaction solution was stirred for 3 hours at room temperature, 1 N hydrochloric acid (50 ml) was then added to the reaction solution, and extraction was performed by using 100 ml of ethyl acetate. The organic layer was washed with saturated saline and dried over magnesium sulfate. The solid content was separated by filtration and concentrated under reduced pressure, thereby obtaining 5 g of crude crystals. The crystals were purified by silica gel column chromatography (mobile phase: hexane/ethyl acetate), thereby obtaining 4 g of the migration inhibitor b-3 (yield: 73%).

Synthesis Example 4

Synthesis of Migration Inhibitor b-4 (Compound 35-3)

According to the following scheme, a migration inhibitor b-4 (compound 35-3) was synthesized.

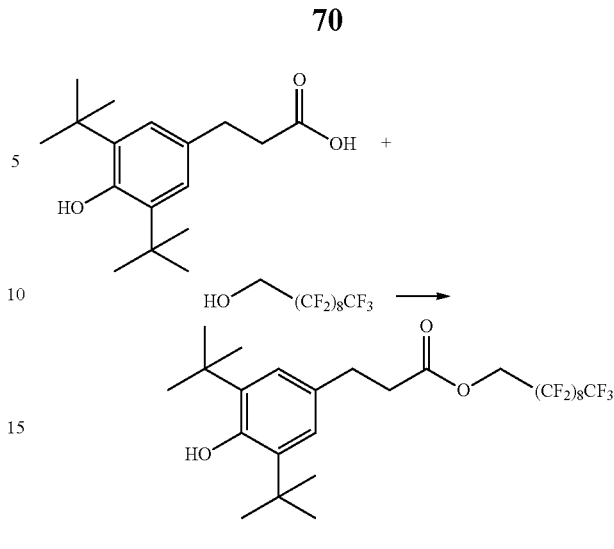

3-(3,5-di-tert-butyl-4-hydroxyphenyl)propionate (3.5 g, 12.6 mmol), dichloromethane (20 ml), 2,2,3,3,4,4,5,5,6,6,7,7,8,8,9,9,10,10,10-nonadecafluorodecan-1-ol (6.3 g, 12.6 mmol), tetrahydrofuran (10 ml), 1-ethyl-3-(3-dimethylaminopropyl) carbodiimide hydrochloride (2.4 g, 12.6 mmol), and 4-dimethylaminopyridine (0.05 g, 0.4 mmol) were put in this order into a reaction container.

After the reaction solution was stirred for 3 hours at room temperature, a 1 N hydrochloric acid (50 ml) was added to the reaction solution, and extraction was performed by using 100 ml of ethyl acetate. The organic layer was washed with saturated saline and dried over magnesium sulfate. The solid content was separated by filtration and then concentrated under reduced pressure, thereby obtaining white crude crystals. Thereafter, reprecipitation was performed by using methanol, thereby obtaining 6.0 g of the migration inhibitor b-4 (yield: 63%).

<Migration Inhibitor b-5 (Compound 2-2)>

As a migration inhibitor b-5 (compound 2-2), pentafluorobenzaldehyde (manufactured by Tokyo Chemical Industry Co., Ltd.) was used.

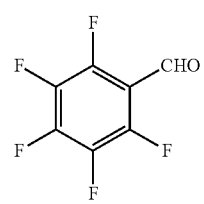

Synthesis Example 5

Synthesis of Migration Inhibitor b-6 (Compound 3-2)

According to the synthesis example described in Organic Letters, 2009, vol. 11, #9, p. 1879-1881, a migration inhibitor b-6 (compound 3-2) was synthesized.

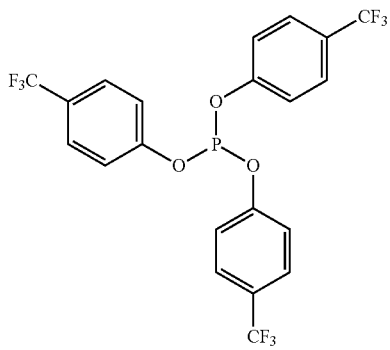

3-2

Synthesis Example 6

Synthesis of Migration Inhibitor b-7 (Compound 4-3)

According to the following scheme, a migration inhibitor b-7 (compound 4-3) was synthesized.

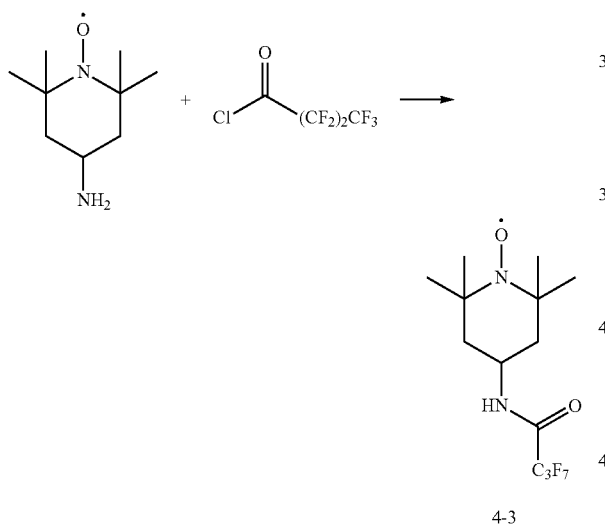

4-3

A 4-amino-2,2,6,6-tetramethylpiperidine 1-oxyl free radical (manufactured by Tokyo Chemical Industry Co., Ltd.) (3.08 g, 18.0 mmol), tetrahydrofuran (40 ml), and triethylamine (1.82 g, 18.0 mmol) were put into a reaction container and cooled in an ice bath. Thereafter, heptafluorobutyryl chloride (4.18 g, 18.0 mmol) was added dropwise to the reaction solution from a dropping funnel for 0.5 hours. Thereafter, the reaction solution was stirred for 3 hours at room temperature, 1 N hydrochloric acid (50 ml) was then added to the reaction solution, and extraction was performed by using 100 ml of ethyl acetate. The organic layer was washed with saturated saline and dried over magnesium sulfate. The solid content was separated by filtration and concentrated under reduced pressure, thereby obtaining 5.5 g of crude crystals. The crystals were purified by silica gel column chromatography (mobile phase: hexane/ethyl acetate), thereby obtaining 5 g of the migration inhibitor b-7 (yield: 76%).

Synthesis Example 7

Synthesis of Migration Inhibitor b-8 (Compound 51-2)

According to the following scheme, a migration inhibitor b-8 (compound 51-2) was synthesized.

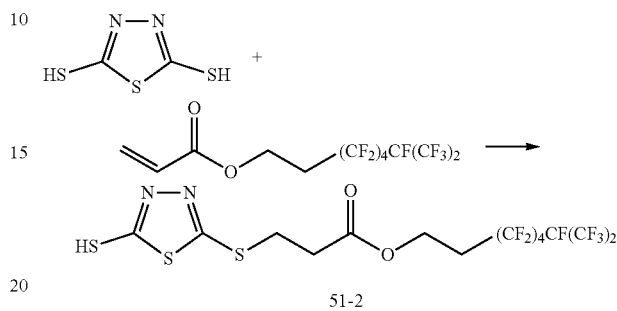

51-2

1,3,4-Thiadiazole-2,5-dithiol (manufactured by Wako Pure Chemical Industries, Ltd.) (4.0 g, 26.6 mmol) and tetrahydrofuran (80 ml) were put into a reaction container and thoroughly dissolved. Thereafter, 3,3,4,4,5,5,6,6,7,8,8,8-dodecafluoro-7-(trifluoromethyl)octyl acrylate (12.5 g, 26.6 mmol) was added dropwise to the reaction container from a dropping funnel for 0.5 hours. After being stirred for 6 hours at 65° C., the reaction solution was cooled to room temperature and concentrated under reduced pressure. 200 mL of hexane was added to the reaction solution, and the resultant was cooled in an ice bath, thereby obtaining 16 g of crude crystals. 8 g of the crude crystals were purified by silica gel column chromatography (mobile phase: hexane/ethyl acetate), thereby obtaining 6 g of the migration inhibitor b-8 (yield: 72%).

Synthesis Example 8

Synthesis of Migration Inhibitor b-9 (Compound 22-1)

According to the following scheme, a migration inhibitor b-9 was synthesized.

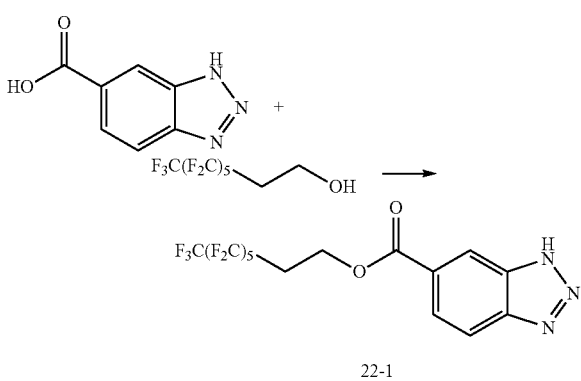

22-1

1H-benzotriazole-5-carboxylic acid (3.0 g, 18.4 mmol), tetrahydrofuran (54 ml), dimethylformamide (6 ml), 3,3,4,4,5,5,6,6,7,7,8,8,8-tridecafluoro-1-octanol (6.7 g, 18.4 mmol), 1-ethyl-3-(3-dimethylaminopropyl)carbodiimide hydrochloride (3.54 g, 18.4 mmol), and 4-dimethylaminopyridine (0.22 g, 0.184 mmol) were put in this order into a reaction container.

After the resultant was stirred for 24 hours at 70° C., water (50 ml) was added thereto, and extraction was performed by using ethyl acetate (100 ml). The organic phase was washed with saturated saline and dried over magnesium sulfate. The solid content was separated by filtration, and the solution was concentrated under reduced pressure. The obtained solid content was purified by silica gel column chromatography (mobile phase: hexane/ethyl acetate), thereby obtaining 6.0 g of the migration inhibitor b-9 (yield: 64%).

Synthesis Example 9

Synthesis of Migration Inhibitor b-10 (Compound 7-1)

According to the following scheme, a migration inhibitor b-10 was synthesized.

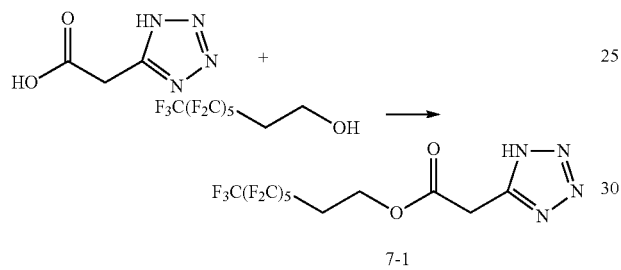

7-1

1H-tetrazol-5-acetic acid (2.3 g, 18.4 mmol), tetrahydrofuran (54 ml), dimethylformamide (6 ml), 3,3,4,4,5,5,6,6,7,7,8,8,8-tridecafluoro-1-octanol (6.7 g, 18.4 mmol), 1-ethyl-3-(3-dimethylaminopropyl)carbodiimide hydrochloride (3.54 g, 18.4 mmol), and 4-dimethylaminopyridine (0.22 g, 0.184 mmol) were put in this order into a reaction container.

After the resultant was stirred for 24 hours at 70° C., water (50 ml) was added thereto, and extraction was performed by using ethyl acetate (100 ml). The organic phase was washed with saturated saline and dried over magnesium sulfate. The solid content was separated by filtration, and then the solution was concentrated under reduced pressure. The obtained solid content was purified by silica gel column chromatography (mobile phase: hexane/ethyl acetate), thereby obtaining 5.0 g of the migration inhibitor b-10 (yield: 57%).

Synthesis Example 10

Synthesis of Migration Inhibitor b-11 (Compound 23-1)

According to the following scheme, a migration inhibitor b-11 was synthesized.

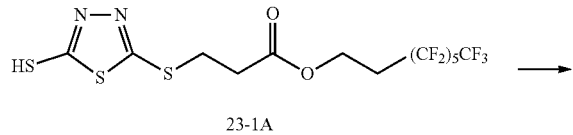

23-1A

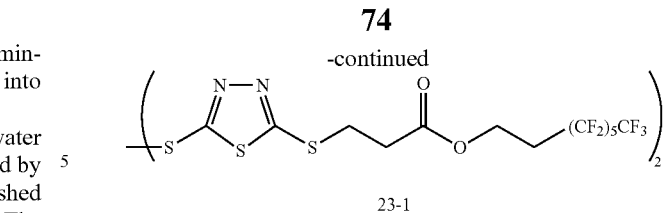

23-1

A compound 23-1A was synthesized by the same method as the method used for the compound 51-2. The compound 23-1A (3.0 g, 5.28 mmol) and ethyl acetate (20 ml) were put into a reaction container and thoroughly dissolved. Sodium iodide (79.1 mg, 0.528 mmol) and 30% hydrogen peroxide (22.11 mmol, 2.39 g) were added in this order to the resultant and stirred for 1 hour at room temperature. The educed crystals were washed with 100 ml of water, and 2.7 g of the obtained crude crystals were purified by silica gel column chromatography (mobile phase: hexane/ethyl acetate), thereby obtaining 2.4 g of the migration inhibitor b-11 (yield: 80%).

Synthesis Example 11

Synthesis of Migration Inhibitor b-12 (Compound X-6)

First, according to the following scheme, a compound A-1 was synthesized.

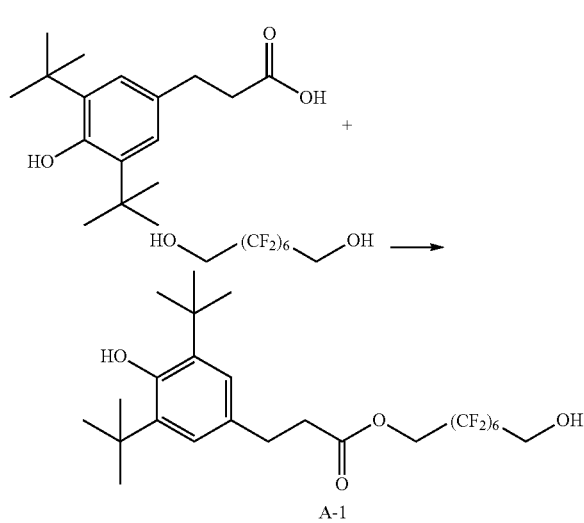

A-1

3-(3,5-di-tert-butyl-4-hydroxyphenyl)propionate (8.0 g, 28.8 mmol), dichloromethane (20 ml), 2,2,3,3,4,4,5,5,6,6,7,7-dodecafluoro-1,8-octanediol (20.8 g, 57.6 mmol), tetrahydrofuran (30 ml), 1-ethyl-3-(3-dimethylaminopropyl)carbodiimide hydrochloride (5.5 g, 28.8 mmol), and 4-dimethylaminopyridine (0.20 g, 1.44 mmol) were put in this order into a reaction container.

After the reaction solution was stirred for 3 hours at room temperature, 1 N hydrochloric acid (50 ml) was added to the reaction solution, and extraction was performed by using 100 ml of ethyl acetate. The organic phase was washed with saturated saline and dried over magnesium sulfate. The solid content was separated by filtration and then concentrated under reduced pressure. The obtained solid content was purified by silica gel column chromatography (mobile phase: hexane/ethyl acetate), thereby obtaining 10 g of the compound A-1.

Thereafter, according to the following scheme, a compound M-2 was synthesized.

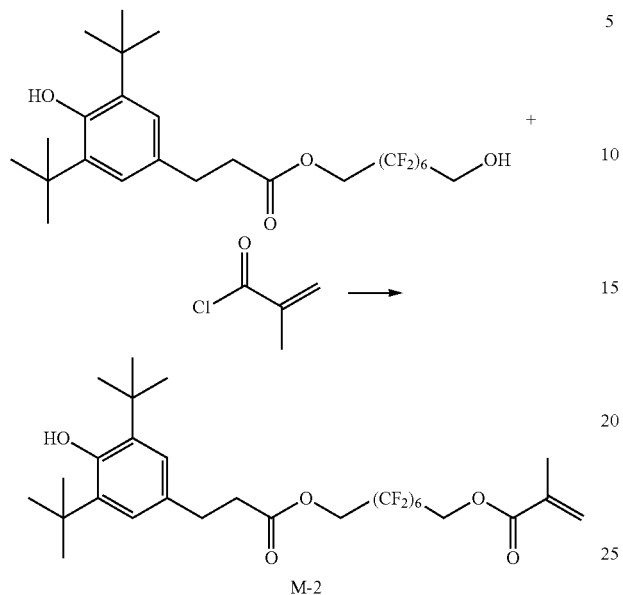

M-2

The compound A-1 (9.34 g, 15.0 mmol), tetrahydrofuran (100 ml), and triethylamine (1.52 g, 15.0 mmol) were put into a reaction container and cooled in an ice bath. Thereafter, methacrylic acid chloride (1.6 g, 15.0 mmol) was added dropwise to the reaction solution from a dropping funnel for 0.5 hours. Subsequently, the reaction solution was stirred for 3 hours at room temperature, 1 N hydrochloric acid (50 ml) was then added to the reaction solution, and extraction was performed by using 100 ml of ethyl acetate. The organic phase was washed with saturated saline and dried over magnesium sulfate. The solid content was separated by filtration and then concentrated under reduced pressure, and the obtained crude crystals were purified by silica gel column chromatography (mobile phase: hexane/ethyl acetate), thereby obtaining 8 g of M-2 (yield: 77%).

The compound M-2 (8 g) and 4-methyl-2-pentanone (manufactured by Wako Pure Chemical Industries, Ltd.) (16 g) were put into a 100 mL three-neck flask and heated to 80° C. in a nitrogen gas stream. To the resultant, a solution of azobisisobutyronitrile (manufactured by Wako Pure Chemical Industries, Ltd.) (49.3 mg) and 4-methyl-2-pentanone (manufactured by Wako Pure Chemical Industries, Ltd.) (2.0 g) was added, and the resultant was stirred for 16 hours. After the reaction ended, the reaction solution was cooled to room temperature and diluted with 4-methyl-2-pentanone (manufactured by Wako Pure Chemical Industries, Ltd.) (18.0 g). After reprecipitation was performed by using methanol, the precipitate was dried under reduced pressure, thereby obtaining 5 g of the migration inhibitor b-12 (compound X-6) (Mw 41,000).

The molecular weight of the migration inhibitor b-12 means a weight average molecular weight which is measured by a gel permeation chromatography (GPC) method and expressed in terms of polystyrene. The weight average molecular weight was measured by the GPC method by dissolving the polymer in tetrahydrofuran and by using high-speed GPC (HLC-8220GPC) manufactured by TOSOH CORPORATION, TSKgel SuperHZ4000 (manufactured by TOSOH CORPORATION, 4.6 mm I. D.×15 cm) as a column, and tetrahydrofuran (THF) as an eluant.

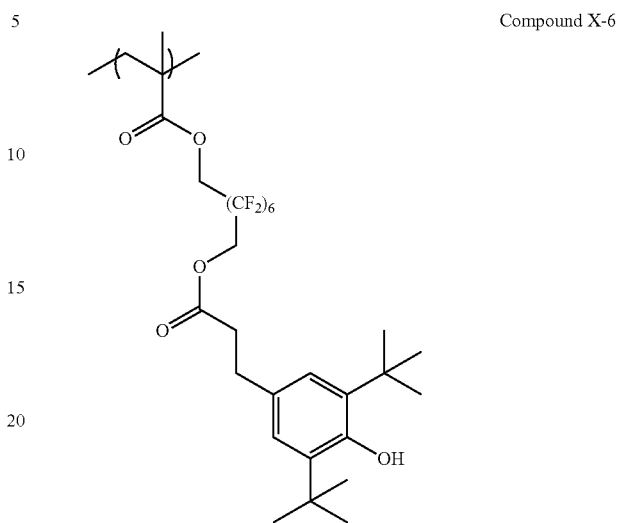

Compound X-6

Synthesis Example 12

Migration Inhibitor b-13

In a 200 ml flask, 10.58 g (0.065 mol) of t-butoxystyrene and 18.69 g (0.043 mol) of perfluorohexylethyl methacrylate were dissolved in 40 ml of tetrahydrofuran. While the resultant was being stirred in a nitrogen gas stream, 1.0 g of a polymerization initiator V-601 (manufactured by Wako Pure Chemical Industries, Ltd) was added thereto, and a reaction was performed for 3 hours at 70° C. After the reaction solution was left to cool, hexane was added to the reaction solution with stirring, thereby educing a resin. The obtained resin was washed with hexane and dried under reduced pressure. Subsequently, 15 g of the obtained resin was weighed and put into a 200 ml flask, 200 g of propylene glycol monomethyl ether and 20 ml of concentrated hydrochloric acid were added thereto, and a reaction was performed for 3 hours at 80° C. After the reaction solution was left to cool, deionized water was added to the reaction solution with stirring, thereby educing a white resin. The obtained resin was washed with deionized water and dried under reduced pressure, thereby obtaining 20 g of a migration inhibitor b-13 (Mw=15,000, Mn=7,000) having the following structure. The method for measuring the weight average molecular weight (Mw) and the number average molecular weight (Mn) is as described above.

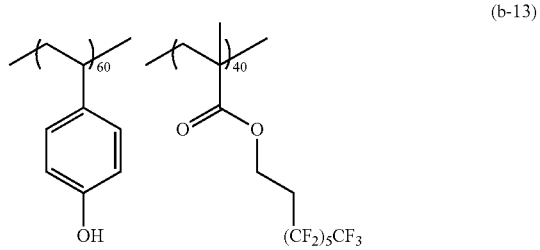

(b-13)

Example 1

(Preparation of Organic Semiconductor Composition)

TIPS pentacene (6,13-bis(triisopropylsilylethynyl)pentacene) and the migration inhibitor b-1 were dissolved in toluene (TIPS pentacene/migration inhibitor b-1=33.3 (w/w), solution concentration: 1% by mass), thereby preparing an organic semiconductor composition. The obtained organic semiconductor composition was named a composition 1.

(Preparation 1 of Organic Semiconductor Transistor)

Al to be a gate electrode was vapor-deposited (thickness: 50 nm) onto a glass substrate (Eagle XG: manufactured by Corning). Onto the Al, a PGMEA solution (solution concentration: 2% by mass) of a composition for a gate insulating film (polyvinylphenol/melamine=1/1 (w/w)) was applied by spin coating and baked for 60 minutes at 150° C., thereby forming a gate insulating film having a film thickness of 400 nm. Onto the gate insulating film, Au was vapor-deposited through a mask, thereby forming a source electrode and a drain electrode having a channel length of 20 µm and a channel width of 200 µm. Onto the source and drain electrodes, the composition 1 was applied by spin coating and baked for 15 minutes at 140° C., thereby forming an organic semiconductor layer having a thickness of 100 nm. Onto the organic semiconductor layer, Cytop CTL-107MK (manufactured by ASAHI GLASS CO., LTD.) (composition for forming a sealing layer) was applied by spin coating and baked for 30 minutes at 140° C., thereby forming a sealing layer (uppermost layer) having a thickness of 2 µm. In this way, an organic semiconductor transistor was obtained. The method described above was named an element preparation method 1.

(Preparation 2 of Organic Semiconductor Transistor)

Al to be a gate electrode was vapor-deposited (film thickness: 50 nm) onto a glass substrate (Eagle XG: manufactured by Corning). Onto the Al, a PGMEA solution (solution concentration: 2% by mass) of a gate insulating film solution (polyvinylphenol/melamine=1/1 (w/w) mixture) was applied by spin coating and baked for 60 minutes at 150° C., thereby forming an insulating film having a film thickness of 400 nm. Onto the insulating film, the prepared organic semiconductor composition 1 was applied by spin coating and baked for 15 minutes at 140° C., thereby forming an organic semiconductor layer having a film thickness of 100 nm. Thereafter, Ag was vapor-deposited onto the organic semiconductor layer through a mask, thereby forming a source electrode and a drain electrode having a channel length of 20 µm a channel width of 200 µm. Onto the source and drain electrodes, Cytop CTL-107MK (manufactured by ASAHI GLASS CO., LTD.) was applied by spin coating and baked for 30 minutes at 140° C., thereby forming a sealing layer having a film thickness of 2 µm. In this way, an organic semiconductor transistor was prepared. The method described above was named an element preparation method 2.

<Evaluation of Coating Properties>

According to the same procedure as used in Preparation of organic semiconductor transistor of Example 1, a gate electrode was vapor-deposited onto a glass substrate, and a gate insulating film was formed.

100 µL of the organic semiconductor composition 1 was dropped onto the gate insulating film, and 10 seconds later, the radius of the liquid droplet was measured by using a digital microscope VHX-900 (manufactured by KEYENCE CORPORATION). The measured radius of the liquid droplet was named R1.

A composition for comparison not containing a migration inhibitor was prepared according to the same procedure as used in Preparation of organic semiconductor composition of Example 1, except that the dissolution of a migration inhibitor was not performed. Onto the gate insulating film formed as above, 100 µL of the obtained composition for comparison was dropped, and 10 seconds later, the radius of the liquid droplet was measured by using a digital microscope VHX-900 (manufactured by KEYENCE CORPORATION). The measured radius of the liquid droplet was named R2.

From the measured R1 and R2, R1/R2 was calculated and evaluated according to the following criteria. The results are shown in Table 1. From the viewpoint of coating properties, R1/R2 is preferably A, B, or C, more preferably A or B, and even more preferably A.

[A]: $R1/R2 \geq 2$
[B]: $2 > R1/R2 \geq 1.5$
[C]: $1.5 > R1/R2 \geq 1$
[D]: $1 > R1/R2$ <Evaluation of Mobility>

Each of the electrodes of the prepared organic semiconductor transistor was connected to each of the terminals of a manual prober connected to a semiconductor parameter·analyzer (4155C, manufactured by Agilent Technologies), thereby evaluating the field effect transistor (FET). Specifically, by measuring the drain current-gate voltage (Id-Vg) characteristics, a field effect mobility ([$cm^2$/V·sec]) was calculated. The calculated field effect mobility was named µ1.

According to the same procedure as used in Evaluation of coating properties described above, a composition for comparison not containing a migration inhibitor was prepared. Thereafter, an organic semiconductor transistor was prepared according to the same procedure as used in Preparation of organic semiconductor transistor of Example 1, except that the aforementioned composition for comparison was used instead of the composition 1. The field effect mobility of the obtained organic semiconductor transistor was calculated according to the same procedure as used for calculating µ1. The calculated field effect mobility was named µ2.

From the calculated µ1 and µ2, µ1/µ2 was calculated and evaluated according to the following criteria. The results are shown in Table 1. For the practical use and from the viewpoint of mobility, µ1/µ2 is preferably A, B, or C, more preferably A or B, and even more preferably A.

A: $\mu1/\mu2 \geq 0.8$
B: $0.8 > \mu1/\mu2 \geq 0.5$
C: $0.5 > \mu1/\mu2 \geq 0.1$
D: $0.1 > \mu1/\mu2$ <Evaluation of Insulation Reliability>

The service life of the obtained organic semiconductor transistor was tested by using EHS-221MD (manufactured by Espec) under the following conditions, and the time taken for the value of resistance between source/drain electrodes to reach $1 \times 10^5 \Omega$ was measured. The measured time was named T1.

Temperature: 45° C.
Humidity: 60% RH
Pressure: 1.0 atm
Drain voltage: −40 V
Voltage between source/drain electrodes: 15 V According to the same procedure as used in Evaluation of mobility described above, an organic semiconductor transistor was prepared which used the composition for comparison not containing a migration inhibitor. For the obtained organic semiconductor transistor, the time taken for the value of resistance between source/drain electrodes to reach $1\times10^5\Omega$ was measured according to the same procedure as used for measuring T1. The measured time was named T2.

From the calculated T1 and T2, T1/T2 was calculated and evaluated according to the following criteria. The results are shown in Table 1. From the viewpoint of insulation reliability, T1/T2 is preferably A, B, or C, more preferably A or B, and even more preferably A.

A: $T1/T2 \geq 5$

B: $5 > T1/R2 \geq 2$

C: $2 > T1/T2 > 1$

D: $1 \geq T1/T2$

Examples 2 to 15 and Comparative Examples 1 to 4

Organic semiconductor compositions (compositions 2 to 15 and c1 to c4) were prepared according to the same procedure as in Example 1, except that an organic semiconductor material shown in the following Table 1 was used instead of TIPS-pentacene, and a migration inhibitor shown in the following Table 1 was used instead of the migration inhibitor b-1.

An organic semiconductor transistor was prepared and evaluated in various ways according to the same procedure as in Example 1, except that an organic semiconductor composition shown in the following Table 1 was used instead of the composition 1, and one of the aforementioned element preparation methods 1 and 2 was selected. The results are summarized in Table 1.

TABLE 1

| | Example | | | | |
|---|---|---|---|---|---|
| | 1 | 2 | 3 | 4 | 5 |
| Element preparation method | 1 | 2 | 1 | 1 | 1 |
| Organic semiconductor composition | Composition 1 | Composition 2 | Composition 3 | Composition 4 | Composition 5 |
| Organic semiconductor material | a-1 | a-2 | a-2 | a-3 | a-1 |
| Migration inhibitor | b-1 | b-1 | b-2 | b-2 | b-3 |
| Coating properties | A | A | A | A | A |
| Mobility | A | A | A | B | A |
| Insulating reliability | A | A | A | B | A |

| | Example | | | | |
|---|---|---|---|---|---|
| | 6 | 7 | 8 | 9 | 10 |
| Element preparation method | 1 | 1 | 1 | 1 | 1 |
| Organic semiconductor composition | Composition 6 | Composition 7 | Composition 8 | Composition 9 | Composition 10 |
| Organic semiconductor material | a-1 | a-1 | a-1 | a-1 | a-1 |
| Migration inhibitor | b-4 | b-5 | b-6 | b-7 | b-8 |
| Coating properties | A | A | A | A | A |
| Mobility | A | B | A | A | B |
| Insulating reliability | A | B | B | A | A |

| | Example | | | | |
|---|---|---|---|---|---|
| | 11 | 12 | 13 | 14 | 15 |
| Element preparation method | 1 | 1 | 1 | 1 | 1 |
| Organic semiconductor composition | Composition 11 | Composition 12 | Composition 13 | Composition 14 | Composition 15 |
| Organic semiconductor material | a-1 | a-1 | a-1 | a-1 | a-1 |
| Migration inhibitor | b-9 | b-10 | b-11 | b-12 | b-13 |
| Coating properties | A | A | A | A | A |
| Mobility | A | A | B | B | B |
| Insulating reliability | A | B | A | B | B |

| | Comparative example | | | |
|---|---|---|---|---|
| | 1 | 2 | 3 | 4 |
| Element preparation method | 1 | 2 | 1 | 1 |
| Organic semiconductor composition | Composition c1 | Composition c2 | Composition c3 | Composition c4 |
| Organic semiconductor material | a-1 | a-2 | a-2 | a-4 |
| Migration inhibitor | c-1 | c-1 | c-2 | c-1 |
| Coating properties | C | C | A | A |
| Mobility | D | D | A | D |
| Insulating reliability | C | C | D | C |

The organic semiconductor materials and the migration inhibitors shown in Table 1 are as follows.

Organic Semiconductor Material a-1: TIPS pentacene (manufactured by Sigma-Aldrich Co, LLC.)

a-2: diF-TES-ADT (manufactured by Sigma-Aldrich Co, LLC.)

a-3: PBTTT-C12 (manufactured by Sigma-Aldrich Co, LLC.)

a-4: P3HT (poly(3-hexylthiophene)) (manufactured by Sigma-Aldrich Co, LLC.)

Migration Inhibitor b-1: migration inhibitor b-1 synthesized by Synthesis example 1 b-2: migration inhibitor b-2 synthesized by Synthesis example 2 b-3: migration inhibitor b-3 synthesized by Synthesis example 3 b-4: migration inhibitor b-4 synthesized by Synthesis example 4 b-5: migration inhibitor b-5 described above b-6: migration inhibitor b-6 synthesized by Synthesis example 5 b-7: migration inhibitor b-7 synthesized by Synthesis example 6 b-8: migration inhibitor b-8 synthesized by Synthesis example 7 b-9: migration inhibitor b-9 synthesized by Synthesis example 8 b-10: migration inhibitor b-10 synthesized by Synthesis example 9 b-11: migration inhibitor b-11 synthesized by Synthesis example 10 b-12: migration inhibitor b-12 synthesized by Synthesis example 11
b-13: migration inhibitor b-13 synthesized by Synthesis example 12
c-1: IRGANOX-1076 (manufactured by BASF Corporation)
c-2: Megafac F-781 (manufactured by DIC CORPORATION)

As is evident from Table 1, the composition of the present invention that contains, as a migration inhibitor, a compound having a specific structure containing fluorine atoms improved the insulation reliability of an organic semiconductor transistor without greatly reducing the mobility of the organic semiconductor transistor. Particularly, the compositions of Examples 1 to 3 which contained a-1 or a-2 as an organic semiconductor material further improved the insulation reliability of the organic semiconductor transistor.

In contrast, the compositions of Comparative examples 1, 2, and 4 which contained IRGANOX-1076 as a migration inhibitor greatly reduced the mobility of the organic semiconductor transistor, and improved the insulation reliability of the organic semiconductor transistor to a small extent. Furthermore, when the composition of Comparative example 3, which contained Megafac F-781 (F-containing surfactant) as a migration inhibitor, was used in the organic semiconductor transistor, the mobility of the organic semiconductor was not greatly reduced, but the improvement of the insulation reliability was not observed.

EXPLANATION OF REFERENCES

11: substrate
12: gate electrode
13: gate insulating film
14: organic semiconductor layer
15a: source electrode
15b: drain electrode
10: thin-film transistor

What is claimed is:
1. An organic semiconductor composition comprising:
an organic semiconductor material; and
a migration inhibitor of a polymer compound (Y) containing a repeating unit represented by Formula (B) and a repeating unit represented by Formula (C),

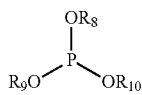

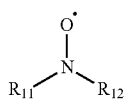

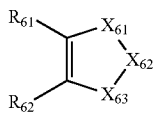

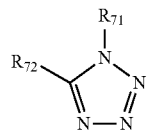

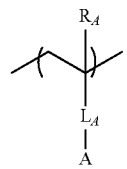

Formula (B)

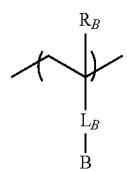

Formula (C)

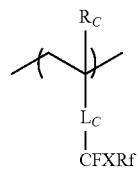

(in Formula (B), $R_B$ represents a hydrogen atom or an alkyl group having 1 to 4 carbon atoms that may have a substituent; $L_B$ represents a single bond or a divalent organic group; and B represents a monovalent group, which is formed as a result of removing one hydrogen atom (here, a hydrogen atom of a hydroxyl group is excluded) from compounds represented by the following Formulae (Y-1) to (Y-8), or a group represented by the following Formula (25), in Formula (C), $R_C$ represents a hydrogen atom or an alkyl group having 1 to 4 carbon atoms that may have a substituent; $L_C$ represents a single bond or a divalent organic group; X represents a hydrogen atom, a fluorine atom, or a trifluoromethyl group; $R_f$ represents a fluoroalkyl group having 20 or less carbon atoms that may have an ethereal oxygen atom, in which at least one hydrogen atom is substituted with a fluorine atom, or a fluorine atom),

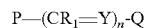 Formula (Y-1)

(in Formula (Y-1), each of P and Q independently represents OH, $NR_2R_3$, or $CHR_4R_5$; each of $R_2$ and $R_3$ independently represents a hydrogen atom or a group which can be substituted with a nitrogen atom; each of $R_4$ and $R_5$ independently represents a hydrogen atom or a substituent; Y represents $CR_6$ or a nitrogen atom; each of $R_1$ and $R_6$ independently represents a hydrogen atom or a substituent; at least two out of the groups represented by $R_1$, $R_2$, $R_3$, $R_4$, $R_5$, and $R_6$ may form a ring by being bonded to each other; n represents an integer of 0 to 5; when n is 0, P and Q do not represent $CHR_4R_5$ at the same time and do not represent OH at the same time; and when n represents a number of equal to or greater than 2, a plurality of atomic groups represented by (CR₁=Y) may be the same as or different from each other),

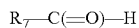  Formula (Y-2)

(in Formula (Y-2), R₇ represents an alkyl group, an alkenyl group, an alkynyl group, an aryl group, a heterocyclic group, or a group obtained by combining these groups, and the group represented by R₇ may contain a hydroxy group or a group represented by —COO—),

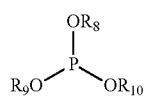  Formula (Y-3)

(in Formula (Y-3), each of R₈, R₉, and R₁₀ independently represents an alkyl group, an alkenyl group, an alkynyl group, an aryl group, a heterocyclic group, or a group obtained by combining these groups),

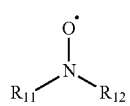  Formula (Y-4)

(in Formula (Y-4), each of R₁₁ and R₁₂ independently represents an alkyl group, an alkenyl group, an alkynyl group, an aryl group, a heterocyclic group, or a group obtained by combining these groups, and R₁₁ and R₁₂ may form a ring by being bonded to each other),

  Formula (Y-5)

(in Formula (Y-5), Z represents an alkyl group, an alkenyl group, an alkynyl group, an aryl group, a heterocyclic group, or a group obtained by combining these groups, and the group represented by Z may contain a substituent),

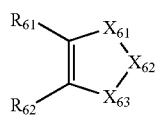  Formula (Y-6)

(in Formula (Y-6), each of X₆₁, X₆₂, and X₆₃ independently represents —NH—, —N=, =N—, —CR$_x$=, =CR$_x$—, or —S—; R$_x$ represents a hydrogen atom, —NH₂, or a linear or branched alkyl group having 1 to 15 carbon atoms; in the alkyl group, one carbon atom or two or more carbon atoms which are not adjacent to each other may be substituted with —O—, —S—, —NR₀—, —CO—, —CO—O—, —O—CO—, —O—CO—O—, —CR₀=CR₀₀—, or —C≡C—; one or more hydrogen atoms in the alkyl group may be substituted with a fluorine atom, a chlorine atom, a bromine atom, an iodine atom, or —CN; each of R₀ and R₀₀ independently represents a hydrogen atom or a carbyl or hydrocarbyl group which may have a substituent and one or more heteroatoms; and at least one of X₆₁, X₆₂, and X₆₃ is not —CR$_x$= or =CR$_x$—, each of R₆₁ and R₆₂ independently represents a fluorine atom, a chlorine atom, -Sp-P, a linear or branched alkyl group having 1 to 15 carbon atoms, or an aryl group, a heteroaryl group, an aryloxy group, a heteroaryloxy group, an arylcarbonyl group, a heteroarylcarbonyl group, an arylcarbonyloxy group, a heteroarylcarbonyloxy group, an aryloxycarbonyl group, or a heteroaryloxycarbonyl group which has 2 to 30 carbon atoms and may have a substituent; in the alkyl group, one carbon atom or two or more carbon atoms which are not adjacent to each other may be substituted with —O—, —S—, —NR₀—, —CO—, —CO—O—, —O—CO—, —O—CO—O—, —CR₀=CR₀₀—, or —C≡C—; one or more hydrogen atoms in the alkyl group may be substituted with a fluorine atom, a chlorine atom, a bromine atom, an iodine atom, or —CN; each of R₀ and R₀₀ independently represents a hydrogen atom or a carbyl or hydrocarbyl group which may have a substituent and one or more heteroatoms; Sp represents a single bond or a divalent organic group; P represents a polymerizable group or a cross-linking group; R₆₁ and R₆₂ may form an aromatic ring or an aromatic heterocyclic ring having 5 to 7 ring atoms by being bonded to each other; and the aromatic ring and the aromatic heterocyclic ring may have 1 to 6 substituents),

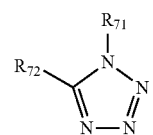  Formula (Y-7)

(in Formula (Y-7), each of R₇₁ and R₇₂ independently represents an alkyl group, an alkenyl group, an alkynyl group, an aryl group, a heterocyclic group, or a group obtained by combining these groups),

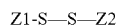  Formula (Y-8)

(in Formula (Y-8), each of Z1 and Z2 independently represents an alkyl group, an alkenyl group, an alkynyl group, an aryl group, a heterocyclic group, or a group obtained by combining these groups, and at least one of Z1 and Z2 may contain a substituent),

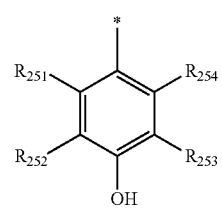  Formula (25)

(in Formula (25), each of R₂₅₁, R₂₅₂, R₂₅₃, and R₂₅₄ independently represents a hydrogen atom or a substituent, and * represents a binding position).

2. The organic semiconductor composition according to claim 1,
wherein in the repeating unit represented by Formula (B), B represents a monovalent group, which is formed as a result of removing one hydrogen atom (here, a hydrogen atom of a hydroxyl group is excluded) from the compound represented by Formula (Y-1) or the compound represented by Formula (Y-6), or the group represented by Formula (25).

3. The organic semiconductor composition according to claim 1,
wherein the migration inhibitor is at least one kind of compound selected from the group consisting of a compound represented by Formula (X1), a compound represented by Formula (33), a compound represented by Formula (2), a compound represented by Formula (3), a compound represented by Formula (4A), a compound represented by Formula (Y), a compound represented by Formula (22), a compound represented by Formula (7A), and a compound represented by Formula (23),

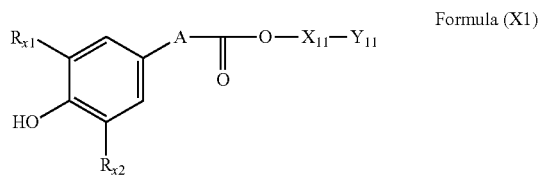

Formula (X1)

(in Formula (X1), each of $R_{x1}$ and $R_{x2}$ independently represents an alkyl group having 1 to 12 carbon atoms; A represents an alkylene group having 1 to 2 carbon atoms; $X_{11}$ represents an alkylene group having 1 to 3 carbon atoms that may have a hydroxyl group; and $Y_{11}$ represents a linear perfluoroalkyl group having 4 to 12 carbon atoms),

Formula (33)

(in Formula (33), $V_{33}$ represents a substituent; each of $R_{331}$ and $R_{332}$ independently represents a hydrogen atom or a group which can be substituted with a nitrogen atom; b represents an integer of 0 to 4; and at least one of $V_{33}$, $R_{331}$, and $R_{332}$ contains a fluorine atom),

Formula (2)

(in Formula (2), $R_7$ represents an aryl group containing a fluorine atom),

Formula (3)

(in Formula (3), each of $R_8$, $R_9$, and $R_{10}$ represents an aryl group substituted with a fluoroalkyl group),

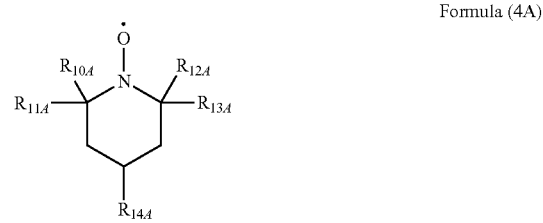

Formula (4A)

(in Formula (4A), each of $R_{10A}$ to $R_{13A}$ independently represents an alkyl group, and $R_{14A}$ represents a substituent containing a fluorine atom),

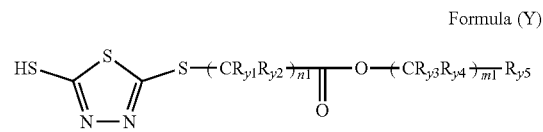

Formula (Y)

(in Formula (Y), each of $R_{y1}$ and $R_{y2}$ independently represents a hydrogen atom or an alkyl group; n1 represents 1 or 2; each of $R_{y3}$ and $R_{y4}$ independently represents a hydrogen atom or a substituent; m1 represents an integer of 1 to 6; and $R_{y5}$ represents a perfluoroalkyl group having 1 to 20 carbon atoms),

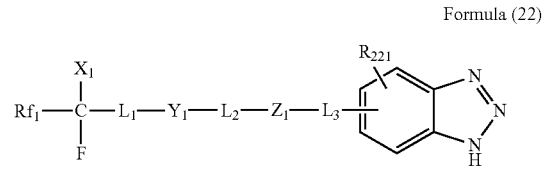

Formula (22)

(in Formula (22), $R_{221}$ represents a hydrogen atom, a linear or branched alkyl group having 1 to 8 carbon atoms, or $Rf_1$—$CFX_1$-$L_1$-$Y_1$-$L_2$-$Z_1$-$L_3$; $Rf_1$ represents a fluoroalkyl group having 22 or less carbon atoms that may have an ethereal oxygen atom, in which at least one hydrogen atom is substituted with a fluorine atom, or a fluorine atom; $X_1$ represents a hydrogen atom, a fluorine atom, or a trifluoromethyl group; $L_1$ represents a single bond or an alkylene group having 1 to 6 carbon atoms; $L_2$ represents a single bond or an alkylene group having 1 to 6 carbon atoms that may be substituted with a hydroxyl group or a fluorine atom; $L_3$ represents a single bond or an alkylene group having 1 to 6 carbon atoms; each of $Y_1$ and $Z_1$ independently represents a single bond, —$CO_2$—, —CO—, —OC(=O)O—, —$SO_3$—, —$CONR_{222}$—, —NHCOO—, —O—, —S—, —$SO_2NR_{222}$—, or —$NR_{222}$—; $R_{222}$ represents a hydrogen atom or an alkyl group having 1 to 5 carbon atoms; and when both of $Y_1$ and $Z_1$ represent a group other than a single bond, $L_2$ represents an alkylene group having 1 to 6 carbon atoms that may be substituted with a fluorine atom), Formula (7A)

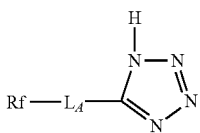

(in Formula (7A), $L_A$ represents a single bond or a divalent organic group, and $R_f$ represents a fluoroalkyl group), Formula (23)

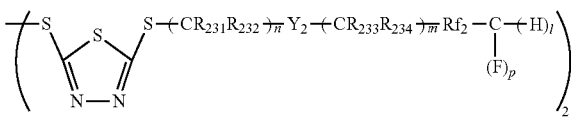

(in Formula (23), each of $R_{231}$ and $R_{232}$ independently represents a hydrogen atom or an alkyl group; each of $R_{233}$ and $R_{234}$ independently represents a hydrogen atom or a substituent; $Y_2$ represents a single bond, —CO—, or —COO—; $Rf_2$ represents a linear or branched perfluoroalkylene group having 1 to 20 carbon atoms or a linear or branched perfluoroether group having 1 to 20 carbon atoms; when $Y_2$ represents a single bond or —CO—, n represents 0, and m represents an integer of 0 to 6; when $Y_2$ represents —COO—, n represents 1 or 2, and m represents an integer of 1 to 6; p represents an integer of 2 to 3; l represents an integer of 0 to 1; and p and l satisfy a relationship of p+l=3).

4. The organic semiconductor composition according to claim 1, wherein the molecular weight of the organic semiconductor material is equal to or less than 2,000.

5. An organic thin-film transistor prepared by using the organic semiconductor composition according to claim 1.

6. Electronic paper using the organic thin-film transistor according to claim 5.

7. A display device using the organic thin-film transistor according to claim 5.

* * * * *